United States Patent
Ayyapureddi

(10) Patent No.: US 8,190,849 B2
(45) Date of Patent: May 29, 2012

(54) SHARING PHYSICAL MEMORY LOCATIONS IN MEMORY DEVICES

(75) Inventor: Sujeet Ayyapureddi, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 12/982,111

(22) Filed: Dec. 30, 2010

(65) Prior Publication Data

US 2011/0167193 A1    Jul. 7, 2011

Related U.S. Application Data

(63) Continuation of application No. 11/724,855, filed on Mar. 16, 2007, now Pat. No. 7,864,577.

(51) Int. Cl.
*G06F 13/00* (2006.01)

(52) U.S. Cl. ...... 711/201; 711/3; 365/230.03; 365/225.7

(58) Field of Classification Search ............... None
See application file for complete search history.

(56) References Cited

U.S. PATENT DOCUMENTS

| | | | |
|---|---|---|---|
| 5,999,463 A | 12/1999 | Park et al. |
| 6,480,429 B2 | 11/2002 | Jones et al. |
| 6,538,953 B2 | 3/2003 | Hidaka |
| 7,046,560 B2 | 5/2006 | Ayyapureddi et al. |
| 7,102,955 B2 | 9/2006 | Ayyapureddi |
| 7,102,956 B2 | 9/2006 | Ayyapureddi |
| 7,102,957 B2 | 9/2006 | Ayyapureddi |
| 7,388,801 B2 | 6/2008 | Ayyapureddi |
| 7,952,952 B1 | 5/2011 | Ayyapureddi |
| 2011/0242925 A1 | 10/2011 | Ayyapureddi |

*Primary Examiner* — Hetul Patel
(74) *Attorney, Agent, or Firm* — Knobbe Martens Olson & Bear LLP

(57) ABSTRACT

A memory structure includes a plurality of address banks where each address bank is operative to store a memory address. In certain embodiments, at least two of the address banks share physical memory locations for at least one redundant most significant bit. Additionally, at least two of the address banks in certain embodiments share physical memory locations for at least one redundant most significant bit and at least one redundant least significant bit. At least two of the address banks in certain embodiments also share physical memory locations for at least one redundant interior bit.

8 Claims, 51 Drawing Sheets

SHARING PHYSICAL MEMORY LOCATIONS IN MEMORY DEVICES

RELATED APPLICATION

This application is a continuation of U.S. application Ser. No. 11/724,855, filed on Mar. 16, 2007, now U.S. Pat. No. 7,864,577, the disclosure of which is hereby incorporated by reference in its entirety.

BACKGROUND OF THE INVENTION

1. Field of the Invention

This invention relates to memory devices. More particularly, this invention relates to memory devices that use fewer circuit components.

2. Description of the Related Art

Many approaches have been used to increase memory density on dies. A die is a single piece of silicon (or other semiconductor) on which integrated circuits are fabricated. Memory density is the number of bits that can be stored in memory devices on a die. One way to increase memory density is to make the memory devices smaller. Another way is to reduce the number of circuit components required to implement the same memory capacity. For example, if one hundred circuit components can be interconnected to provide the same memory capacity as one hundred and fifty similarly sized circuit components, memory density is increased because less area on the die is used and hence more memory devices can be placed on the die.

Memory devices are typically implemented on a die as a plurality of memory cells and redundancy structures. Memory cells store data, and redundancy structures store addresses for memory cells. Redundancy structures may be used if any of the memory cells are identified as being damaged by pre-ship testing. Memory cells are typically arranged on a memory device as an array of rows and columns, called "primary" rows and columns. Each intersection of a row and a column has an address. An external device such as a microprocessor uses an address of a memory cell (stored in a redundancy structure) to access the content of that memory cell.

Memory devices are tested for damaged rows and columns prior to shipping to a customer. Memory devices have several spare (redundant) rows and columns in addition to the primary rows and columns. If a portion of a primary row or column is damaged, a redundant row or column can be used to replace the damaged primary row or column. This is known as "repairing." When a redundant row or column is used, the memory device is programmed to access the redundant row or column instead of the damaged primary row or column.

One way to redirect access from primary to redundant cells is by using fusible and anti-fusible links. Fusible links (hereinafter "fuses") are integrated circuit components that are designed to break (or burn) when a relatively high current is selectively applied. When a fuse breaks, the connection between two points on the die is severed. In contrast, "anti-fuses" are designed to connect two points on the die. To implement the fusible links, a test circuit determines which memory cells, if any, are damaged. The addresses of damaged memory cells are programmed into "fuse banks" on the redundancy structure. If an address for a memory cell matches an address in the fuse bank, fuses or anti-fuses are programmed to redirect access from the damaged cell to a redundant cell.

To provide full redundancy in a memory device using fuses, the number of fuses should equal the number of bits used to address the memory cell. Additionally, an equal number of XNOR gates are required. For example, if a seven-bit address is used to address a memory cell, then seven fuses and seven XNOR gates are required to provide full redundancy. One drawback to this approach is that fuses and XNOR gates consume large amounts of area on a die. Attempts have been made to reduce the number of fuses and XNOR gates on a die while maintaining substantially the same degree of memory redundancy. The success of these attempts has been limited.

DETAILED DESCRIPTION OF THE PREFERRED EMBODIMENT

Various embodiments according to the invention will be described hereinafter with reference to the accompanying drawings. These embodiments are illustrated and described by example only, and are not intended to limit the scope of the invention.

In various embodiments, a method of storing addresses comprises processing a number of memory addresses, identifying patterns of redundant most significant bits and redundant least significant bits in at least two addresses, and sharing a physical memory location for at least one of the redundant most significant bits and redundant least significant bits in the at least two addresses. In another embodiment, a method of storing addresses in other embodiments comprises processing a number of memory addresses, identifying patterns of redundant most significant bits in at least two addresses, and sharing a physical memory location for at least one of the redundant most significant bits in the at least two addresses. In still other embodiments, a method of storing addresses comprises processing a number of memory addresses, identifying patterns of redundant interior bits in at least two addresses, and sharing a physical memory location for at least one of the redundant interior bits in the at least two addresses.

A memory structure in various embodiments comprises a plurality of address banks, each address bank operative to store a memory address, and at least two of the address banks sharing physical memory locations for at least one redundant most significant bit of a memory address. In alternative embodiments, a memory structure comprises a plurality of address banks, each address bank operative to store a memory address, and at least two of the address banks sharing physical memory locations for at least one redundant most significant bit and for at least one redundant least significant bit of a memory address. In some implementations, a memory structure comprises a plurality of address banks, each address bank operative to store a memory address, and at least two of the address banks sharing physical memory locations for at least one redundant interior bit of a memory address.

Figure 1:
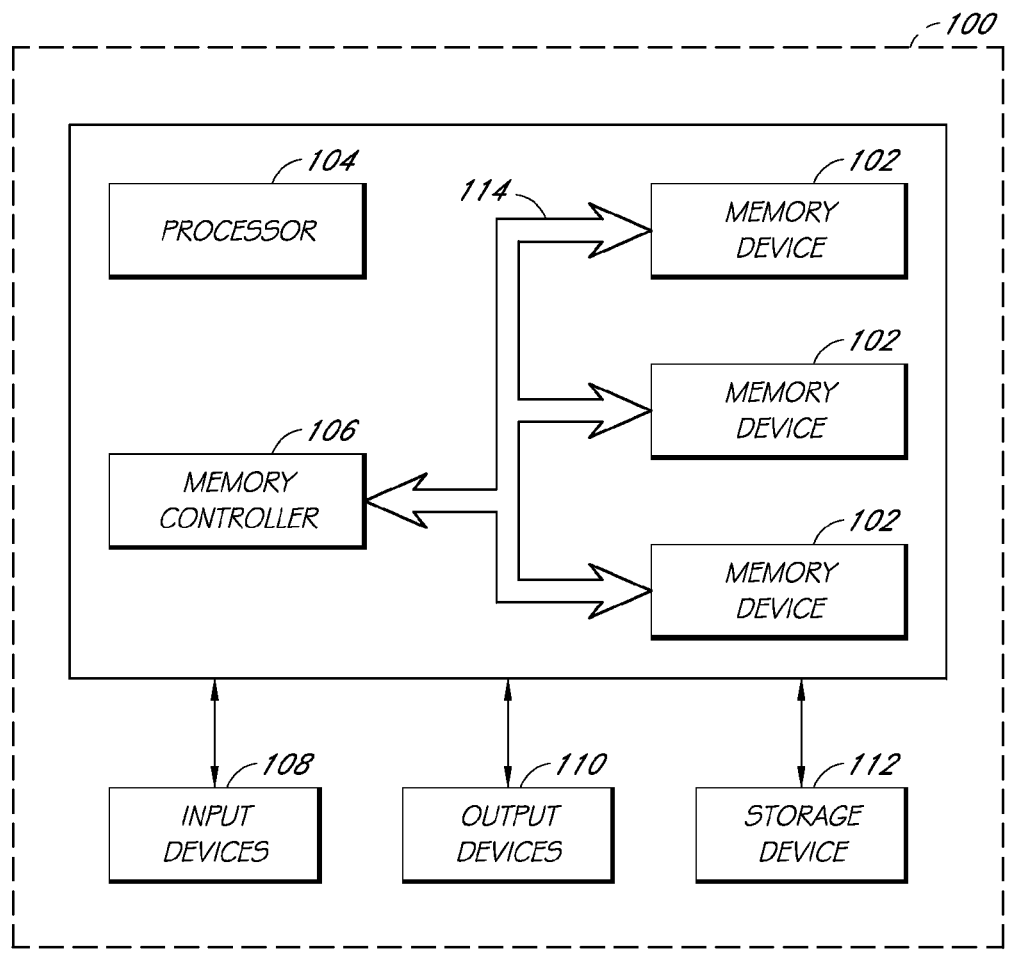
FIG. 1 is an exemplary block diagram showing a computer system according to an embodiment of the present invention.

FIG. 1 depicts a system incorporating certain embodiments of the invention. This system in one or more embodiments is similar to systems disclosed in U.S. Pat. Nos. 7,046,560 and 7,006,393, which are hereby incorporated by reference. System 100 includes a plurality of memory devices 102, a processor 104, a memory controller 106, input devices 108, output devices 110, and optional storage devices 112. Data and control signals are transferred between processor 104 and memory controller 106 via bus 114. Data and control signals are also transferred between memory controller 106 and memory devices 102 via bus 114.

Memory devices 102 include one or more redundant structures. Input devices 108 can include a keyboard, mouse, or any other device that allows a user to enter information into system 100. Output devices 110 can include a video display unit, a printer, or any other device capable of providing output data to a user. Storage devices 112 can include, for example, one or more disk or flash drives.

Figure 2:
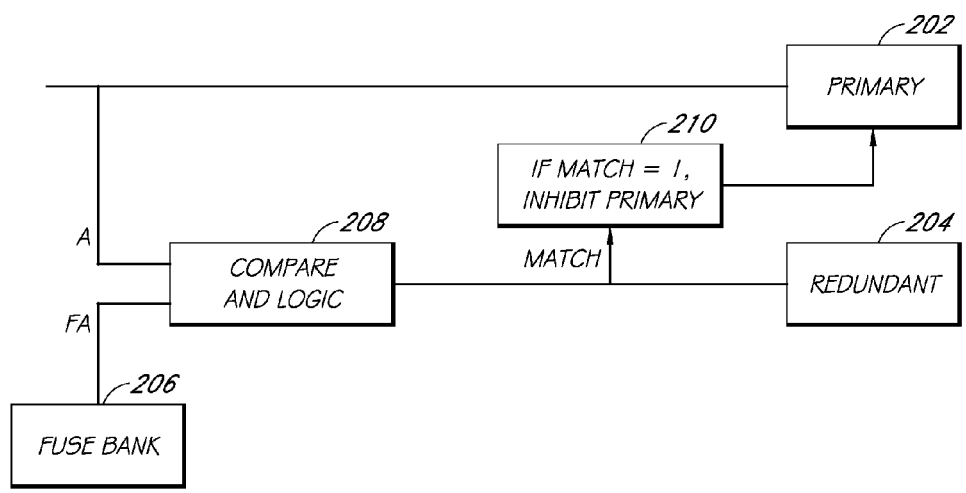
FIG. 2 is an exemplary block diagram showing a match detection circuit according to an embodiment of the present invention.

FIG. 2 illustrates one implementation of memory redundancy in accordance with the invention. Primary memory cell 202 has a corresponding redundant memory cell 204. If primary memory cell 202 is damaged or defective, a memory device 102 of FIG. 1 can be programmed to access redundant memory cell 204 instead. This is done by first programming the address of the damaged or defective cell into a fuse bank 206, which is essentially a collection of fuses. When access to primary cell 202 is attempted, the address is compared with the programmed address in fuse bank 206 by compare and logic circuitry 208. If the addresses are the same, match circuit 210 produces a signal to indicate that the redundant memory cell 204 should be accessed instead of the defective primary memory cell 202. If the addresses are not the same, the primary address is accessed.

Figure 3:
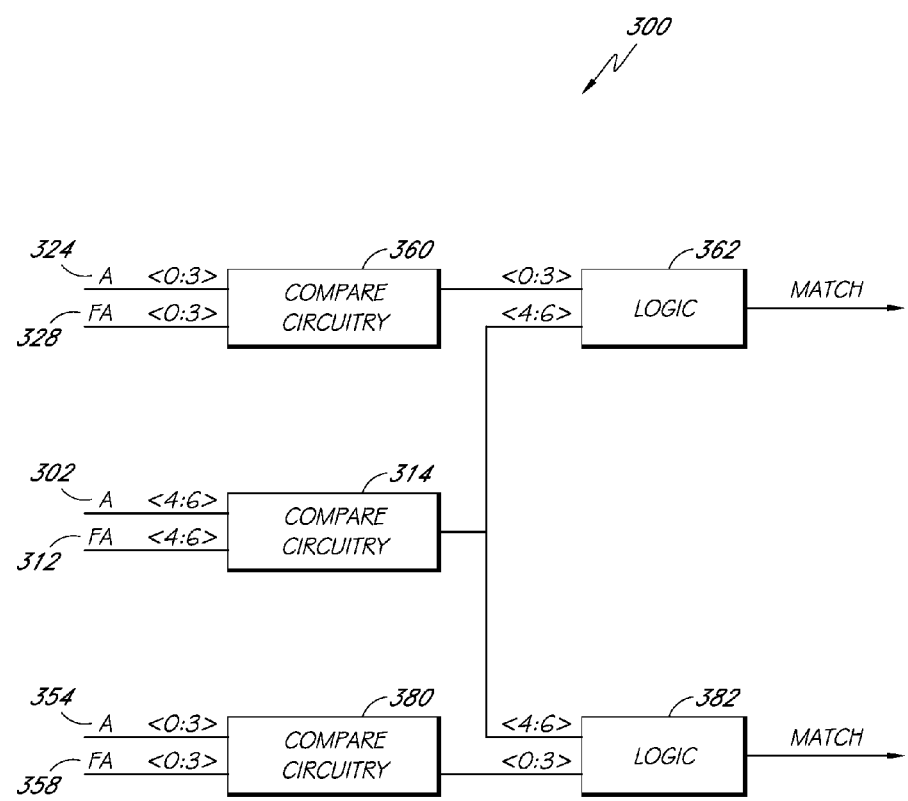
FIG. 3 is an exemplary block diagram showing primary and redundant memory cells according to an embodiment of the present invention.

FIG. 3 illustrates a circuit 300 for two addresses that share three MSBs in accordance with embodiments of the invention. This configuration provides the same redundancy as two conventional circuits but with fewer fuses and hardware components. Circuit 300 identifies fuses of defective memory cells by comparing memory cell addresses with addresses stored in fuse banks 206. Two seven-bit addresses of a potentially defective memory cell, separated into address portions 302, 324, and 354, are compared by compare circuits 314, 360, and 380 to two seven-bit fuse bank addresses, denoted by fuse address portions 312, 328, and 358. The four LSBs of address portions 324 and 354 are denoted "A<0:3>", indicating bits in the 0, 1, 2, 3, and 4 positions of a memory address. Likewise, the LSBs of fuse address portions 328 and 358 are denoted by "FA<0:3>". Three shared MSBs form address portion 302. MSBs of address portion 302 are denoted "A<4:6>", and MSBs for fuse address portion 312 are denoted "FA<4:6>".

Each bit of address portion 302 is individually compared by compare circuit 314 to a fuse address portion 312. Compare circuit 314 in certain embodiments includes one XNOR gate for each bit compared. In this case, compare circuit 314 includes three XNOR gates. If a bit of address portion 302 has the same value as a bit in the same bit position of fuse address portion 312, the XNOR gate for that comparison will output a logic one value, indicating that the bits match. The output of compare circuit 314 is provided to logic blocks 362 and 382. Address portions 324 and 354 are compared to fuse address portions 328 and 358 respectively, also by using XNOR gates. The output of compare circuit 360 is provided to logic block 362 and the output of compare circuit 380 is provided to logic block 382.

At logic block 362, the comparison results of the three MSBs of the first address (i.e., address portion 302) and the four LSBs of the first address (i.e., address portion 324) are combined to check for a match. Similarly, at logic block 382, the comparison results of the three MSBs of the second address (i.e., address portion 302) and the four LSBs of the second address (i.e., address portion 354) are combined to check for a match. If all of the bits of either seven-bit address match all of the bits of the corresponding fuse address, the logic blocks 362 or 382 output a signal to indicate that the addresses match. Matching addresses indicate that fuses of the corresponding defective memory cell are blown (programmed) and that the redundant cell should be accessed. If the output of the logic blocks 362, 382 indicates that the addresses are not the same, the primary address is accessed.

Currently available devices that provide redundancy for two seven-bit addresses require seven fuses and seven compare circuits (XNOR gates) for each address. Thus, a total of fourteen fuses and fourteen compare circuits are required. In contrast, by sharing three MSBs (e.g., as shown in FIG. 3), in certain embodiments eleven fuses and eleven compare circuits are required (three fuses and three compare circuits for the shared portion of the addresses and four fuses and four compare circuits each for the non-shared portions of the addresses). Thus, two addresses that share three MSBs can be stored using less fuses and hardware components than conventional approaches. Addresses of varying length may also share more or fewer MSBs to eliminate hardware as desired, according to certain embodiments of one or more processes which will be discussed below.

Figure 4:
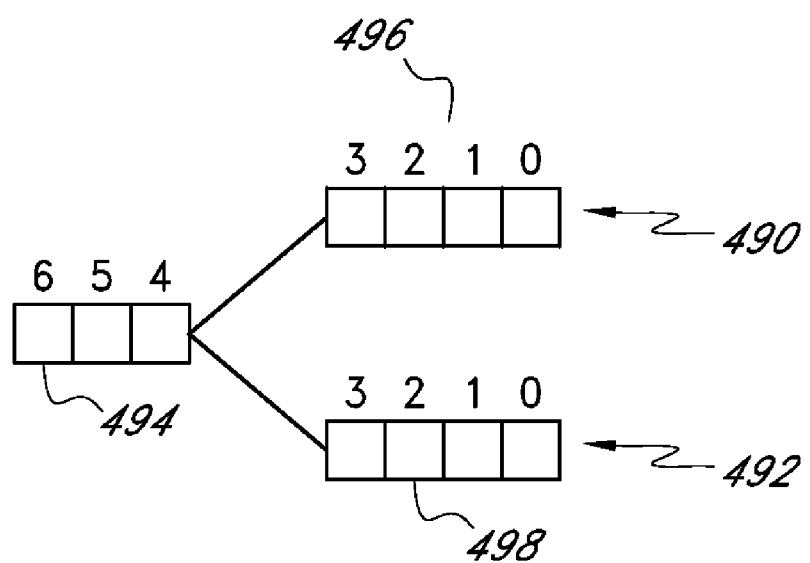
FIG. 4 is an exemplary diagram showing most significant bit ("MSB") sharing according to an embodiment of the present invention.

Two seven-bit addresses that share three MSBs may be stored in certain embodiments as represented schematically in FIG. 4. Address bank 490 and address bank 492 share three MSBs. The three shared MSBs are stored in shared address portion 494. The four LSBs of each address are stored in address portions 496 and 498, respectively. Thus, address bank 490 comprises address portion 496 and shared address portion 494. Address bank 492 comprises address portion 498 and shared address portion 494. Thus, even in this simple case, the sharing of three MSBs among two address banks reduces the address bits to be stored by three.

Figure 5:
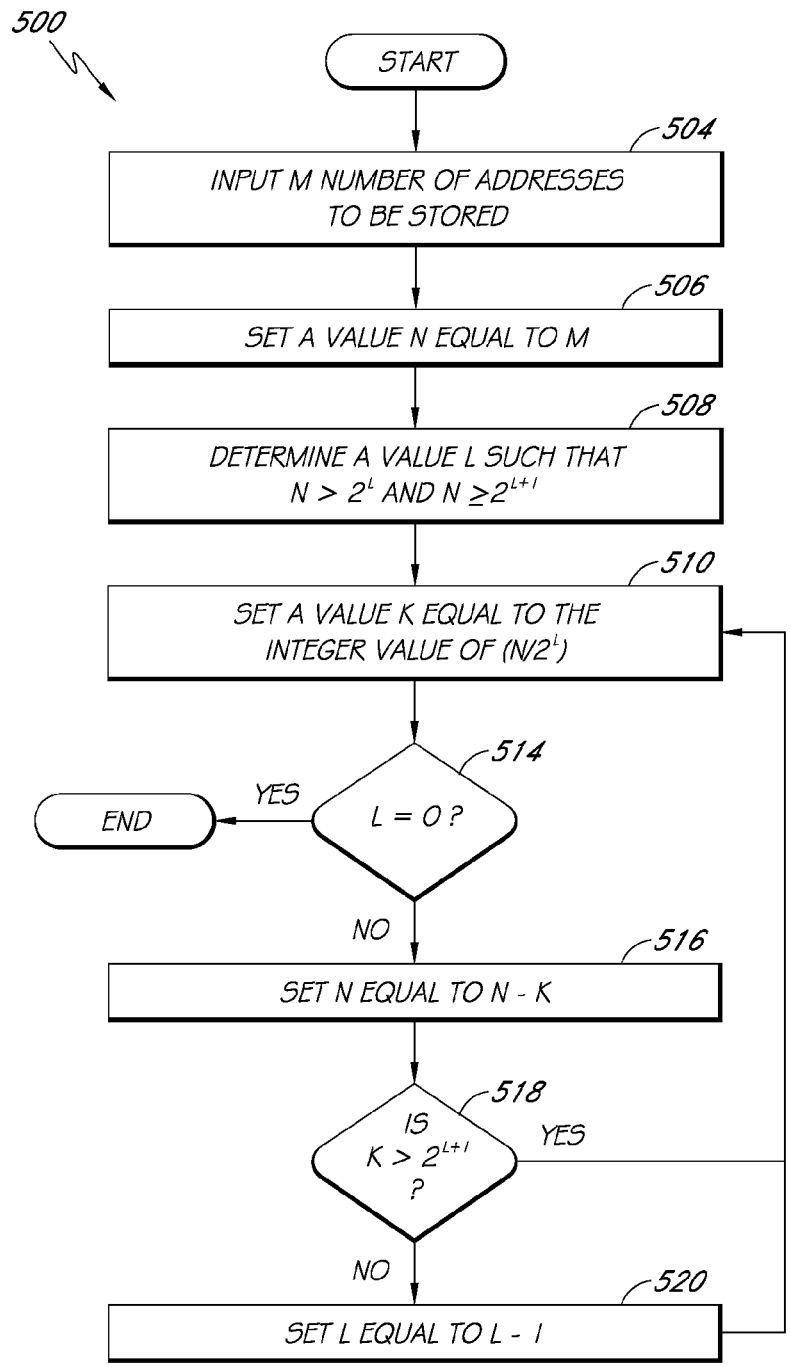
FIG. 5 is an exemplary flowchart showing an embodiment of a process for determining shared address bits.

At least four different processes may be employed to determine the number of MSBs that can be shared among address banks. FIG. 5 shows a flow chart of one embodiment of a process 500. Process 500 determines the number of MSBs that can be shared among address banks and the number of address banks that can share those MSBs.

At 504, an input number of memory cell addresses M to be stored is selected. A first value N is set equal to M at 506. The value N changes in certain embodiments for each cycle of the process. At 508, a value L is determined. L is either zero or a positive whole number (e.g., L is 0, 1, 2, 3 . . . ). L is determined at 508 by satisfying two conditions: N is be greater than $2^L$, and N is be greater than or equal to $2^{L+1}$. For example, if N is 16, then L is 3 because 16 is greater than or equal to $2^3$ (which is 8) and because N is greater than or equal to $2^{3+1}$ (which is 16).

At 510, the number of times that N can be divided by $2^L$ is determined. This value is K. K represents the number of address banks that share L MSBs. Mathematically, K can be expressed as $N/(2^L)$. The integer value of $N/(2^L)$ is taken rather than the entire value of $N/(2^L)$ to ensure that $N/(2^L)$ results in a whole number. For example, if N is 11 and L is 1, $11/2^1$ equals 5.5, but K will be set equal to the integer value of 5.5, which is 5.

At 514, if L is zero, the process ends. If L is a positive whole number, the process continues to 516. At 516, K is subtracted from N. This new value of N will be used in the next cycle of the process.

At 518, if K is greater than $2^{L+1}$, the process returns to 510 with L remaining at its current value. If K is not greater than $2^{L+1}$, the process continues to 520, where L is decreased by 1. The process then returns to 510. Process 500 continues until L is zero.

For each cycle of the process, a set of L and K values is determined. The L or K values may be the same for consecutive cycles. Each set of values indicates how many address banks (K) share what number of MSBs (L). For example, if after a first cycle, K is 3 and L is 2, three address banks can share two MSBs. If after a second cycle, K is 5 and L is 1, an additional five address banks can share one MSB.

Figure 6:
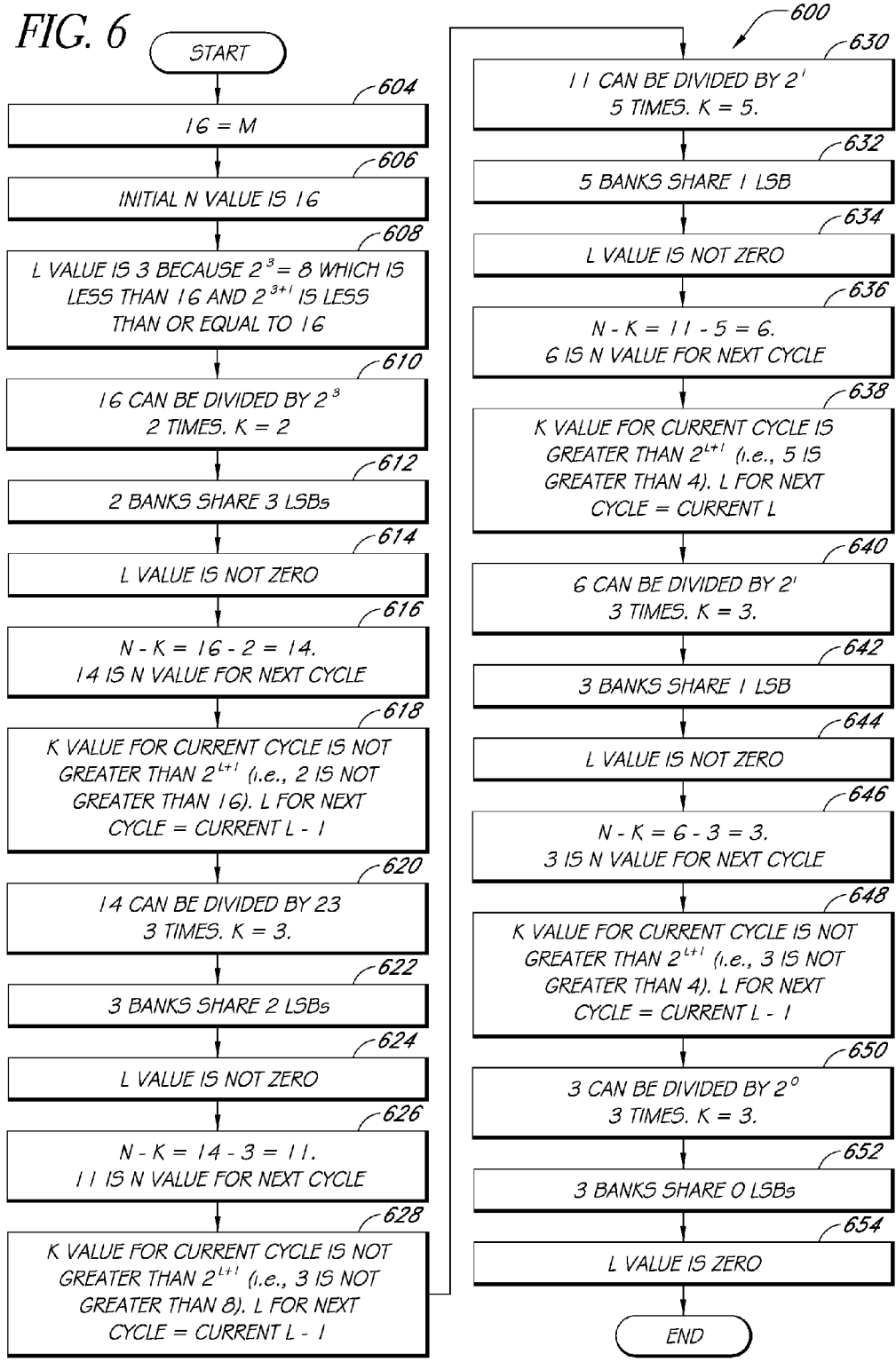
FIG. 6 is an exemplary flowchart showing an example implementation of the process in FIG. 5.

FIG. 6 illustrates an example of an implementation of the process 500. The number of addresses to be stored is 16. Therefore, M is 16 at 604 and N is initially set to 16 at 606. L is initially determined to be 3 at 608 because 23 is equal to 8 which is less than 16 (M) and $2^{3+1}$ is less than or equal to 16. At 610, the integer value of the number of times that N (16) can be divided by $2^L$ (8) is determined. The result is 2, which is K. Thus, after a first cycle of process 300, 2 (K) address banks share 3 (L) MSBs at 612.

At 614, the value of L is checked. Because L is not zero, the process continues. At 616 and 618, the process determines the N and L values for the next cycle of the process. At 616, the current K (2) is subtracted from the current N (16) to determine the N for the next cycle, which is 14 (i.e., 16−2=14). At 618, the process determines whether the L value for the next cycle will be the current L value or one less than the current L value. This determination is based on whether the current K is greater than $2^{L+1}$. In this case, K is not greater than $2^{L+1}$ because 2 is not greater than 16 (i.e., $2^{3+1}$). The L value for the next cycle is thus L−1 (L=3−1) which is 2. With N equal to 14 and L equal to 2, K is determined at 620. Here, K is 3 because $14/2^2$ (i.e., $N/(2^L)$) is 3. Thus, after a second cycle, 3 (K) additional address banks share 2 (L) MSBs at 622.

Because L for this cycle is again not zero (which is checked at 624), the process continues to 626, where N for the next cycle is determined. The next N will be the current N minus K, which is 11. The L for the next cycle is determined at 628.

Because K for the current cycle is not greater than $2^{L+1}$ (i.e., 3 is not greater than $2^{2+1}$), L for the next cycle will be one less than L for the current cycle. That is, L for the next cycle is 1 (i.e., 2−1). At 630, the next K is determined. For this cycle, N is 11 (determined at 626) and L is 1 (determined at 628). K for this cycle is therefore 5 because $11/2^1$ is 5. Thus, 5 address banks share 1 MSB at 632. Again, because L is still not zero, the process continues with another cycle.

At 636, N for the next cycle is determined (current N minus the current K). Here, the new N is 6 (i.e., 11−5). At 638, L for the next cycle remains constant (i.e., 1 will not be subtracted from the L value) because K is greater than (i.e., 5 is greater than $2^{1+1}$). At 640, K for the next cycle is 3 because N (6) can be divided by $2^L$ (i.e., $2^1$=2) three times. Thus, 3 (K) more address banks share 1 (L) MSB at 642. As was the case with the previous cycles, L in this cycle is also not zero (checked at 644). Therefore, N and L for the next cycle are determined.

At 646, N for the next cycle is 3 (i.e., current N minus current K=6−3=3). At 648, L for the next cycle is zero because K for the current cycle is not greater than $2^{L+1}$. Thus, L−1 equals zero. At 650, K is 3 (i.e., $N/(2^L)=3/2^0=3$). Thus, three (K) address banks share zero (L) MSBs at 652. Because L in this cycle is zero at 654, the process ends.

In sum, this process determined that to store 16 addresses, two address banks can share three MSBs, an additional three address banks can share two MSBs, five more address banks can share one MSB, three more address banks can share another MSB, and three other address banks do not share any MSBs.

Figure 7:
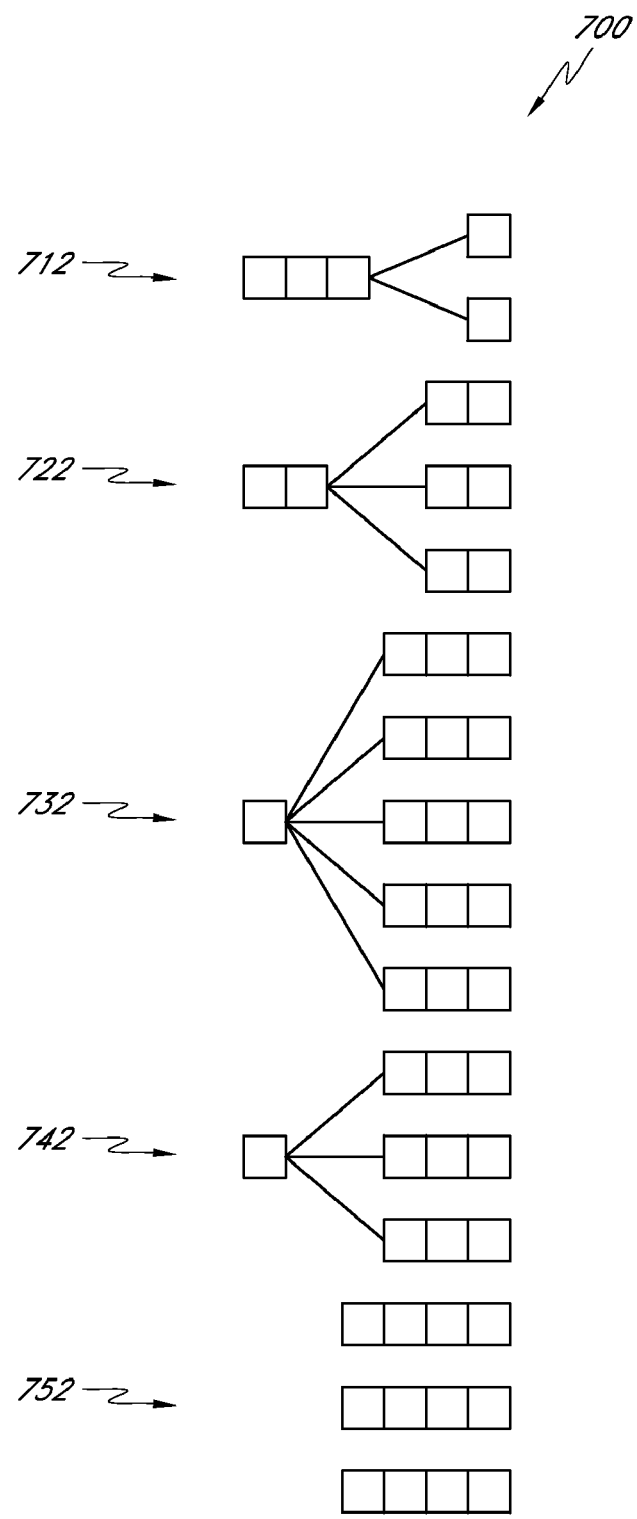
FIG. 7 is an exemplary diagram showing another embodiment of MSB sharing.

FIG. 7 shows one embodiment of a redundancy structure 700 configured according to the process 500 with M set to 16. The process 500 may be employed to reach the following results. Two address banks 712 share three MSBs, three address banks 722 share two MSBs, five address banks 732 share one MSB, an additional three address banks 742 share another MSB, and three address banks 752 do not share any bits. A total of 13 memory bank bit locations are saved compared to a structure that saves no MSBs.

Because M was selected as 16, process 500 produces results for the storage of 16 addresses on redundancy structure 700. Notably, 16 is 2 to the fourth power ($2^4$), and consequently an embodiment of the redundancy structure can accommodate every possible four-bit address. If memory addresses longer than four bits are to be stored in redundancy structure 700, the additional bits are placed in back of each bank as LSBs. For example, if 16 five-bit addresses (as opposed to four-bit addresses) are to be stored in redundancy structure 600, an additional physical memory location is placed in back of the address banks as an LSB.

If M were in the range of 17 to 32 addresses, each bank of the corresponding redundancy structure would have at least five physical memory locations to store at least five bits. Similarly, if M were in the range of 33 to 64 addresses, each bank of the corresponding redundancy structure would have at least six physical memory locations to store at least six bits, and so on.

Figure 8:
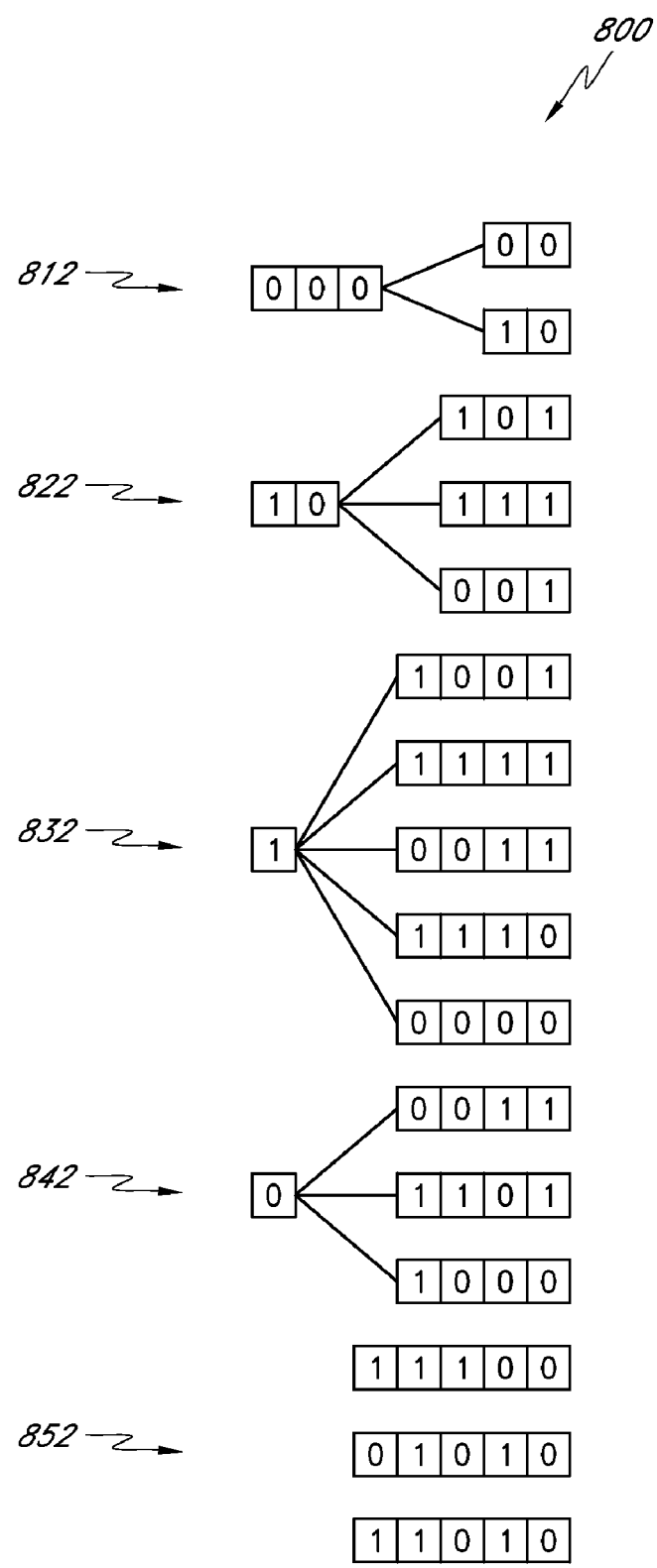
FIG. 8 is an exemplary diagram showing still another embodiment of MSB sharing.

Redundancy structure 800 of FIG. 8 shows how a random pattern of 16 five-bit addresses are stored in accordance with the results of process 500. Redundancy structure 800 is similar to redundancy structure 700 except that redundancy structure 800 has five physical memory locations for each bank instead of four. Several address banks (i.e., 812, 822, 832, 842, or 852) are depicted to which addresses are assigned. The assignment of the addresses to the groups is somewhat flexible in that there are alternative arrangements for how this pattern of addresses could be stored. For example, addresses 11111 and 11110 from bank 832 can alternatively be stored in bank 812, with addresses 00000 and 00010 from bank 812 alternatively stored in bank 852 in place of addresses 11100 and 11010. Addresses 11100 and 11010 can then alternatively be stored in address banks 832 with their MSB being shared along with the MSB of addresses 11001, 10011, and 10000.

Figure 9:
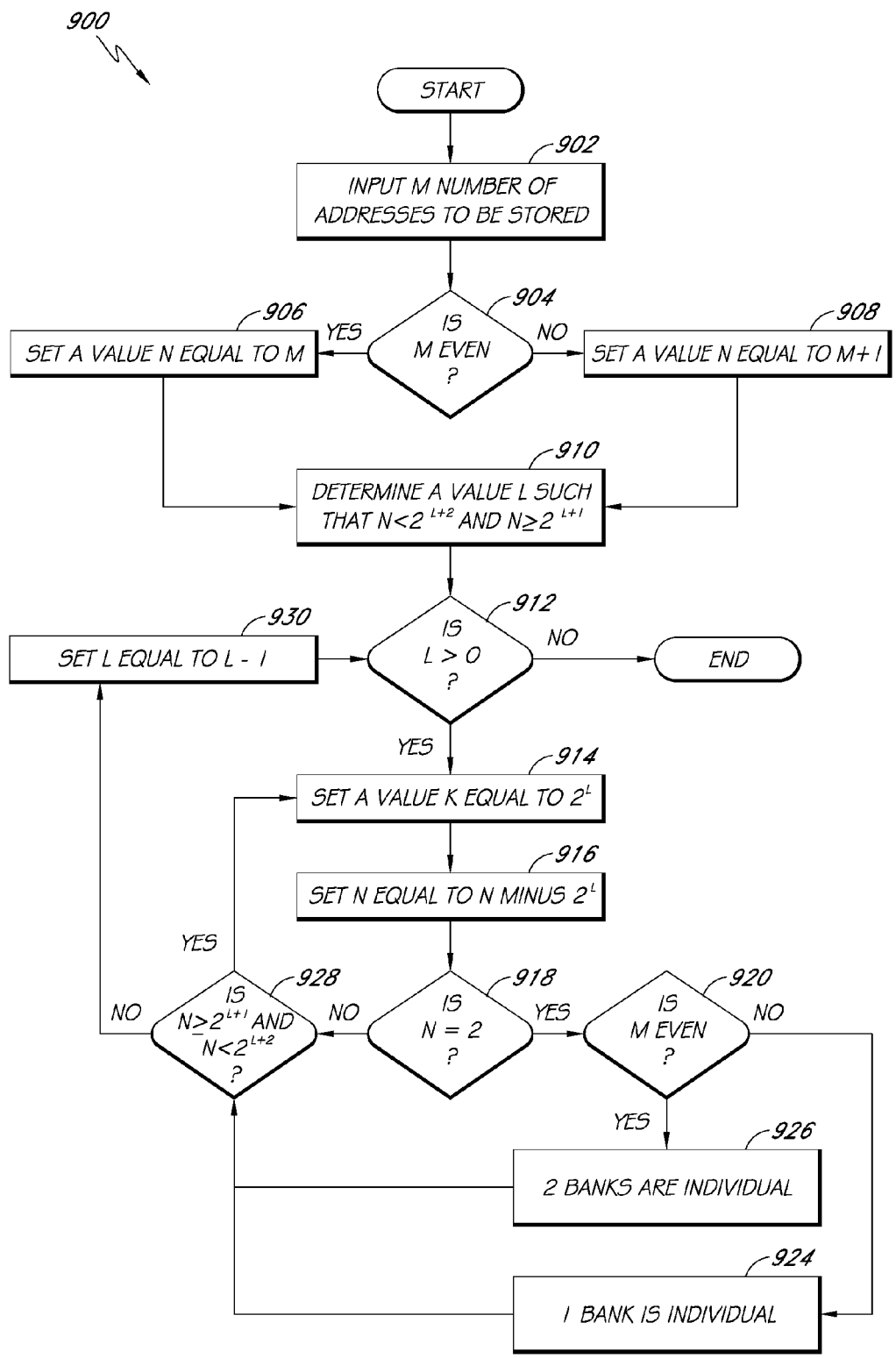
FIG. 9 is an exemplary flowchart showing another embodiment of a process for determining shared address bits.

FIG. 9 shows one embodiment of a second technique to determine shared MSBs, process 900. Like the process 500, process 900 in certain embodiments determines the number of MSBs that can be shared among address banks and the number of address banks that can share those MSBs.

At 902, an input number M of address banks to be stored is selected. At 904, it is determined whether M is even. If M is even, then at 906 a value N is set equal to M. However, if M is odd, N is set to equal to M plus 1 at 908. The process 900 proceeds to 910, where a number L is determined to satisfy the conditions that N is greater than or equal to $2^{L+1}$ and that N is less than $2^{L+2}$. Next, if L is greater than 0 at 912, the process 900 sets a number K equal to $2^L$ at 914. However, if at 912 L is not greater than zero, the process 900 ends.

At 916, the number N is set equal to N minus $2^L$. At 918, the process 900 determines if N equals 2. If N equals 2, the process 900 determines at 920 whether M is an even number. If M is not even, the process 900 at 924 determines that one address bank does not share MSBs with another address bank; that is, one address bank is "individual." If M is even, the process 900 determines that two address banks are individual at 926.

If N is not equal to 2 at 918, the process 900 determines whether N is greater than or equal to $2^{L+1}$ and whether N is less than $2^{L+2}$ at 928. If the conditions at 928 are satisfied, the process 900 loops back to 914. However, if the conditions at 928 are not satisfied, the process 900 proceeds to 930, sets L equal to L minus 1, and then returns to 912.

As in process 500, for each cycle of the process 900 a set of L and K values is determined. The L or K values may be the same for consecutive cycles. Each set of values indicates how many address banks (K) share what number of MSBs (L). Also like the process 500, a redundancy structure based on the process 900 may be constructed (not shown). This redundancy structure in certain embodiments may share more or fewer MSBs than a redundancy structure formed according to the process 500.

Figure 10:
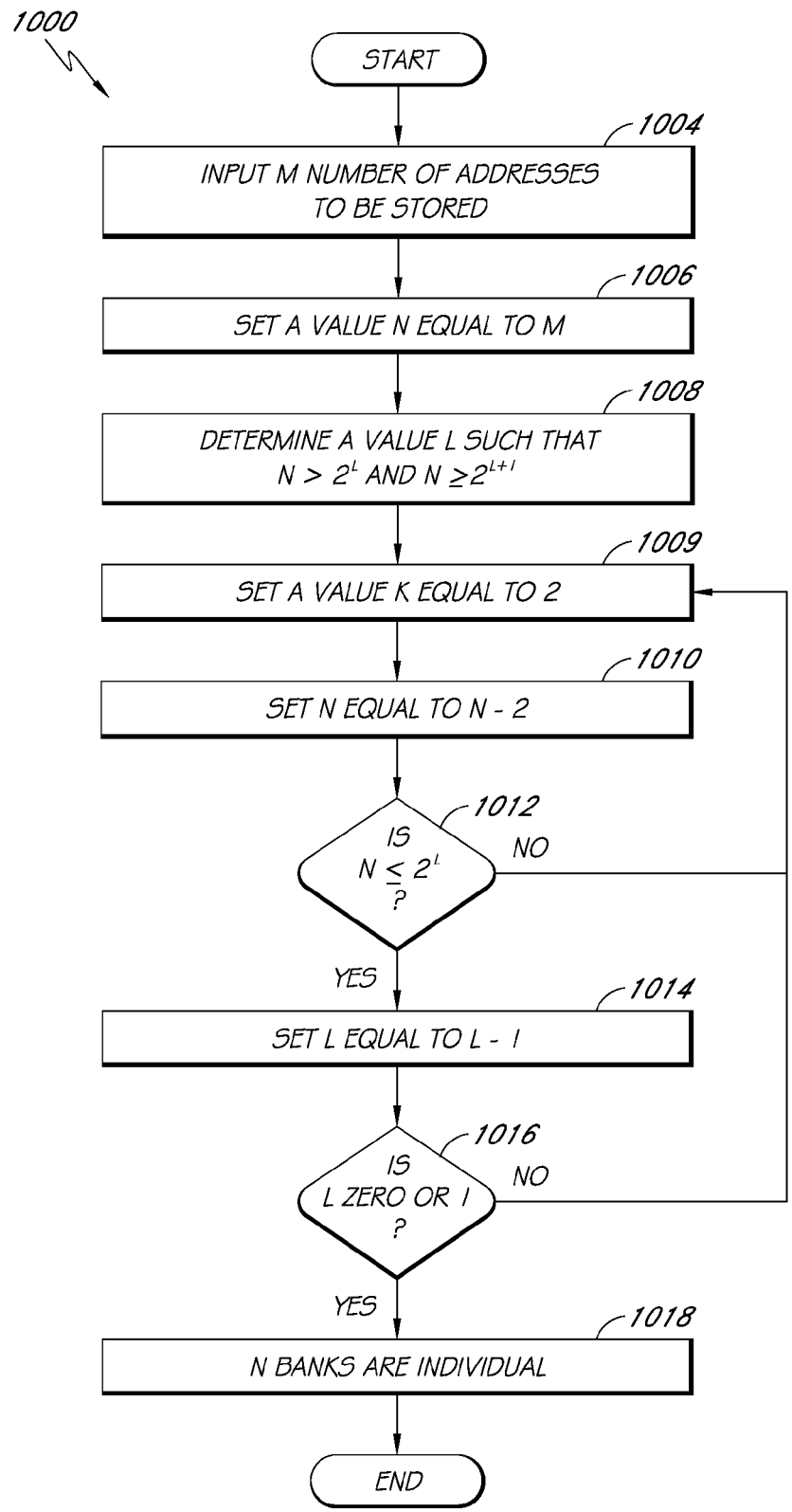
FIG. 10 is an exemplary flowchart showing still another embodiment of a process for determining shared address bits.

FIG. 10 shows one embodiment of a third technique to determine shared MSBs, process 1000. Similar to the previous two processes, process 1000 determines the number of MSBs that can be shared among address banks and the number of address banks that can share those MSBs.

At 1004, an input number of M addresses to be stored is selected. A first value N is set equal to M at 1006. The value N changes in certain embodiments for each cycle of the process. At 1008, L is determined to satisfy the conditions that $2^L$ is less than N and N is greater than or equal to $2^{L+1}$. At 1009, a value K is set equal to 2. Because K is 2 in this example of the process 1000, in certain embodiments 2 address banks per each cycle of the process 1000 may share MSBs.

At 1010, 2 is subtracted from N. At 1012, the process determines whether N is less than or equal to $2^L$. If N is not less than or equal to $2^L$, the process 1000 returns to 1009. If N is less than or equal to $2^L$, process 1000 continues at 1014. At 1014, 1 is subtracted from L.

The process 1000 continues at 1016 where it is determined whether L is zero or one. If L is not zero or one, process 1000 returns to 1009. If L is zero or one, process 1000 continues at 1018. At 1018, process 1000 determines that N address banks are individual. Process 1000 then ends.

Based on process 1000, a redundancy structure can be constructed. For each cycle of process 1000, a value L is determined for each N. For each cycle, if L is greater than one, two is subtracted from N. Therefore, two address banks share L bits where L is the value determined at 1008 or the result of a subtraction at 1014. If L is zero or one, however, there will be N residual address banks that are individual. For example, if N were 9 for a cycle of the process 1000, the process 1000 determines that there will be two address banks that share 3 MSBs. If N were 1, the process 1000 determines that there will be one address bank that does not share any MSBs.

Figure 11:
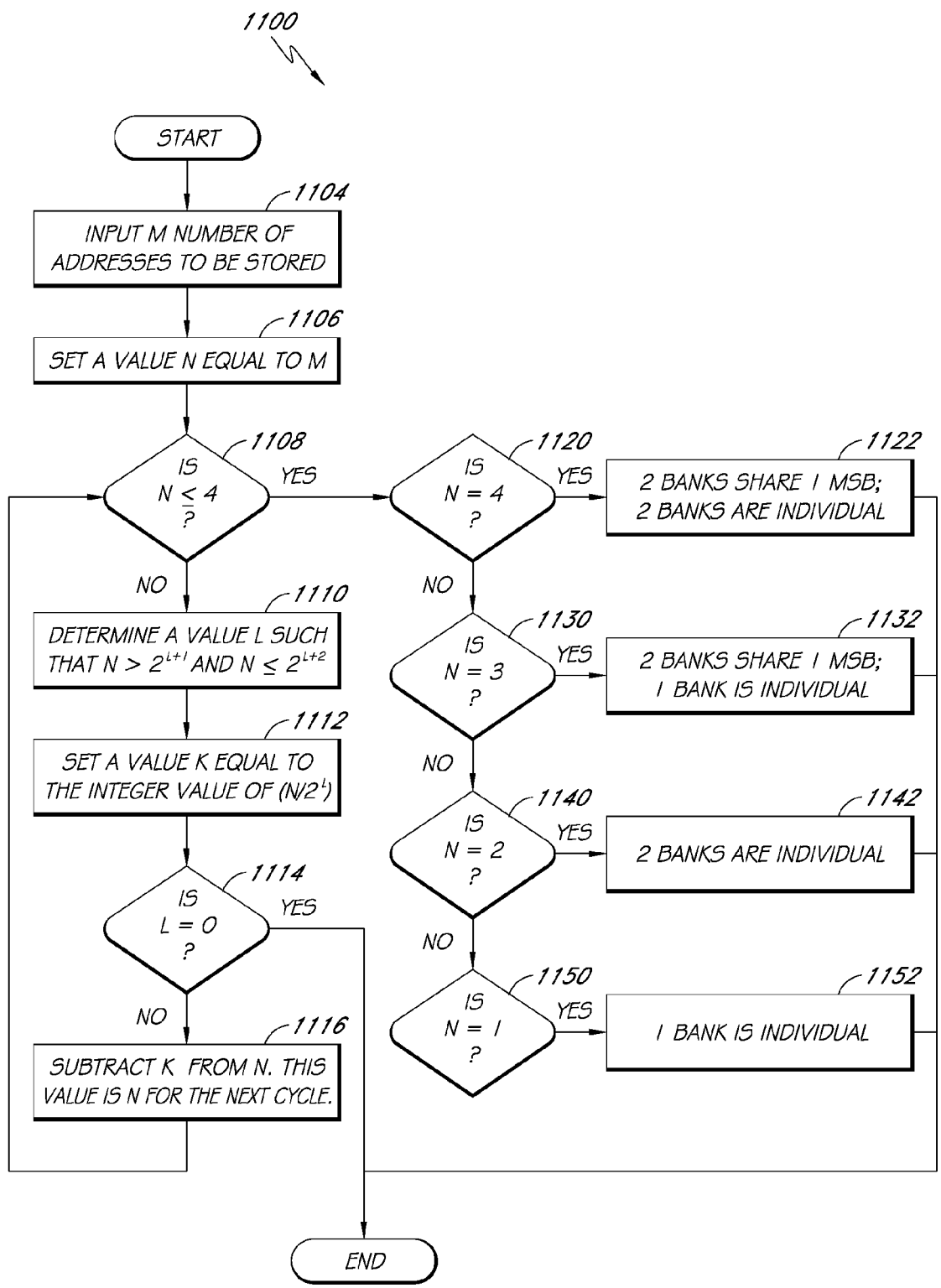
FIG. 11 is an exemplary flowchart showing still another embodiment of a process for determining shared address bits.

FIG. 11 shows one embodiment of a third process 1100. Process 1100 also determines the number of MSBs that can be shared among address banks and the number of address banks that can share those MSBs.

At 1104, an input number of M addresses to be stored is selected. A first value N is set equal to M at 1106. The value N changes in certain embodiments for each cycle of the process 1100. At 1108, the value of N is checked. If N is less than or equal to 4, the process 1100 continues at 1120. If N is not less than or equal to 4, the process 1100 continues at 1110. At 1110, L is determined by satisfying the conditions that $2^{L+1}$ is less than N and N is less than or equal to $2^{L+2}$.

At 1112, the number of times N can be divided by $2^L$ is determined. This value is K. Mathematically, K can be expressed as $N/(2^L)$. K is the number of address banks that share L MSBs. At 1114, the L value is checked. If L is equal to zero, process 1100 ends. If L is not equal to zero, process 1100 continues at 1116. At 1116, K is subtracted from N. The result will be N for the next cycle. After this determination, process 1100 returns to 1108.

As stated previously, if N is less than or equal to 4 at 1108, process 1100 continues at 1120. If N is 4 at 1120, process 1100 continues at 1122 where process 1100 determines that two address banks share one MSB and that two address banks are individual. After this determination, process 1100 ends. If N is not 4 at 1120, process 1100 continues at 1130.

At 1130, process 1100 determines whether N is 3. If N is 3, process 1100 continues at 1132 where process 1100 determines that two address banks share one MSB and that one bank is individual. After this determination, process 1100 ends. If N is not 3 at 1130, process 1100 continues at 1140.

At 1140, process 1100 determines whether N is 2. If N is 2, process 1100 continues at 1142 where process 1100 determines that two address banks are individual. After this determination, process 1100 ends. If N is not 2 at 1140, process 1100 continues at 1150. At 1150, process 1100 determines whether N is 1. If N is 1, process 1100 continues at 1152 where process 1100 determines that one bank is individual. After this determination, process 1100 ends.

Process 1100 produces a set of L and K values. In certain embodiments, for every K and L, K address banks share L MSBs. The L values and corresponding K values along with the determinations made at 1122, 1132, 1142, and 1152 are used to create a redundancy structure.

In certain embodiments, any of processes 500, 900, 1000, and 1100 may also be used to calculate a number of shared LSBs among a number of address banks. In addition, portions of each of these processes may be combined as described below to share both MSBs and LSBs among a number of address banks. By sharing both MSBs and LSBs, redundancy structures can be further reduced in size, and consequently more memory capacity may be achieved.

Figure 12:
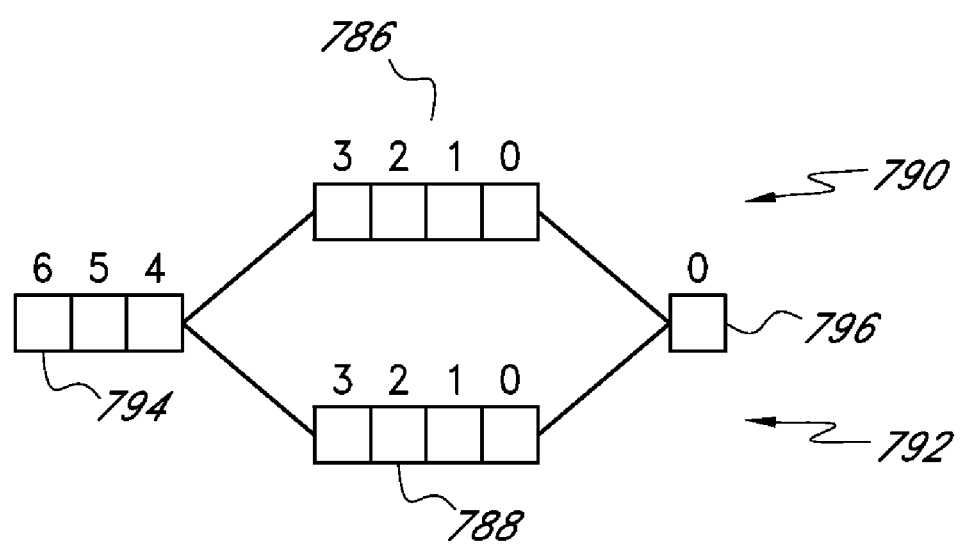
FIG. 12 is an exemplary diagram showing an embodiment of MSB and least significant bit (LSB) sharing.

One embodiment of MSB and LSB sharing is depicted in FIG. 12, which shows schematically two seven bit addresses. Address bank 790 and address bank 792 share three MSBs. The three shared MSBs are stored in shared address portion 794. Address banks 790 and 792 also share one LSB, stored in address portion 796. The three interior bits of each address bank 790, 792, i.e., those that are neither MSBs nor LSBs, are stored in address portions 786 and 788, respectively. Thus, address bank 790 comprises address portion 786, shared address portion 794, and shared address portion 796. Address bank 792 likewise comprises address portion 788, shared address portion 794, and shared address portion 796. Sharing both MSBs and LSBs among the two address banks reduces the address bits to be stored by four. Thus, in certain embodiments sharing both MSBs and LSBs allows for sharing more bits than by sharing MSBs or LSBs alone.

Figure 13:
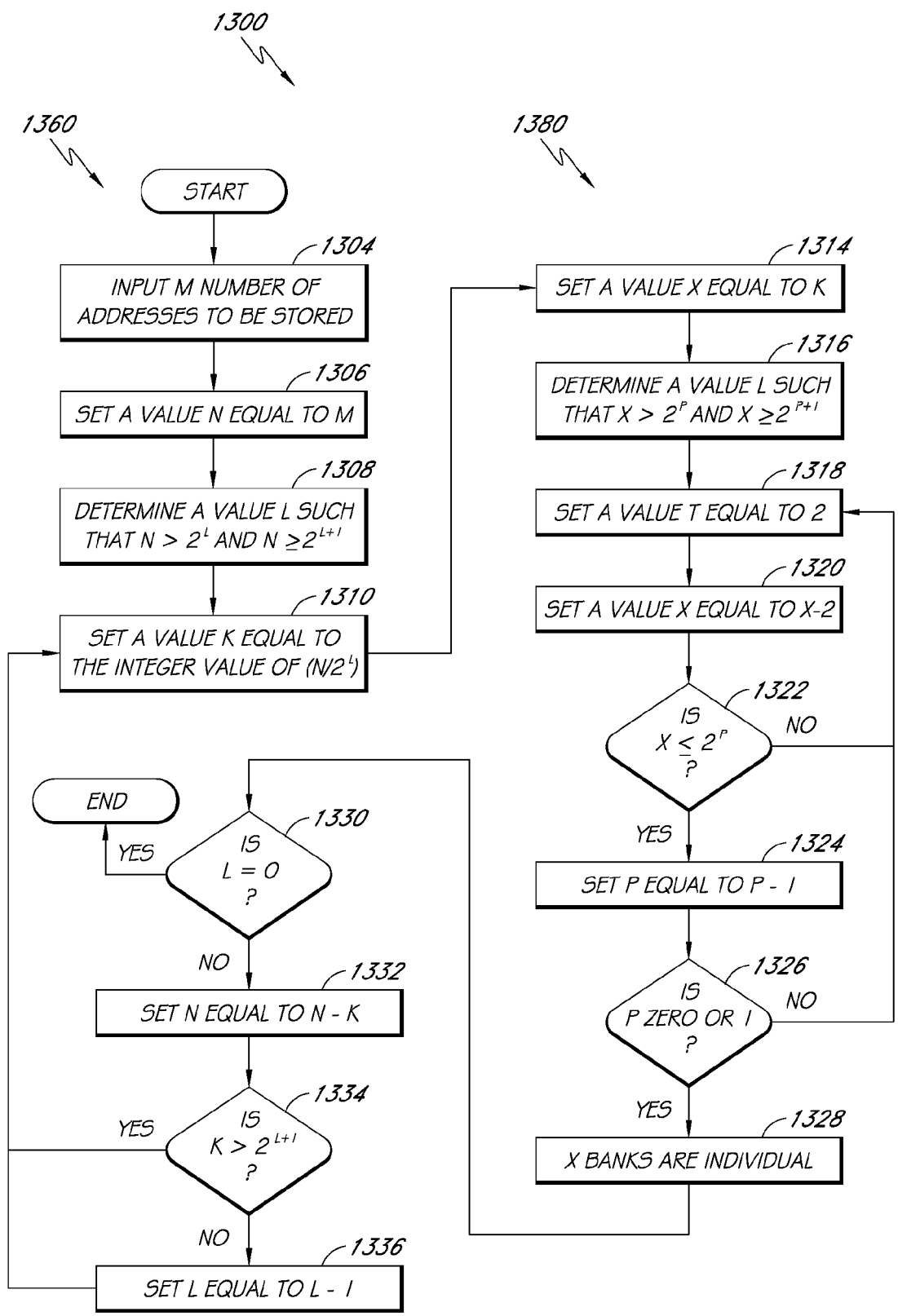
FIG. 13 is an exemplary flowchart showing an embodiment of a process for determining shared MSBs and LSBs.

FIG. 13 shows an embodiment of a process 1300 for determining shared MSBs and LSBs. Process 1300 determines the number of MSBs that can be shared among address banks and the corresponding number of address banks that can share MSBs. Process 1300 also determines the corresponding number of LSBs that can be shared among address banks and the number of address banks that can share LSBs.

At 1304, an input number of memory cell addresses M to be stored is selected. A first value N is set equal to M at 1306. The value N changes in certain embodiments for each cycle of the process. At 1308, a value L is determined. L is determined by satisfying two conditions: N is greater than $2^L$, and N is greater than or equal to $2^{L+1}$.

At 1310, the number of times that N can be divided by $2^L$ is determined. This value is K. Mathematically, K can be expressed as the integer value of $N/(2^L)$. The integer value of $N/(2^L)$ is taken rather than the entire value of $N/(2^L)$ to ensure that $N/(2^L)$ results in a whole number. K represents the number of address banks that can share L LSBs.

At 1314, the process 1300 sets a value X equal to K. At 1316, P is determined to satisfy the conditions that $2^P$ is less than X and that X is greater than or equal to $2^{P+1}$. At 1318, a value T is set equal to 2. T represents the number of address banks that share P MSBs.

At 1320, 2 is subtracted from X. At 1322, the process 1300 determines whether X is less than or equal to $2^P$. If X is less than or equal to $2^P$, process 1300 continues at 1324. If X is not less than or equal to $2^P$, process 1300 returns to 1318.

At 1324, 1 is subtracted from P. The process 1300 then continues at 1326 where it is determined whether P is zero or one. If P is not zero or one, process 1300 returns to 1318. If P is zero or one, process 1300 continues at 1328. At 1328, process 1300 determines that there will be X address banks that are individual with respect to MSBs.

After block 1328, process 1300 proceeds to 1330 where if L is zero, the process 1300 ends. If L is a positive whole number, the process 1300 continues to 1332. At 1332, K is subtracted from N. This new value of N will be used in the next cycle of the process 1300.

At 1334, if K is greater than $2^{L+1}$, the process returns to 1310 with L remaining at its current value. If K is not greater than $2^{L+1}$, the process continues to 1336, where L is decreased by 1. The process then returns to 1310. Process 1300 continues until L is zero.

Figure 14:
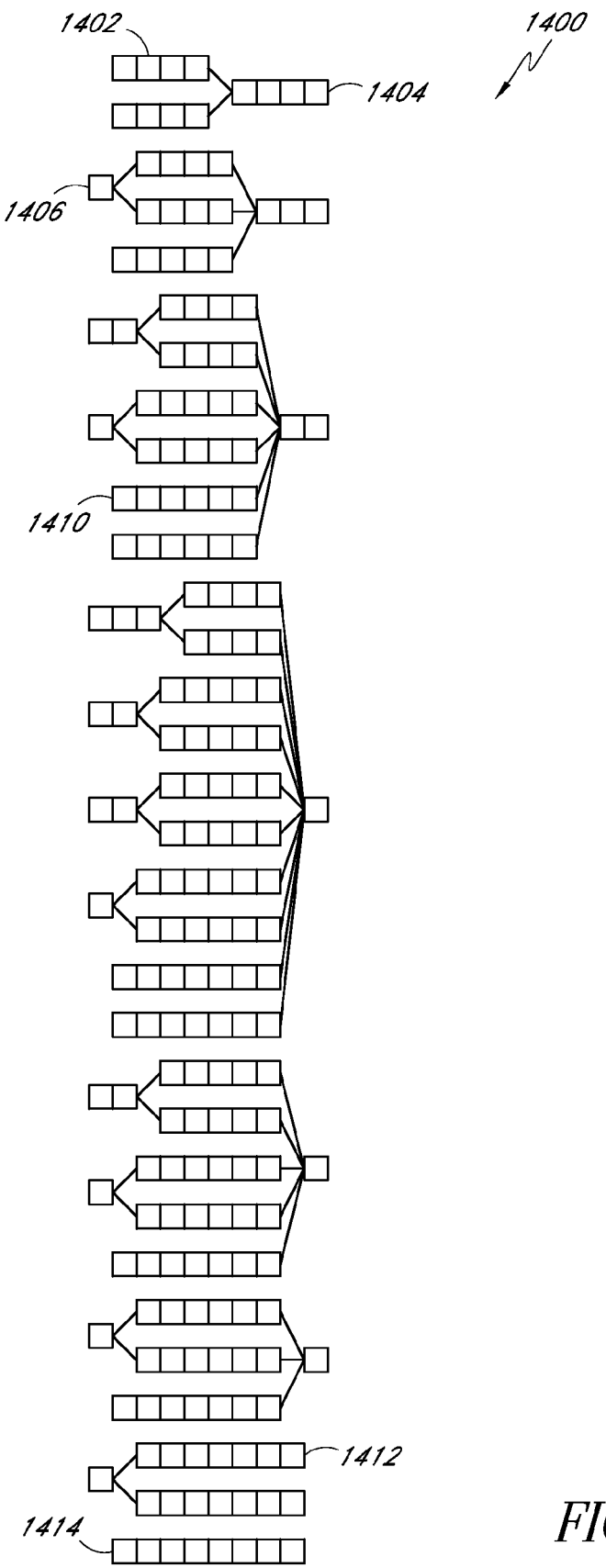
FIG. 14 is an exemplary diagram showing another embodiment of MSB and LSB sharing.

For each cycle of the process 1300, a set of L and K values are determined. For each K value, a set of P and T values are determined. The L or K values and the P or T values may be the same for consecutive cycles. Each set of L and K values indicates how many address banks (K) share what number of LSBs (L). Each set of P and T values indicates how many address banks (T) share what number of MSBs (P). For each iteration of the process 1300, the process 1300 determines a value for K and possibly multiple values of T and P corresponding to that single value of K. Physically, this illustrates that for one group of K address banks that share L LSBs, possibly multiple sets of T address banks share P MSBs. An embodiment of a redundancy structure constructed according to the process 1300 is depicted in FIG. 14, below.

The process 1300 in certain embodiments includes a subprocess 1360 and a subprocess 1380. The subprocess 1360 includes blocks 1304 through 1310 and blocks 1330 through 1336 of the process 1300. The subprocess 1380 includes blocks 1314 through 1328. The subprocess 1360 of certain embodiments calculates shared LSBs, while the subprocess 1380 of certain embodiments calculates shared MSBs.

Blocks 1304 through 1310 of the subprocess 1300 are equivalent to blocks 504 through 510 of the process 500, respectively. Blocks 1330 through 1336 are similarly equivalent to blocks 514 through 520 of the process 500, respectively. Thus, the subprocess 1360 in certain embodiments incorporates the process 500, except that instead of proceeding from block 1310 to block 1330 as is done in the process 500 (that is, from block 514 to block 516), the process 1300 proceeds from block 1310 to block 1314, which is the start of the subprocess 1380. The process 1300 returns to complete the incorporated process 500 at block 1330 after the subprocess 1380 completes at 1328.

Blocks 1314 through 1328 of the subprocess 1380 are equivalent to blocks 1006 through 1018 of the process 1000, except that the names of the values are changed. If the letter T in the subprocess 1380 were replaced with the letter K and if the letter P were replaced with the letter L, the blocks of these two processes would be similar. Consequently, the subprocess 1380 in certain embodiments incorporates the process 1000, except that instead of starting at the equivalent of block 1004, the subprocess 1380 starts at the equivalent of block 1006. Thus, the process 1300 of certain embodiments is a combination of two subprocesses, namely the process 500 and the process 1100.

The process 1300 may also be constructed from different subprocesses. For instance, the subprocess 1360 in certain embodiments could incorporate any of the processes 500, 900, and 1100, recognizing that slight changes would be made to each subprocess, similar to the changes discussed above. The subprocess 1380 in certain embodiments could also incorporate any of the processes 500, 900, 1000, and 1100, recognizing that slight changes would be made to each subprocess. Thus, because three different processes could be used interchangeably as the subprocess 1360 and four different processes could be used interchangeably as the subprocess 1380, in certain embodiments at least twelve different processes may be used to calculate shared LSBs and shared MSBs.

For instance, if the subprocess 1360 incorporated the process 900, the process 1300 would begin by executing blocks 902 through 914 of the process 900. From block 914, the process 1300 would proceed to the subprocess 1380. After the subprocess 1380 completed, the process 1300 would return to block 916 of the process 900 and would execute blocks 916 through 928 of the process 900, looping back to either 912 via block 930 or to 914 for another cycle.

If the subprocess 1360 incorporated the process 1100, the process 1300 would begin by executing blocks 1104 through 1112 of the process 1100. From block 1112, the process 1300 would proceed to the subprocess 1380. After the subprocess 1380 completed, the process 1300 would return to block 1114 of the process 1100 and would execute blocks 1114 through 1116 of the process 1100, looping back to block 1108 for another cycle.

In a similar fashion, if the subprocess 1380 incorporated the process 500, the process 1300 would begin the subprocess 1380 by executing block 506 of the process 500 and proceed to execute the remainder of the process 500. After completing the process 500, the process 1300 would return to the subprocess 1360.

If the subprocess 1380 incorporated the process 900, the process 1300 would begin the subprocess 1380 by executing block 904 of the process 900 and proceed to execute the remainder of the process 900. After completing the process 900, the process 1300 would return to the subprocess 1360.

If the subprocess 1380 incorporated the process 1100, the process 1300 would begin the subprocess 1380 by executing block 1106 of the process 1100 and proceed to execute the remainder of the process 1100. After completing the process 1100, the process 1300 would return to the subprocess 1360.

In one embodiment, method comprises (a) identifying a number of address banks to store in a memory structure, (b) determining a number K address banks that share L least significant bits, (c) determining a number P most significant bits shared among 2 address banks, (d) decrementing P by 1, (e) repeating (c) and (d) until P equals zero or 1, (f) determining a number of address banks that share no most significant bits, (g) if K is less than or equal to $2^{L+1}$, decrementing L by 1, and (h) repeating (b) through (g) until L equals zero.

One example of an embodiment of a shared LSB and MSB redundancy structure is depicted in FIG. 14. FIG. 14 depicts partial results of employing the process 1300. Thirty-two address banks 1402 are shown. Each address bank 1402 has 8 bits capable of storing 256 addresses. While the process 1300 in certain embodiments could calculate shared LSBs and MSBs for all 256 possible addresses, only a portion (32) of such addresses is shown.

To the right of many of the address banks 1402, one or more shared LSBs 1404 are shown. For example, at the top of FIG. 14, two address banks 1402 share four LSBs 1404. To the left of address banks 1402, there are corresponding shared MSBs 1406. Address banks that do not share MSBs, or in other words that are individual with respect to MSBs, are depicted as address banks 1410. Other address banks that are individual with respect to LSBs are depicted as address banks 1412. Finally, address banks that are individual with respect to both LSBs and MSBs are depicted as address banks 1414.

Figure 15A:
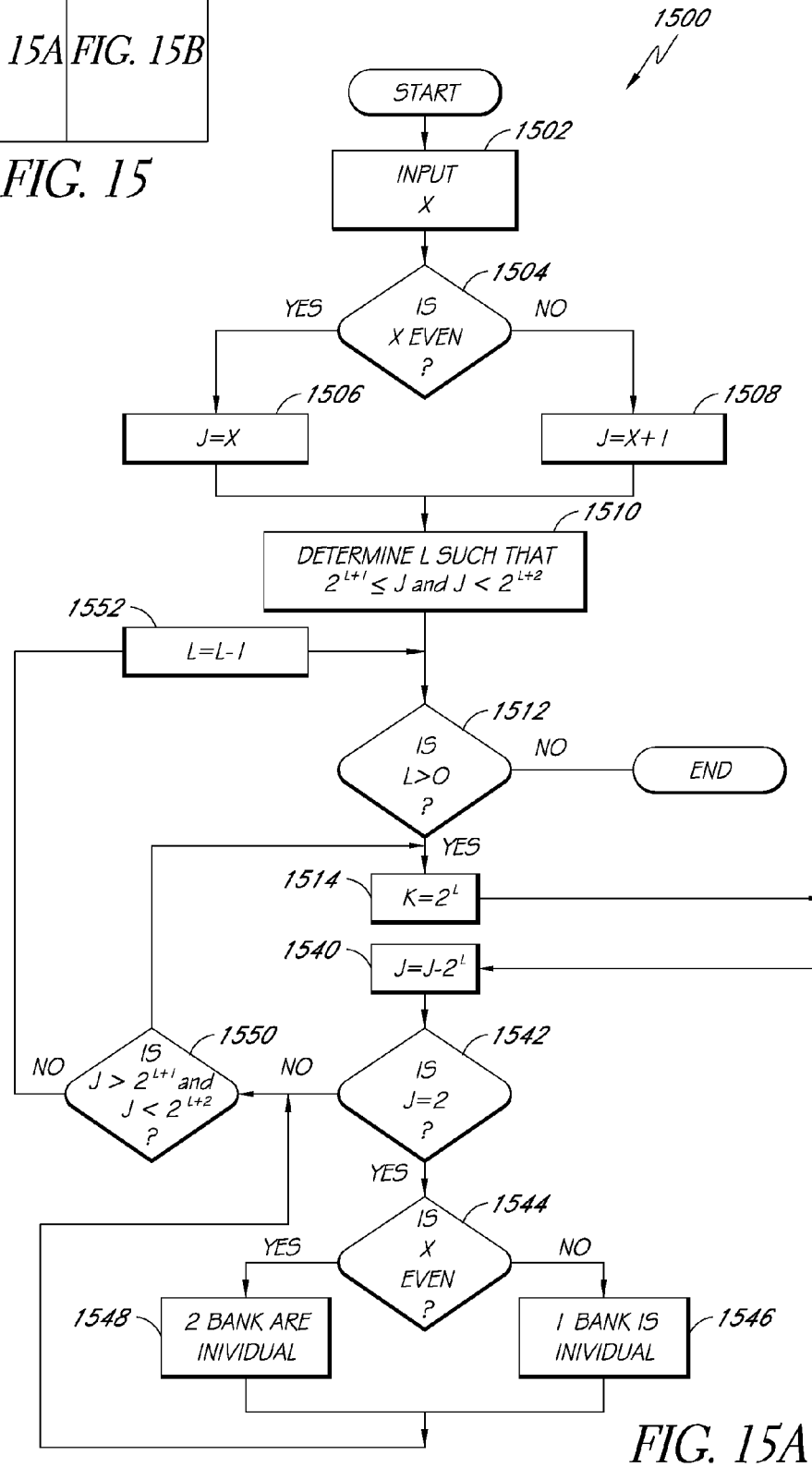
FIG. 15A is an exemplary flowchart showing an embodiment of a process for determining shared MSBs and LSBs.
Figure 15B:
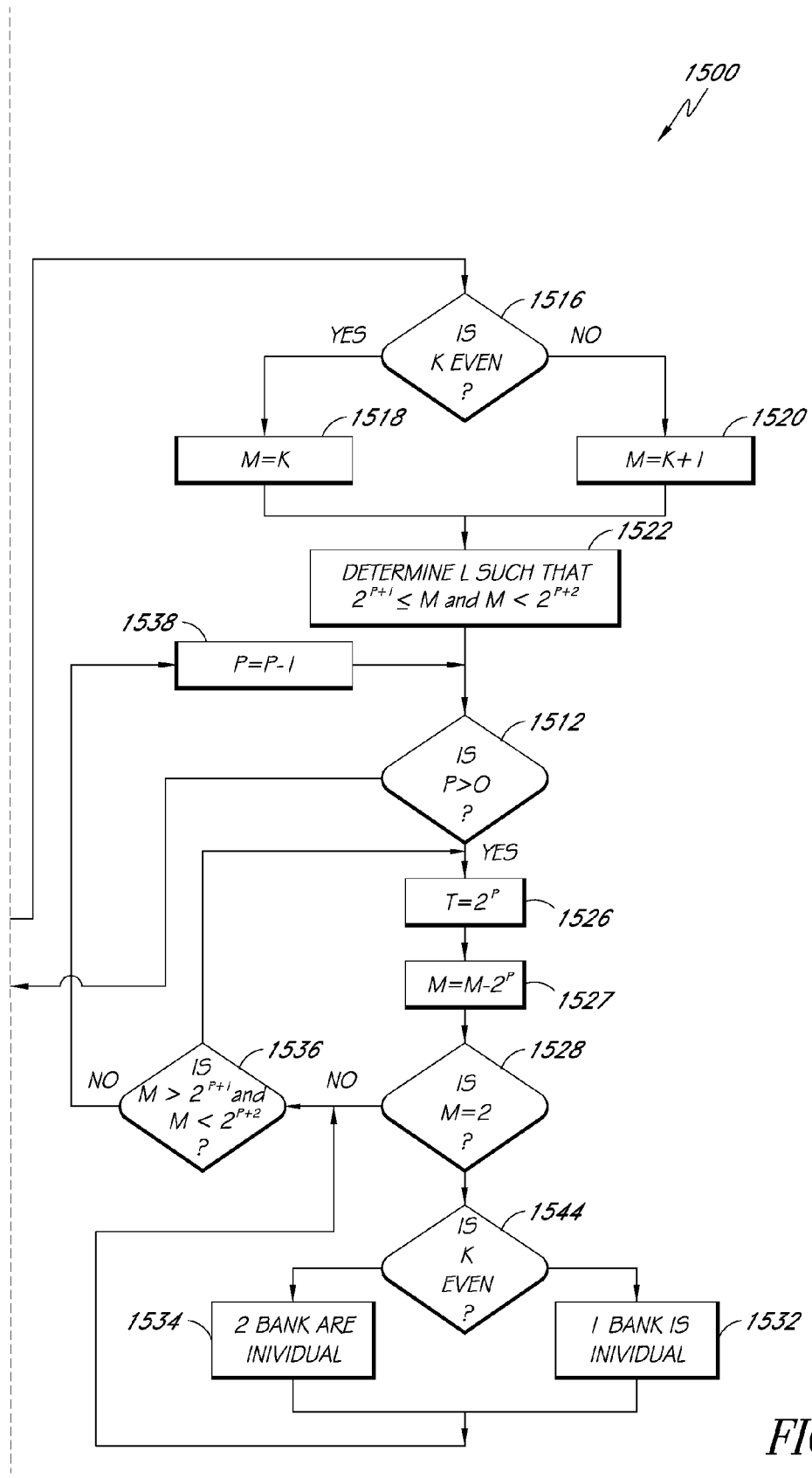
FIG. 15B is an exemplary flowchart showing an embodiment of a process for determining shared MSBs and LSBs.

FIGS. 15A and 15B show another embodiment of a process 1500 for determining shared MSBs and LSBs. Process 1500 determines the number of MSBs that can be shared among address banks and the corresponding number of address banks that can share MSBs. Process 1500 also determines the corresponding number of LSBs that can be shared among address banks and the number of address banks that can share LSBs.

At 1502 (see FIG. 15A), an input number X of address banks to be stored is selected. At 1504, it is determined whether X is even. If X is even, then at 1506 a value J is set equal to X. However, if X is odd, J is set to equal to X plus 1 at 1508. The process 1500 proceeds to 1510, where a number L is determined to satisfy the conditions that J is greater than or equal to $2^{L+1}$ and that J is less than $2^{L+2}$. Next, if L is greater than 0 at 1512, the process 1500 sets a number K equal to $2^L$ at 1514. However, if at 1512 L is not greater than zero, the process 1500 ends.

At 1516 (see FIG. 15B), it is determined whether K is even. If K is even, then at 1518 a value M is set equal to K. However, if K is odd, M is set to equal to M plus 1 at 1520. The process 1500 proceeds to 1522, where a number L is determined to satisfy the conditions that M is greater than or equal to $2^{L+1}$ and that M is less than $2^{L+2}$. Next, if L is greater than 0 at 1524, the process 1500 sets a number T equal to $2^P$ at 1526. However, if at 1524 P is not greater than zero, the process 1500 proceeds to 1540.

At 1527, the number M is set equal to M minus $2^P$. At 1528, the process 1500 determines if M equals 2. If M equals 2, the process 1500 determines at 1530 whether K is an even number. If K is not even, the process 1500 at 1532 determines that one address bank does not share MSBs with another address bank; that is, one address bank is "individual" with respect to MSBs. If K is even, the process 1500 determines that two address banks are individual at 1534. The process then proceeds to 1536.

If M is not equal to 2 at 1528, the process 1500 determines whether M is greater than or equal to $2^{P+1}$ and whether M is less than $2^{P+2}$ at 1536. If the conditions at 1536 are satisfied, the process 1500 loops back to 1526. However, if the conditions at 1536 are not satisfied, the process 1500 proceeds to 1538, sets P equal to P minus 1, and then returns to 1524.

At 1540 (see FIG. 15A), the number J is set equal to J minus $2^L$. At 1542, the process 1500 determines if J equals 2. If J equals 2, the process 1500 determines at 1544 whether X is an even number. If X is not even, the process 1500 at 1546 determines that one address bank does not share LSBs or MSBs with another address bank; that is, one address bank is "individual" with respect to LSBs and MSBs. If X is even, the process 1500 determines that two address banks are individual with respect to MSBs and LSBs at 1548. The process then proceeds to 1550.

If J is not equal to 2 at 1542, the process 1500 determines whether J is greater than or equal to $2^{L+1}$ and whether J is less than $2^{L+2}$ at 1550. If the conditions at 1550 are satisfied, the process 1500 loops back to 1514. However, if the conditions at 1550 are not satisfied, the process 1500 proceeds to 1552, sets L equal to L minus 1, and then returns to 1512.

Figure 16:
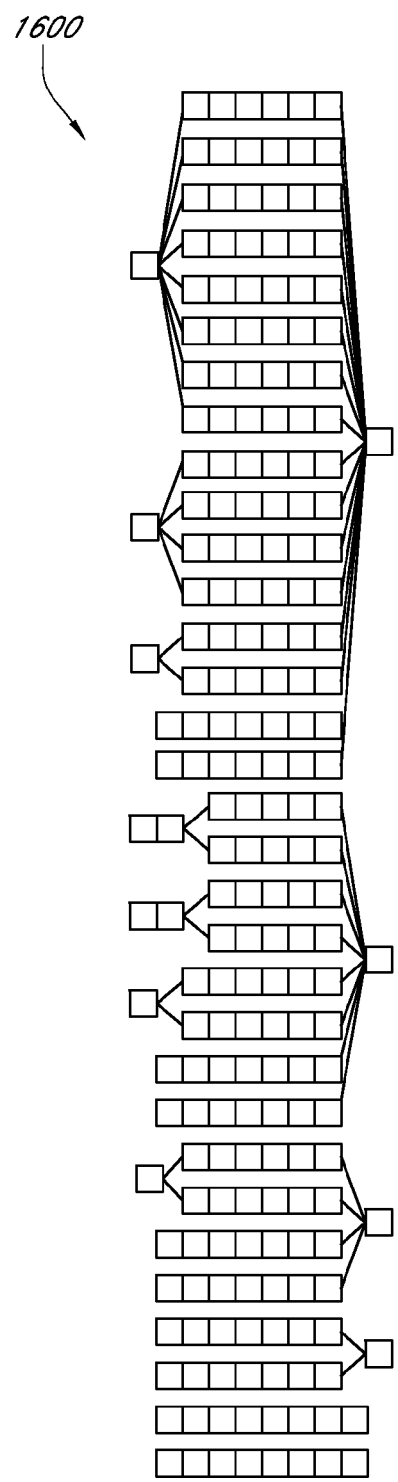
FIG. 16 is an exemplary diagram showing another embodiment of MSB and LSB sharing.

For each cycle of the process 1500, a set of L and K values are determined. For each K value, a set of P and T values are determined. The L or K values and the P or T values may be the same for consecutive cycles. Each set of L and K values indicates how many address banks (K) share what number of LSBs (L). Each set of P and T values indicates how many address banks (T) share what number of MSBs (P). For each iteration of the process 1500, the process 1500 determines a value for K and possibly multiple values of T and P corresponding to that single value of K. Physically, this illustrates that for one group of K address banks that share L LSBs, possibly multiple sets of T address banks share P MSBs. An embodiment of a redundancy structure constructed according to the process 1500 is depicted in FIG. 16.

In one embodiment, a method comprises (a) identifying a number of address banks to store in a memory structure, (b) determining a number K address banks that share L least significant bits, (c) determining a number T address banks that share P most significant bits, (d) if a first fixed number has been reached, determining a number of address banks that share no most significant bits, (e) repeating (c) and (d) until P is less than or equal to zero, (f) if a third fixed number has been reached, (i) determining a number of address banks that do not share any least significant bits or most significant bits, and (g) repeating (b) through (f) until L is less than or equal to zero.

In one embodiment, a number of fuses saved due to shared most significant bits is given by the equation $\Sigma(K-1)*L + \Sigma(P-1)*T$.

Figure 17:
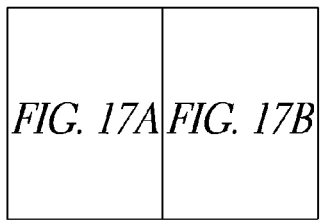
FIG. 17A is an exemplary flowchart showing an embodiment of a process for determining shared MSBs and LSBs.
FIG. 17B is an exemplary flowchart showing an embodiment of a process for determining shared MSBs and LSBs.
Figure 17A:
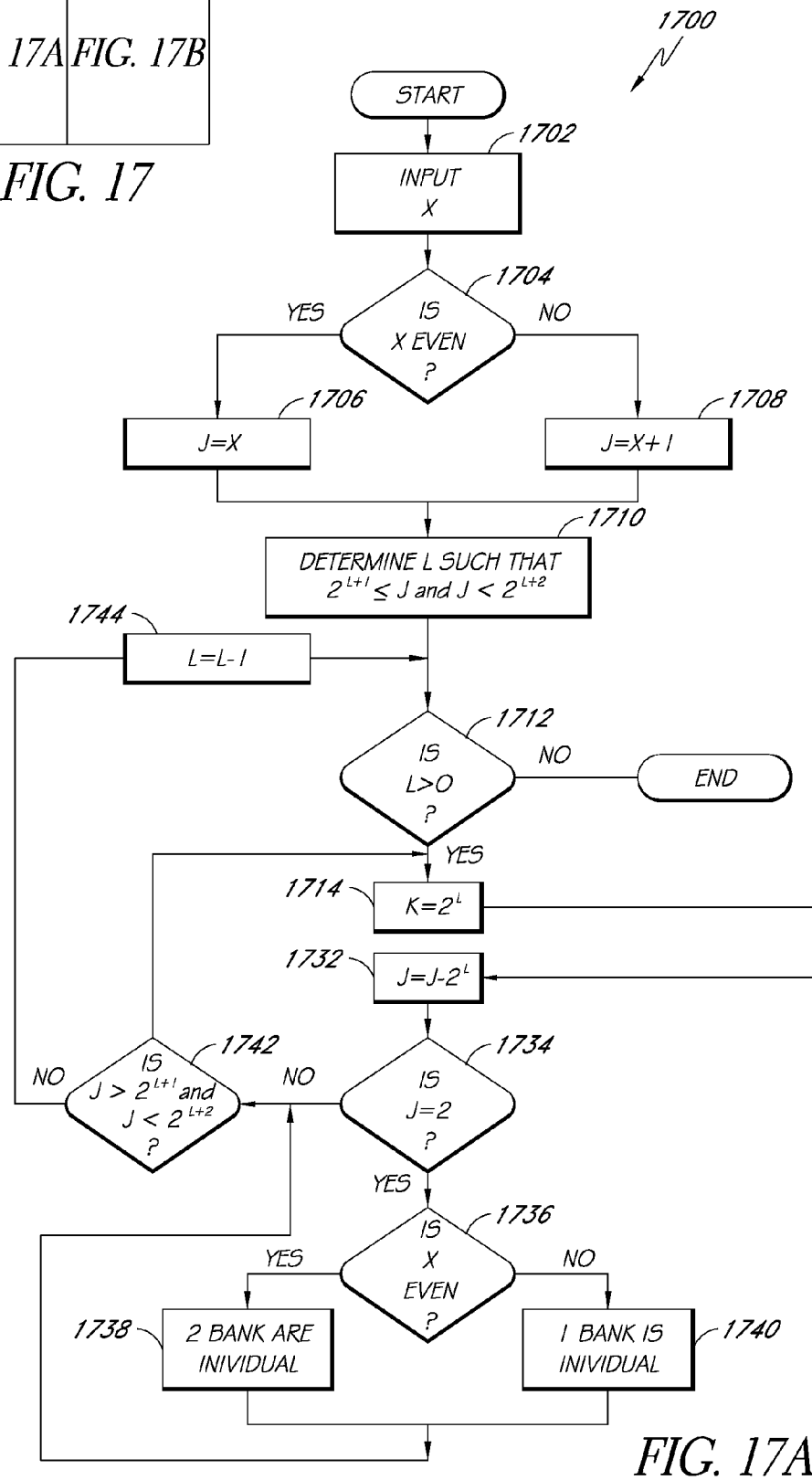
Figure 17B:
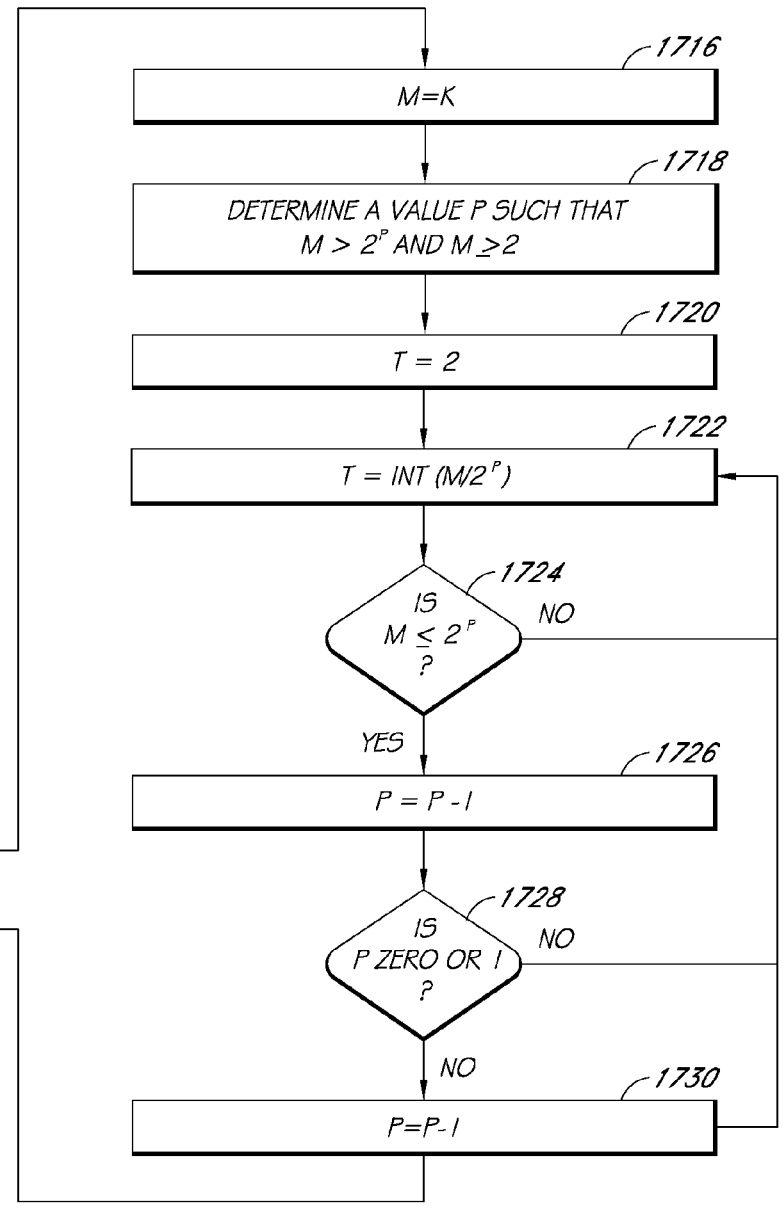

FIGS. 17A and 17B show another embodiment of a process 1700 for determining shared MSBs and LSBs. Process 1700 determines the number of MSBs that can be shared among address banks and the corresponding number of address banks that can share MSBs. Process 1700 also determines the corresponding number of LSBs that can be shared among address banks and the number of address banks that can share LSBs.

At 1702 (see FIG. 17A), an input number X of address banks to be stored is selected. At 1704, it is determined whether X is even. If X is even, then at 1706 a value J is set equal to X. However, if X is odd, J is set to equal to X plus 1 at 1708. The process 1700 proceeds to 1710, where a number L is determined to satisfy the conditions that J is greater than or equal to $2^{L+1}$ and that J is less than $2^{L+2}$. Next, if L is greater than 0 at 1712, the process 1700 sets a number K equal to $2^L$ at 1714. However, if at 1712 L is not greater than zero, the process 1700 ends.

At 1716 (see FIG. 17B), a first value M is set equal to K. The value M changes in certain embodiments for each cycle of the process. At 1718, a value P is determined to satisfy the conditions that $2^P$ is less than M and M is greater than or equal to $2^{P+1}$. At 1720, a value T is set equal to 2. Because T is 2 in this example of the process 1700, in certain embodiments 2 address banks per each cycle of the process 1700 may share MSBs.

At 1722, 2 is subtracted from M. At 1724, the process determines whether M is less than or equal to $2^P$. If M is not less than or equal to $2^P$, the process 1700 returns to 1720. If M is less than or equal to $2^P$, process 1700 continues at 1726. At 1726, 1 is subtracted from P.

The process 1700 continues at 1728 where it is determined whether P is zero or one. If P is not zero or one, process 1700 returns to 1720. If P is zero or one, process 1700 continues at 1730. At 1730, process 1700 determines that M address banks are individual with respect to MSBs. Process 1700 then proceeds to 1732.

At 1732 (see FIG. 17A), the number J is set equal to J minus $2^L$. At 1734, the process 1700 determines if J equals 2. If J equals 2, the process 1700 determines at 1736 whether X is an even number. If X is not even, the process 1700 at 1740 determines that one address bank does not share LSBs or MSBs with another address bank; that is, one address bank is "individual" with respect to LSBs and MSBs. If X is even, the process 1700 determines that two address banks are individual with respect to MSBs and LSBs at 1738. The process then proceeds to 1742.

If J is not equal to 2 at 1734, the process 1700 determines whether J is greater than or equal to $2^{L+1}$ and whether J is less than $2^{L+2}$ at 1742. If the conditions at 1742 are satisfied, the process 1700 loops back to 1714. However, if the conditions at 1742 are not satisfied, the process 1700 proceeds to 1744, sets L equal to L minus 1, and then returns to 1712.

Figure 18:
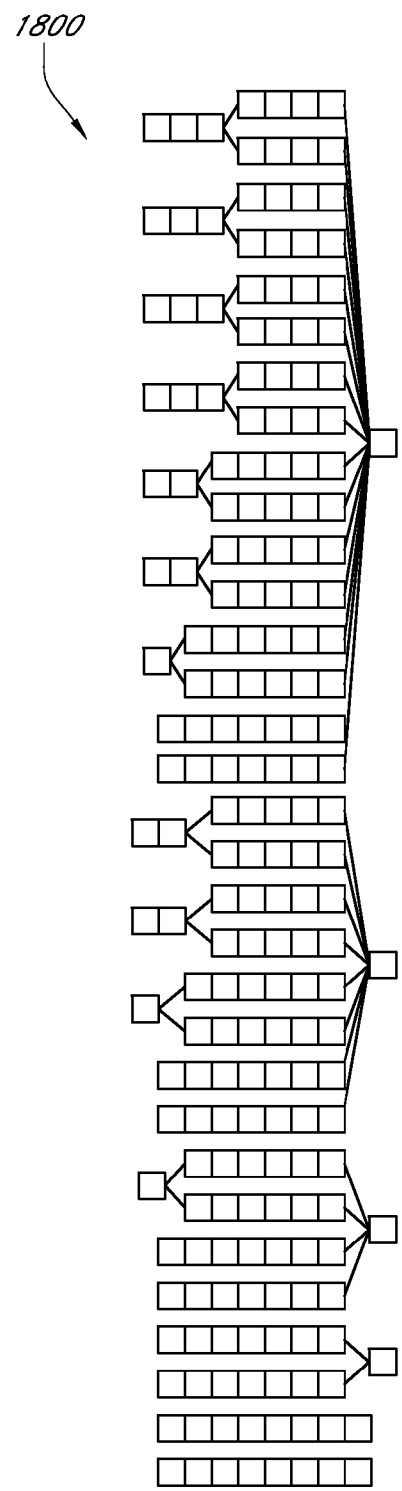
FIG. 18 is an exemplary diagram showing another embodiment of MSB and LSB sharing.

For each cycle of the process 1700, a set of L and K values are determined. For each K value, a set of P and T values are determined. The L or K values and the P or T values may be the same for consecutive cycles. Each set of L and K values indicates how many address banks (K) share what number of LSBs (L). Each set of P and T values indicates how many address banks (T) share what number of MSBs (P). For each iteration of the process 1700, the process 1700 determines a value for K and possibly multiple values of T and P corresponding to that single value of K. Physically, this illustrates that for one group of K address banks that share L LSBs, possibly multiple sets of T address banks share P MSBs. An embodiment of a redundancy structure constructed according to the process 1700 is depicted in FIG. 18.

In one embodiment, a method comprises (a) identifying a number of address banks to store in a memory structure; (b) determining a number K address banks that share L least significant bits; (c) determining a number P most significant bits shared among 2 address banks; (d) decrementing P by 1;

(e) repeating (c) and (d) until P equals zero or 1; (f) determining a number of address banks that share no most significant bits; (g) if a fixed number has been reached, (i) determining a number of address banks that do not share any least significant bits or most significant bits; and (h) repeating (b) through (g) until L is less than or equal to zero.

In one embodiment, a number of fuses saved due to shared most significant bits is given by the equation $\Sigma(K-1)*L+\Sigma(P-1)*T$.

Figure 19A:
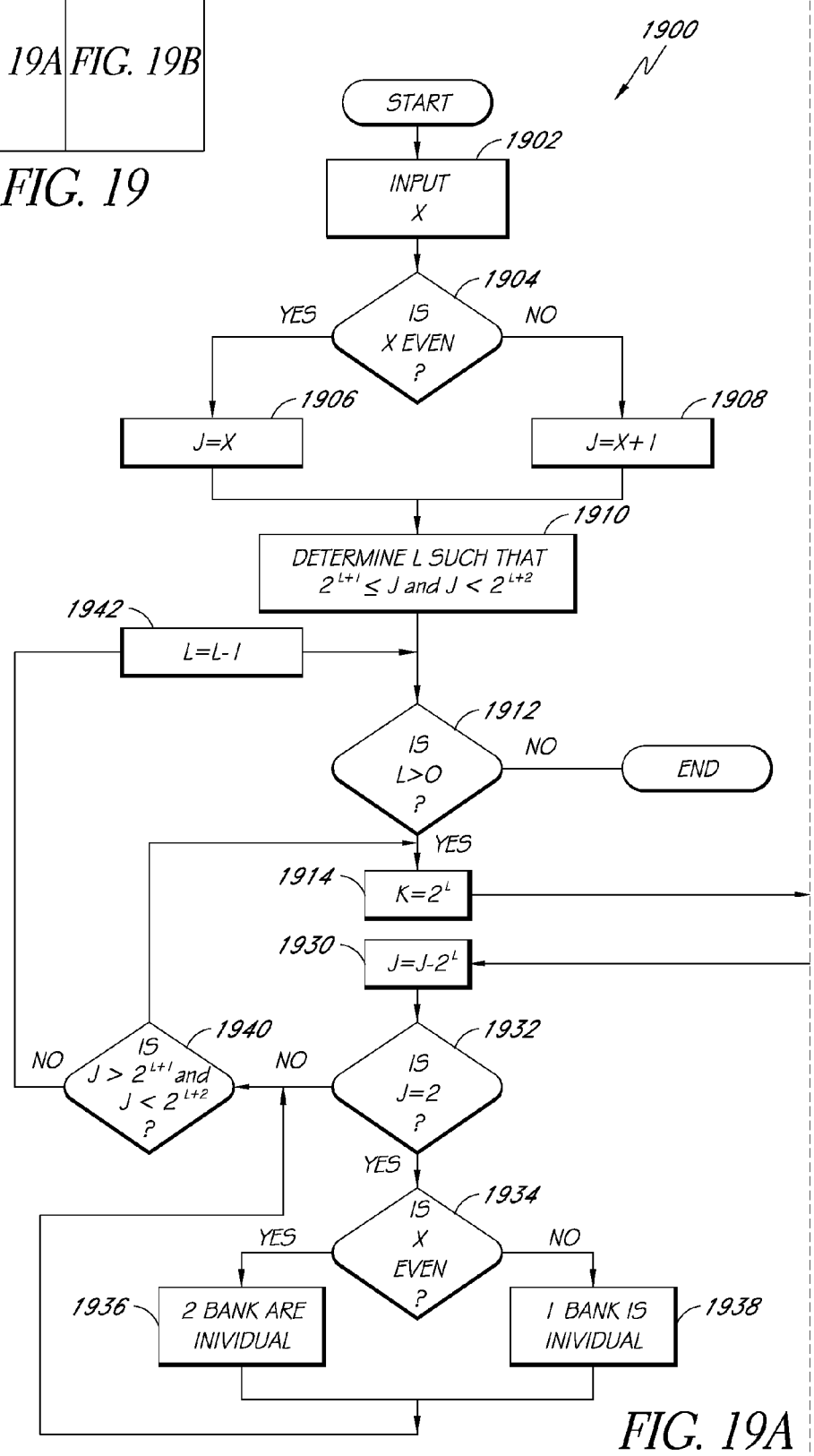
FIG. 19A is an exemplary flowchart showing an embodiment of a process for determining shared MSBs and LSBs.
Figure 19B:
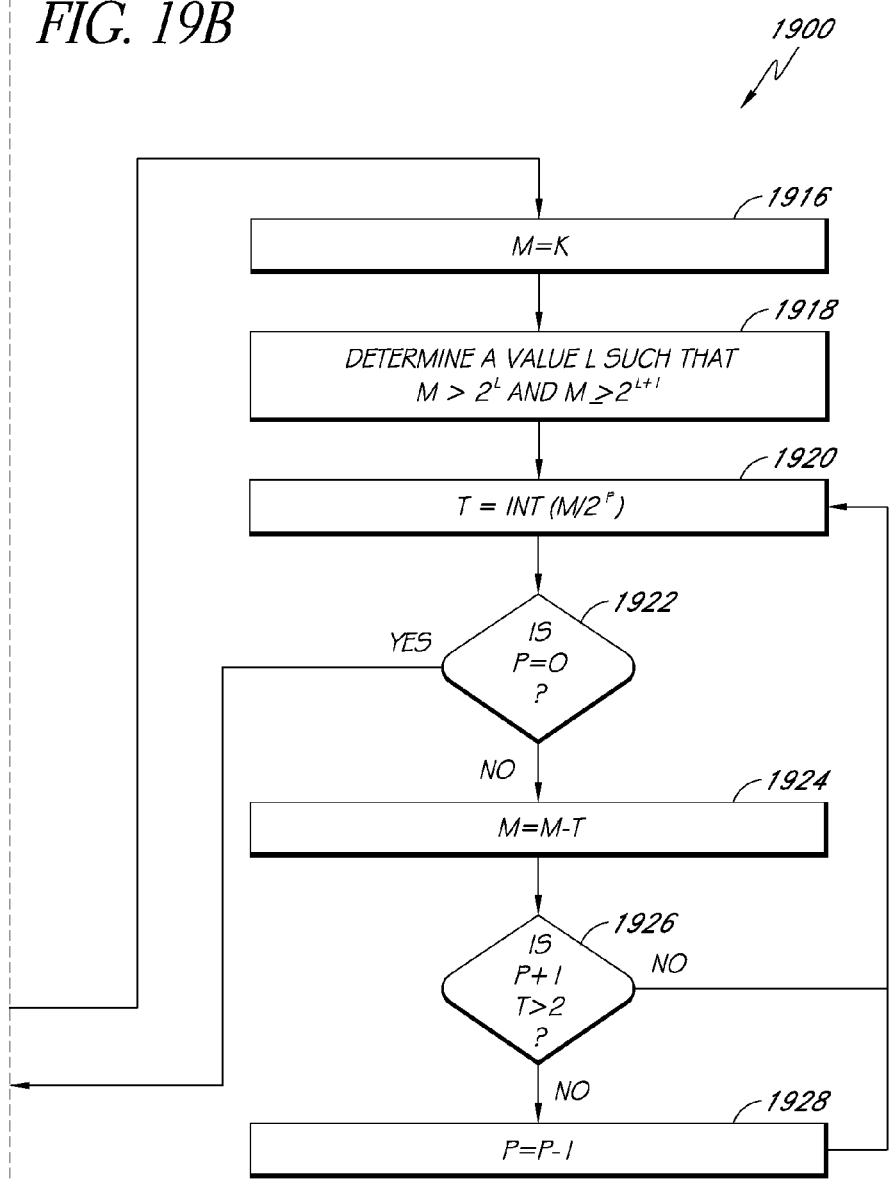
FIG. 19B is an exemplary flowchart showing an embodiment of a process for determining shared MSBs and LSBs.

FIGS. 19A and 19B show another embodiment of a process 1900 for determining shared MSBs and LSBs. Process 1900 determines the number of MSBs that can be shared among address banks and the corresponding number of address banks that can share MSBs. Process 1900 also determines the corresponding number of LSBs that can be shared among address banks and the number of address banks that can share LSBs.

At 1902 (see FIG. 19A), an input number X of address banks to be stored is selected. At 1904, it is determined whether X is even. If X is even, then at 1906 a value J is set equal to X. However, if X is odd, J is set to equal to X plus 1 at 1908. The process 1900 proceeds to 1910, where a number L is determined to satisfy the conditions that J is greater than or equal to $2^{L+1}$ and that J is less than $2^{L+2}$. Next, if L is greater than 0 at 1912, the process 1900 sets a number K equal to $2^L$ at 1914. However, if at 1912 L is not greater than zero, the process 1900 ends.

At 1916 (see FIG. 19B), a value M is set equal to K. The value M changes in certain embodiments for each cycle of the process. At 1918, a value P is determined. P is either zero or a positive whole number (e.g., P is 0, 1, 2, 3 . . . ). P is determined at 1918 by satisfying two conditions: M is be greater than $2^P$, and M is be greater than or equal to $2^{P+1}$.

At 1920, the number of times that M can be divided by $2^P$ is determined. This value is T. Mathematically, T can be expressed as $M/(2^P)$. The integer value of $M/(2^P)$ is taken rather than the entire value of $M/(2^P)$ to ensure that $M/(2^P)$ results in a whole number. For example, if M is 11 and P is 1, $11/2^1$ equals 5.5, but T will be set equal to the integer value of 5.5, which is 5.

At 1922, if P is zero, the process proceeds to 1930. If P is a positive whole number, the process continues to 1924. At 1924, T is subtracted from M. This new value of M will be used in the next cycle of the process.

At 1926, if T is greater than $2^{P+1}$, the process returns to 1920 with P remaining at its current value. If T is not greater than $2^{P+1}$, the process continues to 1928, where P is decreased by 1. The process then returns to 1920.

At 1930 (see FIG. 19A), the number J is set equal to J minus $2^L$. At 1932, the process 1900 determines if J equals 2. If J equals 2, the process 1900 determines at 1934 whether X is an even number. If X is not even, the process 1900 at 1938 determines that one address bank does not share LSBs or MSBs with another address bank; that is, one address bank is "individual" with respect to LSBs and MSBs. If X is even, the process 1900 determines that two address banks are individual with respect to MSBs and LSBs at 1936. The process then proceeds to 1940.

If J is not equal to 2 at 1932, the process 1900 determines whether J is greater than or equal to $2^{L+1}$ and whether J is less than $2^{L+2}$ at 1940. If the conditions at 1940 are satisfied, the process 1900 loops back to 1914. However, if the conditions at 1940 are not satisfied, the process 1900 proceeds to 1942, sets L equal to L minus 1, and then returns to 1912.

Figure 20:
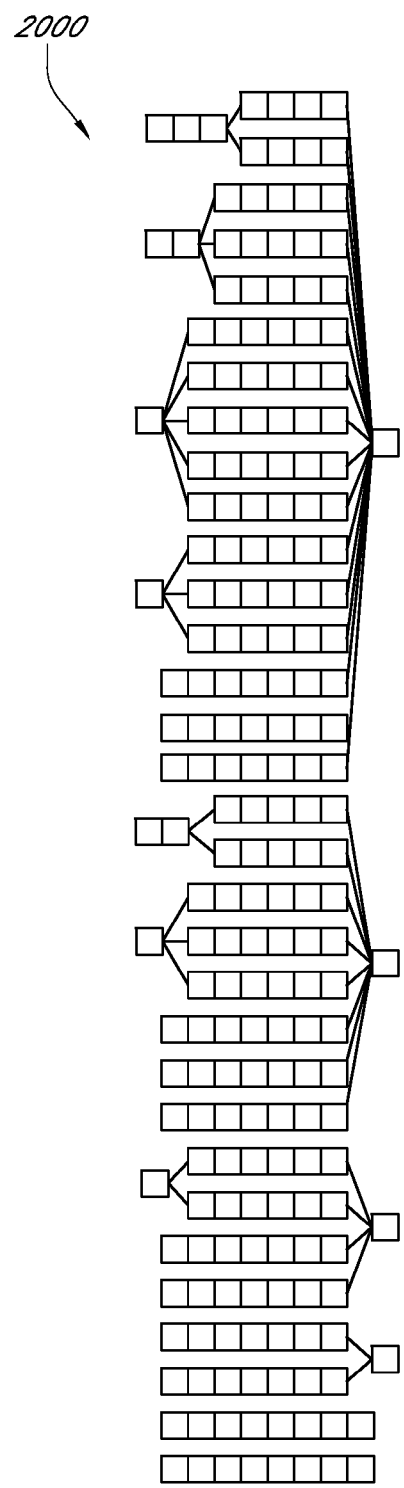
FIG. 20 is an exemplary diagram showing another embodiment of MSB and LSB sharing.

For each cycle of the process 1900, a set of L and K values are determined. For each K value, a set of P and T values are determined. The L or K values and the P or T values may be the same for consecutive cycles. Each set of L and K values indicates how many address banks (K) share what number of LSBs (L). Each set of P and T values indicates how many address banks (T) share what number of MSBs (P). For each iteration of the process 1900, the process 1900 determines a value for K and possibly multiple values of T and P corresponding to that single value of K. Physically, this illustrates that for one group of K address banks that share L LSBs, possibly multiple sets of T address banks share P MSBs. An embodiment of a redundancy structure constructed according to the process 1900 is depicted in FIG. 20.

In one embodiment, a method comprises (a) identifying a number of address banks to store in a memory structure; (b) determining a number K address banks that share L least significant bits; (c) determining a number T address banks that share P most significant bits; (d) if T is less than or equal to $2^{P+1}$, decrementing P by 1; (e) repeating (c) and (d) until P equals zero; (f) if a fixed number has been reached, (i) determining a number of address banks that do not share any least significant bits or most significant bits; and (g) repeating (b) through (f) until L is less than or equal to zero.

In one embodiment, a number of fuses saved due to shared most significant bits is given by the equation $\Sigma(K-1)*L+\Sigma(P-1)*T$.

Figure 21:
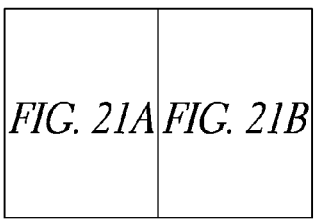
FIG. 21A is an exemplary flowchart showing an embodiment of a process for determining shared MSBs and LSBs.
FIG. 21B is an exemplary flowchart showing an embodiment of a process for determining shared MSBs and LSBs.
Figure 21A:
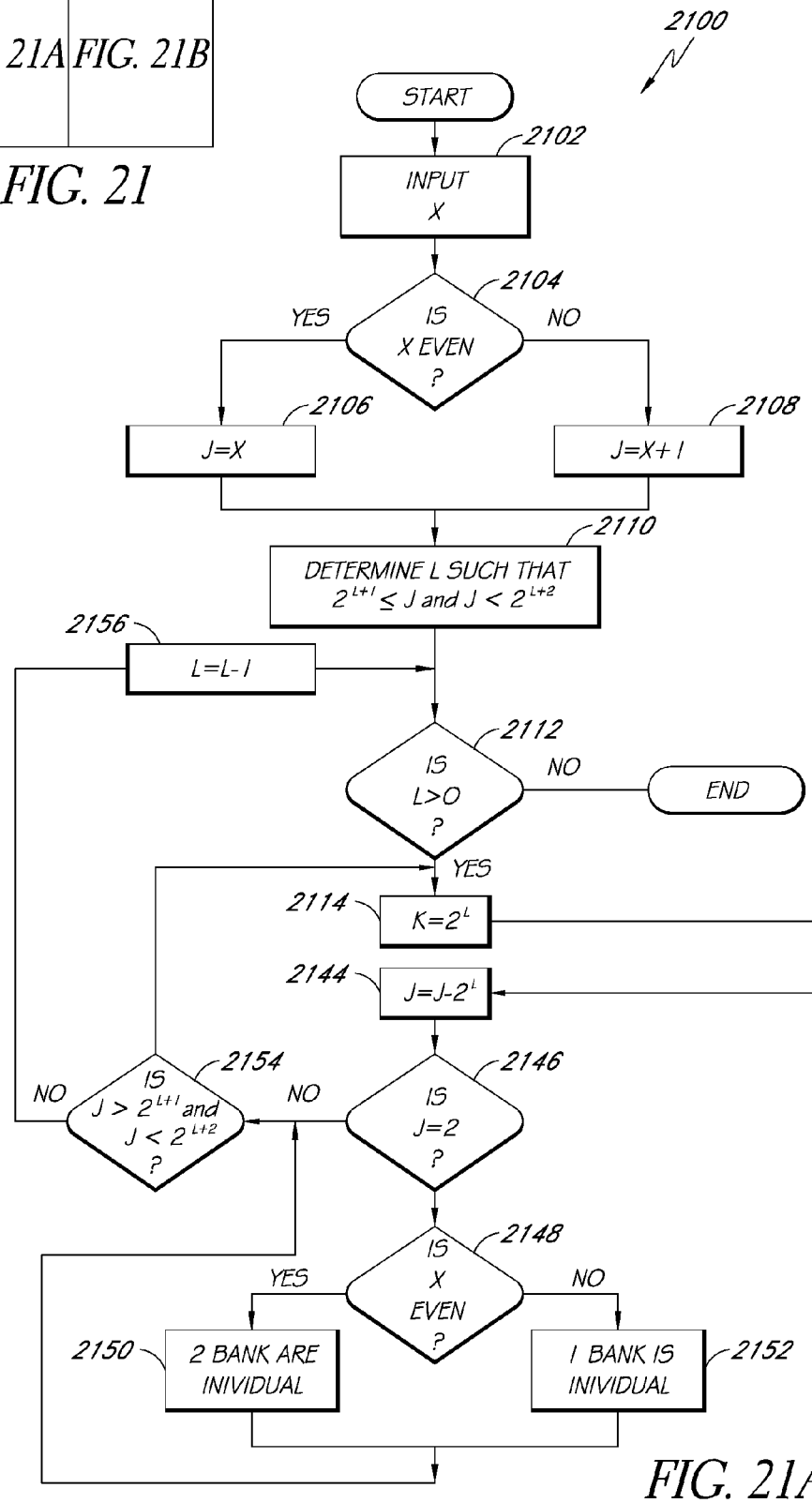
Figure 21B:
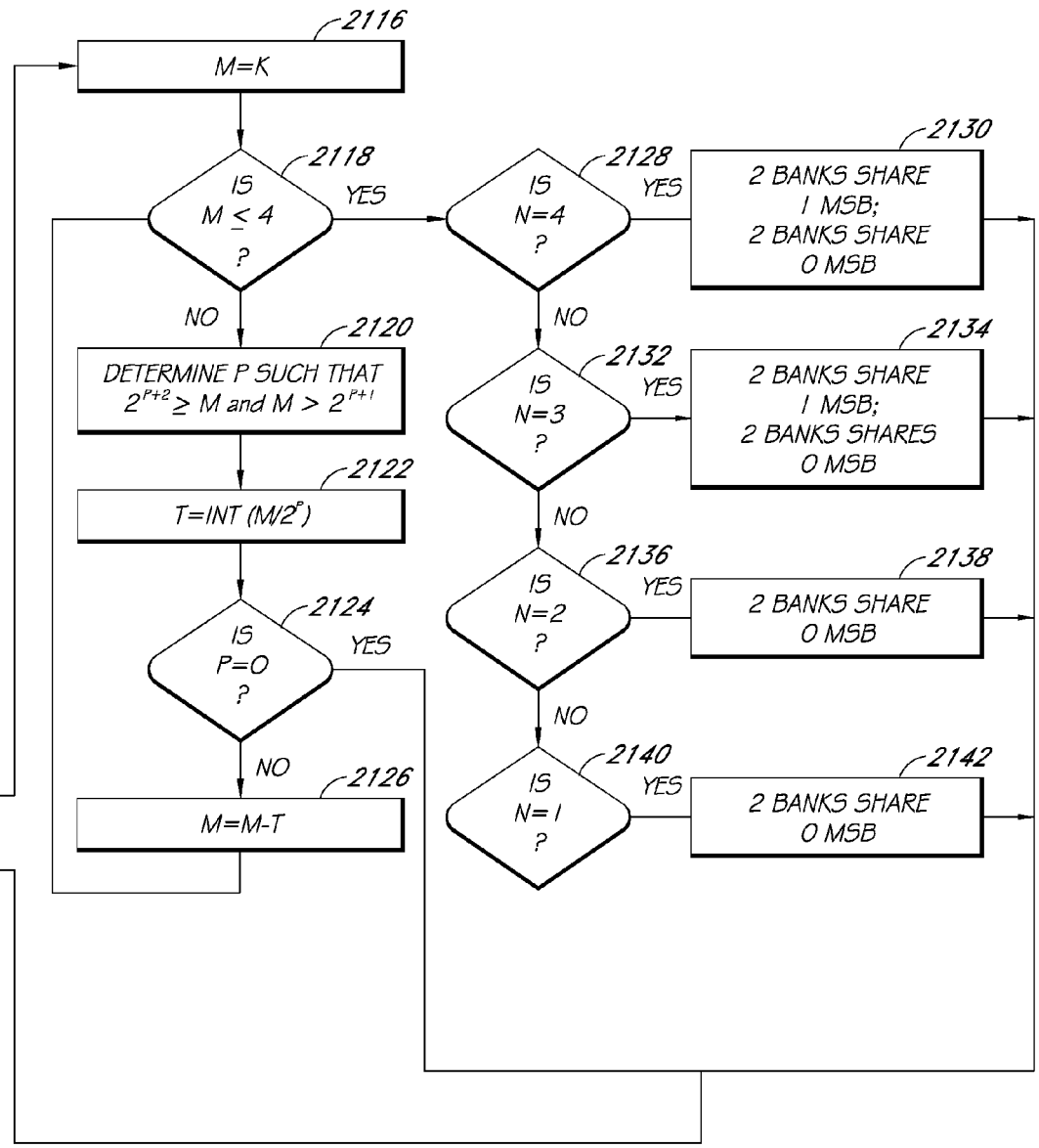

FIGS. 21A and 21B show another embodiment of a process 2100 for determining shared MSBs and LSBs. Process 2100 determines the number of MSBs that can be shared among address banks and the corresponding number of address banks that can share MSBs. Process 2100 also determines the corresponding number of LSBs that can be shared among address banks and the number of address banks that can share LSBs.

At 2102 (see FIG. 21A), an input number X of address banks to be stored is selected. At 2104, it is determined whether X is even. If X is even, then at 2106 a value J is set equal to X. However, if X is odd, J is set to equal to X plus 1 at 2108. The process 2100 proceeds to 2110, where a number L is determined to satisfy the conditions that J is greater than or equal to $2^{L+1}$ and that J is less than $2^{L+2}$. Next, if L is greater than 0 at 2112, the process 2100 sets a number K equal to $2^L$ at 2114. However, if at 2112 L is not greater than zero, the process 2100 ends.

At 2116 (see FIG. 21B), a value M is set equal to K. The value M changes in certain embodiments for each cycle of the process 2100. At 2118, the value of M is checked. If M is less than or equal to 4, the process 2100 continues at 2128. If M is not less than or equal to 4, the process 2100 continues at 2120. At 2120, a value P is determined by satisfying the conditions that $2^{P+1}$ is less than M and M is less than or equal to $2^{P+2}$.

At 2122, the number of times M can be divided by $2^P$ is determined. This value is T. Mathematically, T can be expressed as $M/(2^P)$. T is the number of address banks that share P MSBs. At 2124, the P value is checked. If P is equal to zero, process 2100 proceeds to 2144. If P is not equal to zero, process 2100 continues at 2126. At 2126, T is subtracted from M. The result will be M for the next cycle. After this determination, process 2100 returns to 2118.

As stated previously, if M is less than or equal to 4 at 2118, process 2100 continues at 2128. If M is 4 at 2128, process 2100 continues at 2130 where process 2100 determines that two address banks share one MSB and that two address banks are individual with respect to MSBs. After this determination, process 2100 proceeds to 2144. If M is not 4 at 2128, process 2100 continues at 2132.

At 2132, process 2100 determines whether M is 3. If M is 3, process 2100 continues at 2134 where process 2100 determines that two address banks share one MSB and that one address bank is individual with respect to MSBs. After this determination, process 2100 proceeds to 2144. If M is not 3 at 2132, process 2100 continues at 2136.

At 2136, process 2100 determines whether M is 2. If M is 2, process 2100 continues at 2138 where process 2100 determines that two address banks are individual with respect to MSBs. After this determination, process 2100 proceeds to 2144. If M is not 2 at 2136, process 2100 continues at 2140. At 2140, process 2100 determines whether M is 1. If M is 1, process 2100 continues at 2142 where process 2100 determines that one bank is individual with respect to MSBs. After this determination, process 2100 proceeds to 2144.

At 2144 (see FIG. 21A), the number J is set equal to J minus $2^L$. At 2146, the process 2100 determines if J equals 2. If J equals 2, the process 2100 determines at 2148 whether X is an even number. If X is not even, the process 2100 at 2152 determines that one address bank does not share LSBs or MSBs with another address bank; that is, one address bank is "individual" with respect to LSBs and MSBs. If X is even, the process 2100 determines that two address banks are individual with respect to MSBs and LSBs at 2150. The process then proceeds to 2154.

If J is not equal to 2 at 2146, the process 2100 determines whether J is greater than or equal to $2^{L+1}$ and whether J is less than $2^{L+2}$ at 2154. If the conditions at 2154 are satisfied, the process 2100 loops back to 2114. However, if the conditions at 2154 are not satisfied, the process 2100 proceeds to 2156, sets L equal to L minus 1, and then returns to 2112.

Figure 22:
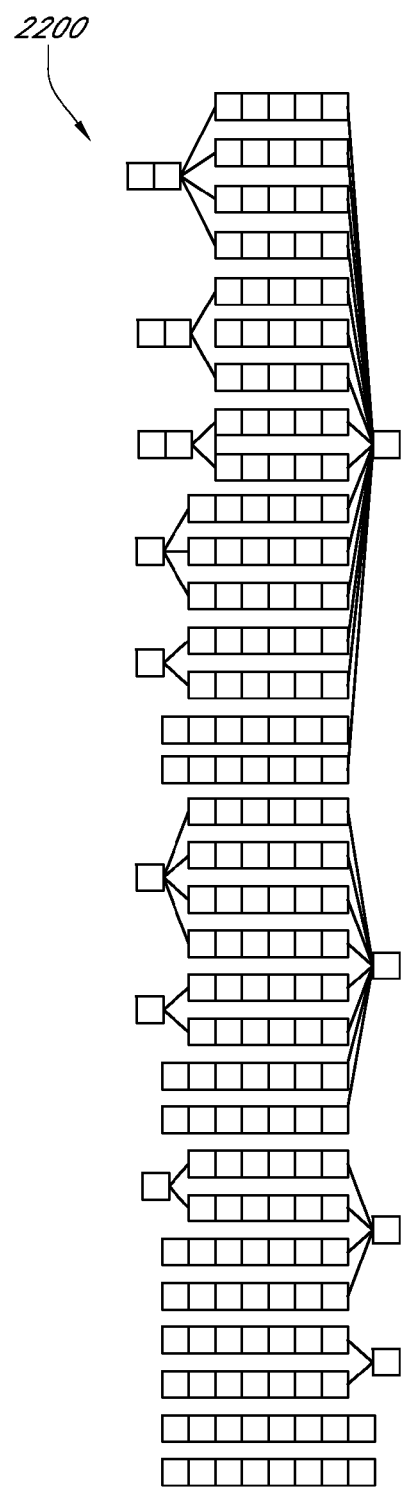
FIG. 22 is an exemplary diagram showing another embodiment of MSB and LSB sharing.

For each cycle of the process 2100, a set of L and K values are determined. For each K value, a set of P and T values are determined. The L or K values and the P or T values may be the same for consecutive cycles. Each set of L and K values indicates how many address banks (K) share what number of LSBs (L). Each set of P and T values indicates how many address banks (T) share what number of MSBs (P). For each iteration of the process 2100, the process 2100 determines a value for K and possibly multiple values of T and P corresponding to that single value of K. Physically, this illustrates that for one group of K address banks that share L LSBs, possibly multiple sets of T address banks share P MSBs. An embodiment of a redundancy structure constructed according to the process 2100 is depicted in FIG. 22.

In one embodiment, a method comprises (a) identifying a number of address banks to store in a memory structure, (b) determining a number K address banks that share L least significant bits, (c) setting a value M equal to K, (d) if M is greater than 4, determining a number T address banks that share P most significant bits, (e) setting M equal to M minus T, (f) repeating (d) and (e) until P equals zero or until M is less than or equal to 4, (g) if M is less than or equal to 4, (i) if M equals 4, determining that 2 address banks share 1 most significant bit and that 2 address banks share no most significant bits, (ii) if M equals 3, determining that 2 address banks share 1 most significant bit and that 1 address bank shares no most significant bits, (iii) if M equals 2, determining that 2 address banks share no most significant bits, (iv) if M equals 1, determining that 1 address bank shares no most significant bits, (h) if a fixed number has been reached, (i) determining a number of address banks that do not share any least significant bits or most significant bits, and (i) repeating (b) through (h) until L is less than or equal to zero.

In one embodiment, a number of fuses saved due to shared most significant bits is given by the equation $\Sigma(K-1)*L + \Sigma(P-1)*T$.

Figure 23:
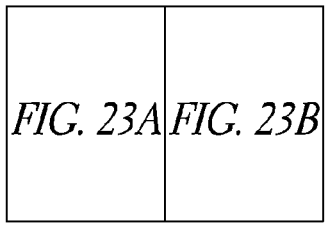
FIG. 23A is an exemplary flowchart showing an embodiment of a process for determining shared MSBs and LSBs.
FIG. 23B is an exemplary flowchart showing an embodiment of a process for determining shared MSBs and LSBs.
Figure 23A:
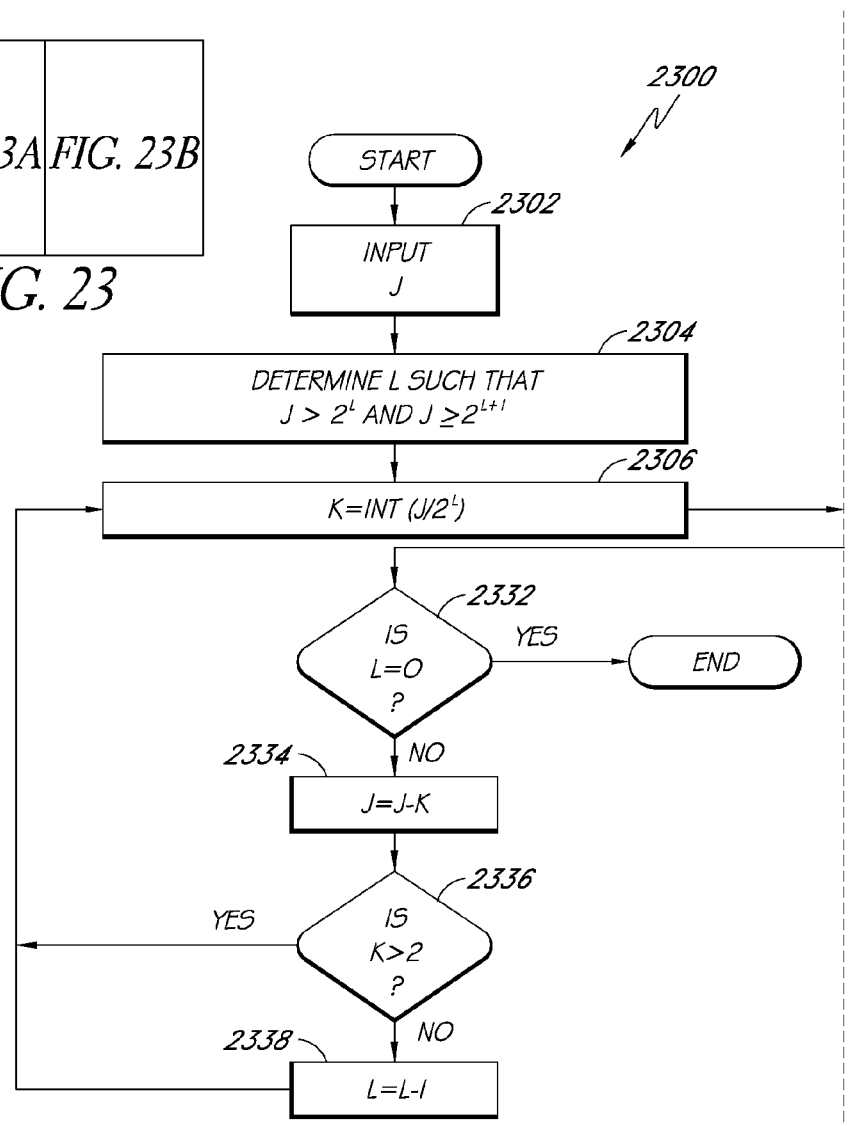
Figure 23B:
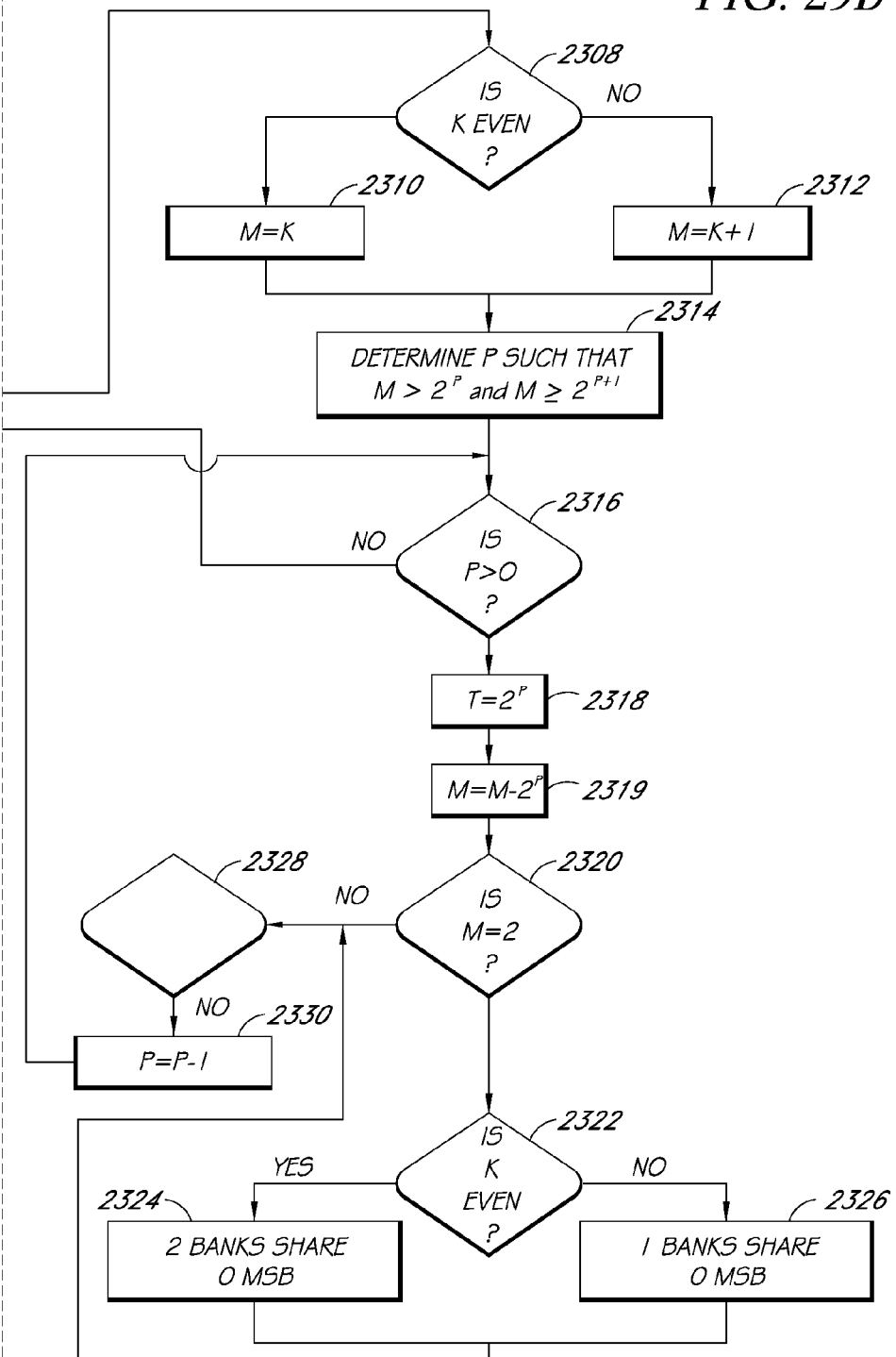

FIGS. 23A and 23B show another embodiment of a process 2300 for determining shared MSBs and LSBs. Process 2300 determines the number of MSBs that can be shared among address banks and the corresponding number of address banks that can share MSBs. Process 2300 also determines the corresponding number of LSBs that can be shared among address banks and the number of address banks that can share LSBs.

At 2302 (see FIG. 23A), an input number J of address banks to be stored is selected. The value J changes in certain embodiments for each cycle of the process. At 2304, a value L is determined. L is either zero or a positive whole number (e.g., L is 0, 1, 2, 3 . . . ). L is determined at 2304 by satisfying two conditions: J is be greater than $2^L$, and J is be greater than or equal to $2^{L+1}$.

At 2306, the number of times that J can be divided by $2^L$ is determined. This value is K. Mathematically, K can be expressed as $J/(2^L)$. The integer value of $J/(2^L)$ is taken rather than the entire value of $J/(2^L)$ to ensure that $J/(2^L)$ results in a whole number. For example, if J is 11 and L is 1, $11/2^1$ equals 5.5, but K will be set equal to the integer value of 5.5, which is 5. The process continues to 2308.

At 2308 (see FIG. 23B), it is determined whether K is even. If K is even, then at 2310 a value M is set equal to K. However, if K is odd, M is set to equal to M plus 1 at 2312. The process 2300 proceeds to 2314, where a number L is determined to satisfy the conditions that M is greater than or equal to $2^{L+1}$ and that M is less than $2^{L+2}$. Next, if L is greater than 0 at 2316, the process 2300 sets a number T equal to $2^P$ at 2318. However, if at 2316 P is not greater than zero, the process 2300 proceeds to 2332.

At 2319, the number M is set equal to M minus $2^P$. At 2320, the process 2300 determines if M equals 2. If M equals 2, the process 2300 determines at 2322 whether K is an even number. If K is not even, the process 2300 at 2326 determines that one address bank does not share MSBs with another address bank; that is, one address bank is "individual" with respect to MSBs. If K is even, the process 2300 determines that two address banks are individual at 2324. The process 2300 then proceeds to 2328.

If M is not equal to 2 at 2320, the process 2300 determines whether M is greater than or equal to $2^{P+1}$ and whether M is less than $2^{P+2}$ at 2328. If the conditions at 2328 are satisfied, the process 2300 loops back to 2318. However, if the conditions at 2328 are not satisfied, the process 2300 proceeds to 2330, sets P equal to P minus 1, and then returns to 2316.

At 2332 (see FIG. 23A), if L is zero, the process 2300 ends. If L is a positive whole number, the process 2300 continues at 2334, where K is subtracted from J. This new value of J will be used in the next cycle of the process. At 2336, if K is greater than $2^{L+1}$, the process returns to 2306 with L remaining at its current value. If K is not greater than $2^{L+1}$, the process continues to 2338, where L is decreased by 1. The process then returns to 2306.

Figure 24:
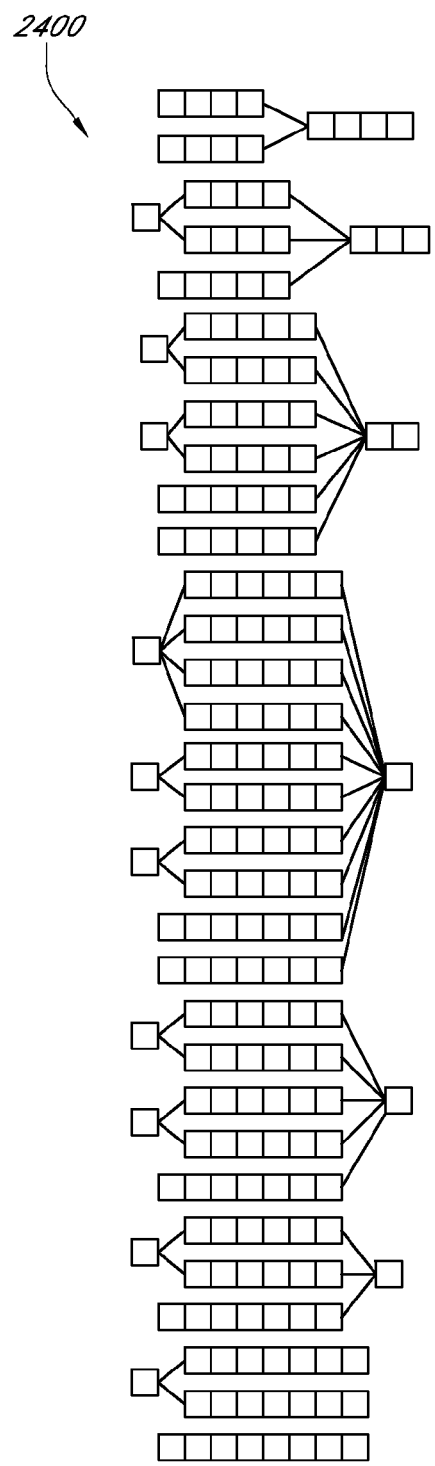
FIG. 24 is an exemplary diagram showing another embodiment of MSB and LSB sharing.

For each cycle of the process 2300, a set of L and K values are determined. For each K value, a set of P and T values are determined. The L or K values and the P or T values may be the same for consecutive cycles. Each set of L and K values indicates how many address banks (K) share what number of LSBs (L). Each set of P and T values indicates how many address banks (T) share what number of MSBs (P). For each iteration of the process 2300, the process 2300 determines a value for K and possibly multiple values of T and P corresponding to that single value of K. Physically, this illustrates that for one group of K address banks that share L LSBs, possibly multiple sets of T address banks share P MSBs. An embodiment of a redundancy structure constructed according to the process 2300 is depicted in FIG. 24.

In one embodiment, a method comprises (a) identifying a number of address banks to store in a memory structure, (b)

determining a number K address banks that share L least significant bits, (c) determining a number T address banks that share P most significant bits, (d) if a fixed number has been reached, (i) determining a number of address banks that do not share any most significant bits, (e) repeating (d) and (e) until P is less than or equal to zero, (f) if K is less than or equal to $2^{L+1}$, decrementing L by 1, and (g) repeating (b) through (f) until L equals zero.

In one embodiment, a number of fuses saved due to shared most significant bits is given by the equation $\Sigma(K-1)*L+\Sigma(P-1)*T$.

Figure 25A:
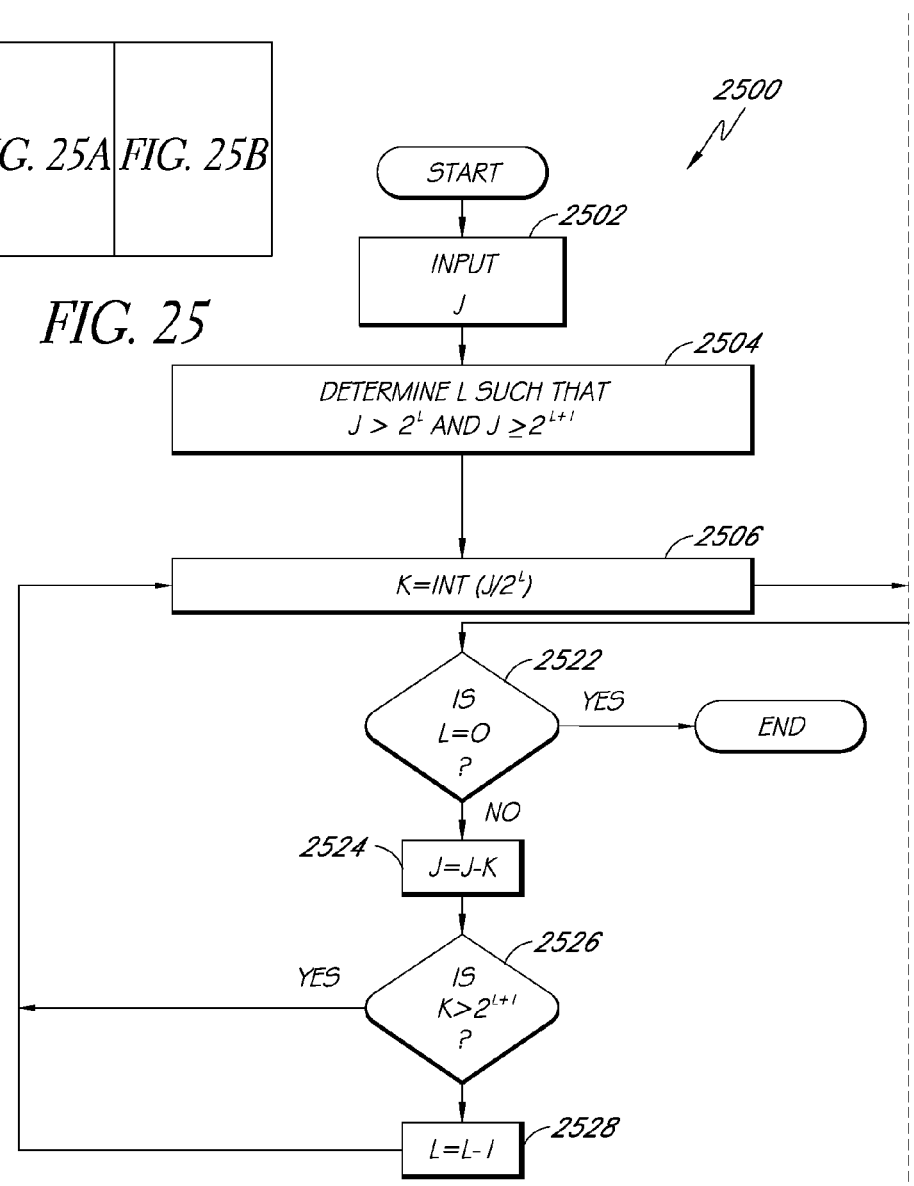
FIG. 25A is an exemplary flowchart showing an embodiment of a process for determining shared MSBs and LSBs.
Figure 25B:
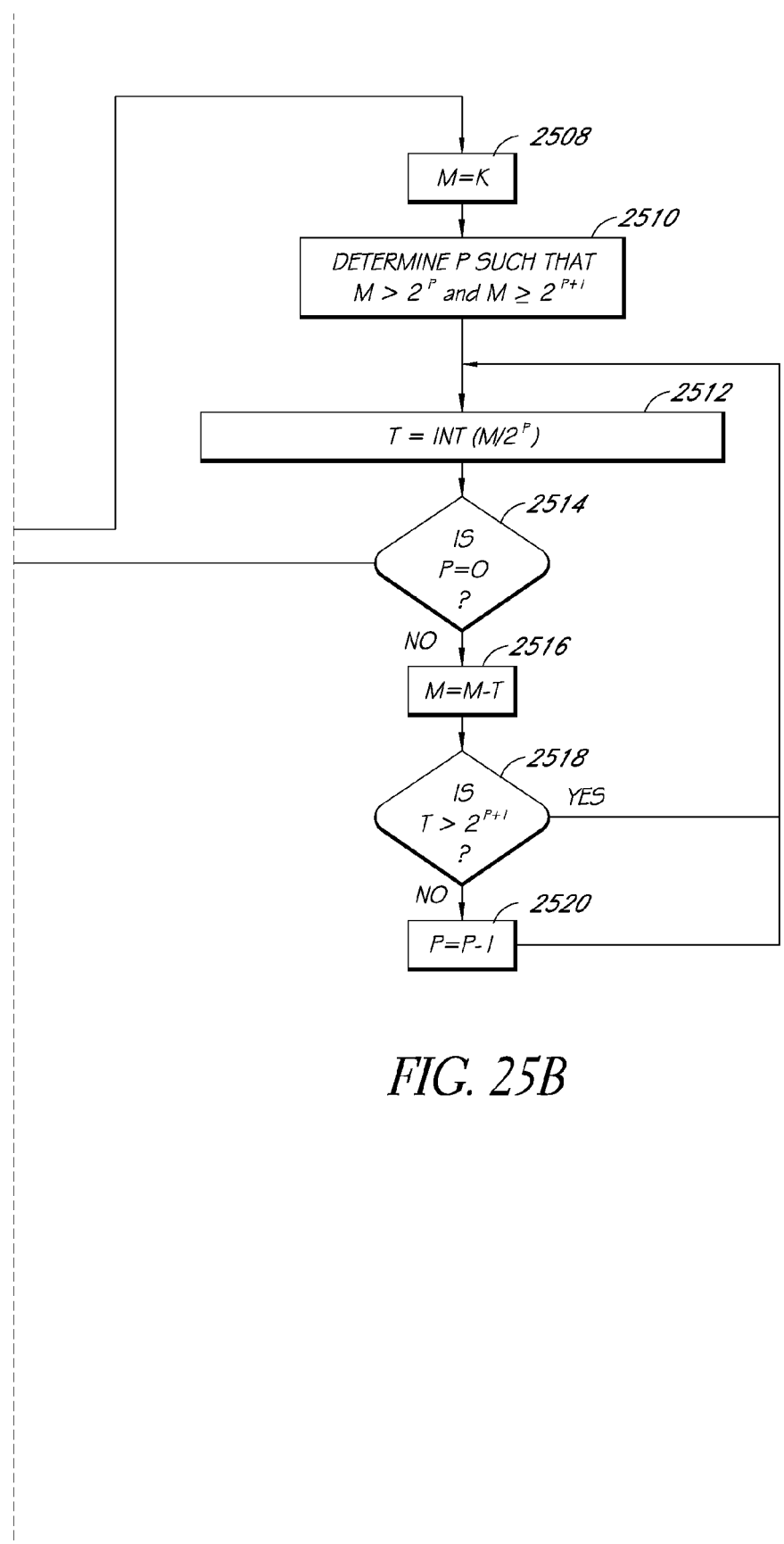
FIG. 25B is an exemplary flowchart showing an embodiment of a process for determining shared MSBs and LSBs.

FIGS. 25A and 25B show another embodiment of a process 2500 for determining shared MSBs and LSBs. Process 2500 determines the number of MSBs that can be shared among address banks and the corresponding number of address banks that can share MSBs. Process 2500 also determines the corresponding number of LSBs that can be shared among address banks and the number of address banks that can share LSBs.

At 2502 (see FIG. 25A), an input number J of address banks to be stored is selected. The value J changes in certain embodiments for each cycle of the process. At 2504, a value L is determined. L is either zero or a positive whole number (e.g., L is 0, 1, 2, 3 . . . ). L is determined at 2504 by satisfying two conditions: J is be greater than $2^L$, and J is be greater than or equal to $2^{L+1}$.

At 2506, the number of times that J can be divided by $2^L$ is determined. This value is K. Mathematically, K can be expressed as $J/(2^L)$. The integer value of $J/(2^L)$ is taken rather than the entire value of $J/(2^L)$ to ensure that $J/(2^L)$ results in a whole number. For example, if J is 11 and L is 1, $11/2^1$ equals 5.5, but K will be set equal to the integer value of 5.5, which is 5. The process then continues to 2508.

At 2508 (see FIG. 25B), a value M is set equal to K. The value M changes in certain embodiments for each cycle of the process. At 2510, a value P is determined. P is either zero or a positive whole number (e.g., P is 0, 1, 2, 3 . . . ). P is determined at 2510 by satisfying two conditions: M is be greater than $2^P$, and M is be greater than or equal to $2^{P+1}$.

At 2512, the number of times that M can be divided by $2^P$ is determined. This value is T. Mathematically, T can be expressed as $M/(2^P)$. The integer value of $M/(2^P)$ is taken rather than the entire value of $M/(2^P)$ to ensure that $M/(2^P)$ results in a whole number. For example, if M is 11 and P is 1, $11/2^1$ equals 5.5, but T will be set equal to the integer value of 5.5, which is 5.

At 2514, if P is zero, the process proceeds to 2522. If P is a positive whole number, the process continues to 2516. At 2516, T is subtracted from M. This new value of M will be used in the next cycle of the process.

At 2518, if T is greater than $2^{P+1}$, the process returns to 2512 with P remaining at its current value. If T is not greater than $2^{P+1}$, the process continues to 2520, where P is decreased by 1. The process then returns to 2512.

At 2522 (see FIG. 25A), if L is zero, the process 2500 ends. If L is a positive whole number, the process 2500 proceeds to 2524, where K is subtracted from J. This new value of J will be used in the next cycle of the process. At 2526, if K is greater than $2^{L+1}$, the process returns to 2506 with L remaining at its current value. If K is not greater than $2^{L+1}$, the process continues to 2528, where L is decreased by 1. The process then returns to 2506.

Figure 26:
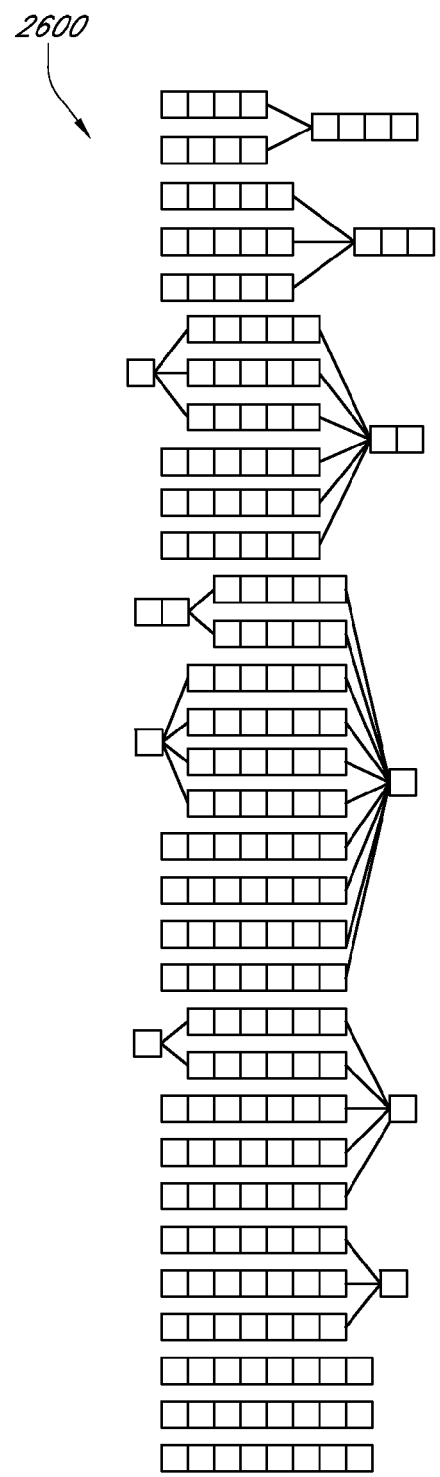
FIG. 26 is an exemplary diagram showing another embodiment of MSB and LSB sharing.

For each cycle of the process 2500, a set of L and K values are determined. For each K value, a set of P and T values are determined. The L or K values and the P or T values may be the same for consecutive cycles. Each set of L and K values indicates how many address banks (K) share what number of LSBs (L). Each set of P and T values indicates how many address banks (T) share what number of MSBs (P). For each iteration of the process 2500, the process 2500 determines a value for K and possibly multiple values of T and P corresponding to that single value of K. Physically, this illustrates that for one group of K address banks that share L LSBs, possibly multiple sets of T address banks share P MSBs. An embodiment of a redundancy structure constructed according to the process 2500 is depicted in FIG. 26.

In one embodiment, a method comprises (a) identifying a number of address banks to store in a memory structure, (b) determining a number K address banks that share L least significant bits, (c) determining a number T address banks that share P most significant bits, (d) if T is less than or equal to $2^{P+1}$, decrementing P by 1, (e) repeating (c) and (d) until P is equal to zero, (f) if K is less than or equal to $2^{L+1}$, decrementing L by 1, and (g) repeating (b) through (f) until L equals zero.

In one embodiment, a number of fuses saved due to shared most significant bits is given by the equation $\Sigma(K-1)*L+\Sigma(P-1)*T$.

Figure 27A:
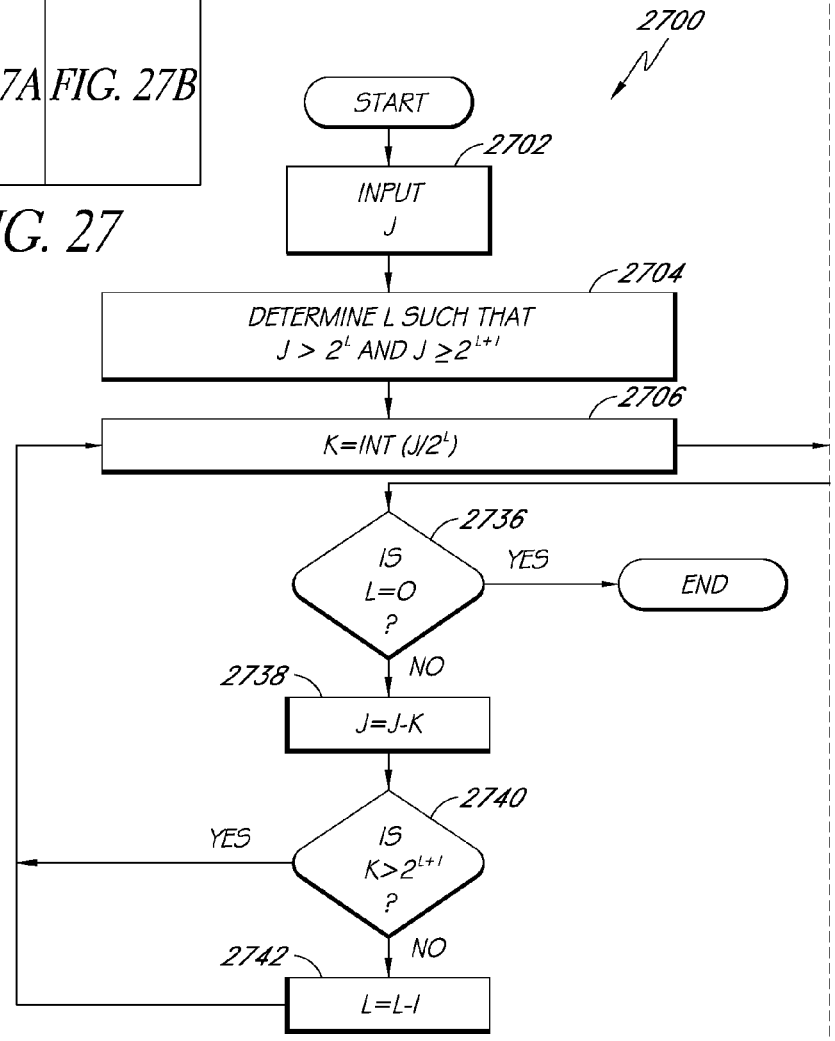
FIG. 27A is an exemplary flowchart showing an embodiment of a process for determining shared MSBs and LSBs.
Figure 27B:
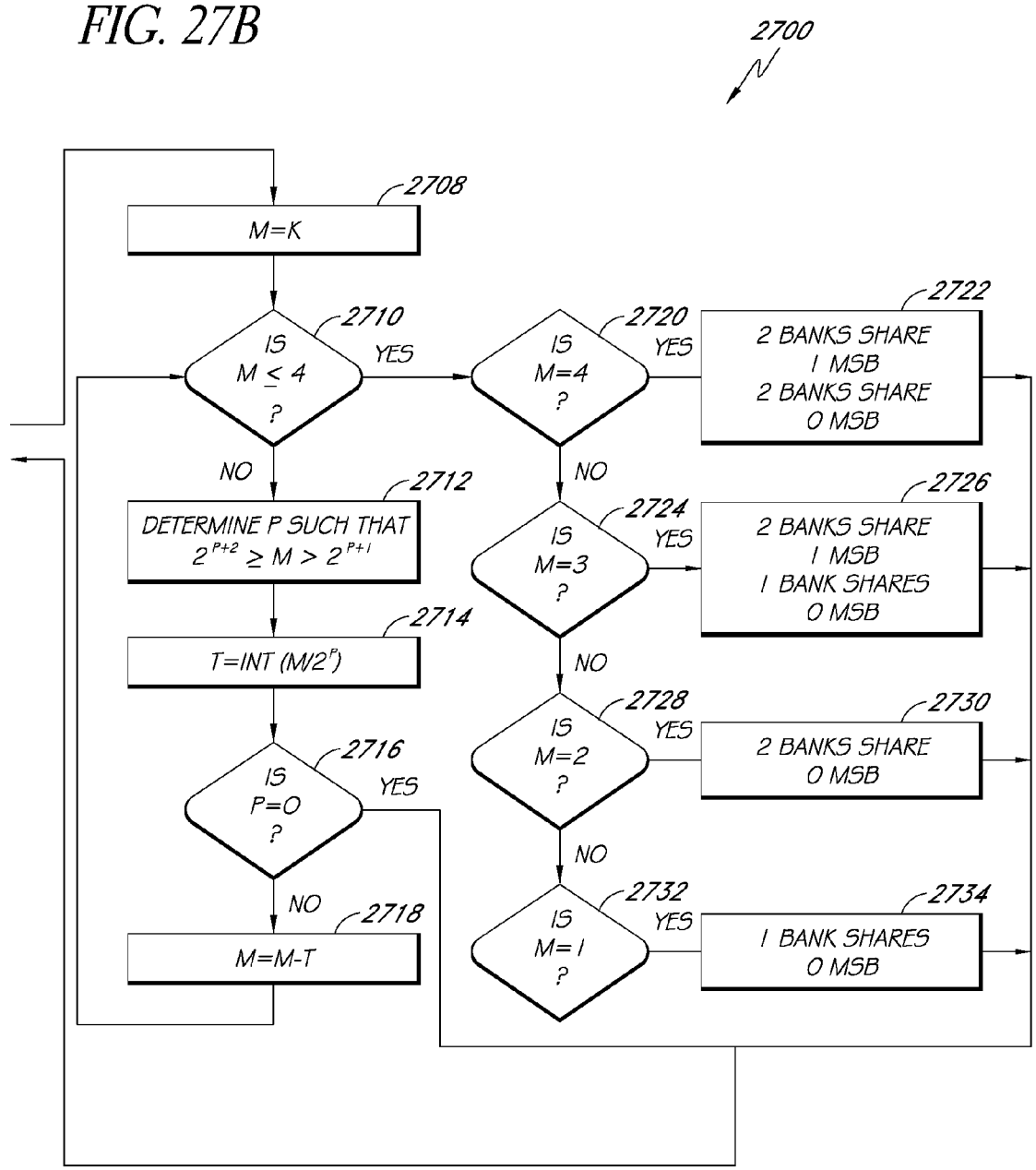
FIG. 27B is an exemplary flowchart showing an embodiment of a process for determining shared MSBs and LSBs.

FIGS. 27A and 27B show another embodiment of a process 2700 for determining shared MSBs and LSBs. Process 2700 determines the number of MSBs that can be shared among address banks and the corresponding number of address banks that can share MSBs. Process 2700 also determines the corresponding number of LSBs that can be shared among address banks and the number of address banks that can share LSBs.

At 2702 (see FIG. 27A), an input number J of address banks to be stored is selected. The value J changes in certain embodiments for each cycle of the process. At 2704, a value L is determined. L is either zero or a positive whole number (e.g., L is 0, 1, 2, 3 . . . ). L is determined at 2704 by satisfying two conditions: J is be greater than $2^L$, and J is be greater than or equal to $2^{L+1}$.

At 2706, the number of times that J can be divided by $2^L$ is determined. This value is K. Mathematically, K can be expressed as $J/(2^L)$. The integer value of $J/(2^L)$ is taken rather than the entire value of $J/(2^L)$ to ensure that $J/(2^L)$ results in a whole number. For example, if J is 11 and L is 1, $11/2^1$ equals 5.5, but K will be set equal to the integer value of 5.5, which is 5. The process then continues to 2708.

At 2708 (see FIG. 27B), a value M is set equal to K. The value M changes in certain embodiments for each cycle of the process 2700. At 2710, the value of M is checked. If M is less than or equal to 4, the process 2700 continues at 2720. If M is not less than or equal to 4, the process 2700 continues at 2712. At 2712, a value P is determined by satisfying the conditions that $2^{P+1}$ is less than M and M is less than or equal to $2^{P+2}$.

At 2714, the number of times M can be divided by $2^P$ is determined. This value is T. Mathematically, T can be expressed as $M/(2^P)$. T is the number of address banks that share P MSBs. At 2716, the P value is checked. If P is equal to zero, process 2700 proceeds to 2736. If P is not equal to zero, process 2700 continues at 2718. At 2718, T is subtracted from M. The result will be M for the next cycle. After this determination, process 2700 returns to 2710.

As stated previously, if M is less than or equal to 4 at 2710, process 2700 continues at 2720. If M is 4 at 2720, process 2700 continues at 2722 where process 2700 determines that two address banks share one MSB and that two address banks are individual with respect to MSBs. After this determination, process 2700 proceeds to 2736. If M is not 4 at 2720, process 2700 continues at 2724.

At 2724, process 2700 determines whether M is 3. If M is 3, process 2700 continues at 2726 where process 2700 determines that two address banks share one MSB and that one address bank is individual with respect to MSBs. After this determination, process 2700 proceeds to 2736. If M is not 3 at 2724, process 2700 continues at 2728.

At 2728, process 2700 determines whether M is 2. If M is 2, process 2700 continues at 2730 where process 2700 determines that two address banks are individual with respect to MSBs. After this determination, process 2700 proceeds to 2736. If M is not 2 at 2728, process 2700 continues at 2732. At 2732, process 2700 determines whether M is 1. If M is 1, process 2700 continues at 2734 where process 2700 determines that one bank is individual with respect to MSBs. After this determination, process 2700 proceeds to 2736.

At 2736 (see FIG. 27A), if L is zero, the process 2700 ends. If L is a positive whole number, the process 2700 proceeds to 2738, where K is subtracted from J. This new value of J will be used in the next cycle of the process. At 2740, if K is greater than $2^{L+1}$, the process returns to 2706 with L remaining at its current value. If K is not greater than $2^{L+1}$, the process continues to 2742, where L is decreased by 1. The process then returns to 2706.

Figure 28:
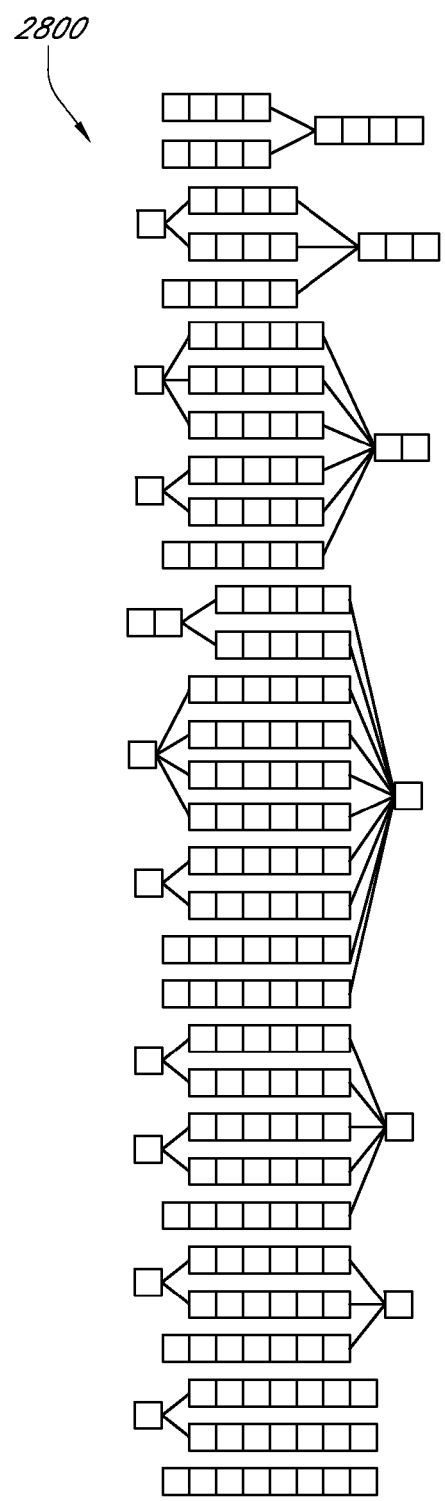
FIG. 28 is an exemplary diagram showing another embodiment of MSB and LSB sharing.

For each cycle of the process 2700, a set of L and K values are determined. For each K value, a set of P and T values are determined. The L or K values and the P or T values may be the same for consecutive cycles. Each set of L and K values indicates how many address banks (K) share what number of LSBs (L). Each set of P and T values indicates how many address banks (T) share what number of MSBs (P). For each iteration of the process 2700, the process 2700 determines a value for K and possibly multiple values of T and P corresponding to that single value of K. Physically, this illustrates that for one group of K address banks that share L LSBs, possibly multiple sets of T address banks share P MSBs. An embodiment of a redundancy structure constructed according to the process 2700 is depicted in FIG. 28.

In one embodiment, a method comprises (a) identifying a number of address banks to store in a memory structure, (b) determining a number K address banks that share L least significant bits, (c) setting a value M equal to K, (d) if M is greater than 4, determining a number T address banks that share P most significant bits, (e) setting M equal to M minus T, (f) repeating (d) and (e) until P equals zero or until M is less than or equal to 4, (g) if M is less than or equal to 4, (i) if M equals 4, determining that 2 address banks share 1 most significant bit and that 2 address banks share no most significant bits, (ii) if M equals 3, determining that 2 address banks share 1 most significant bit and that 1 address bank shares no most significant bits, (iii) if M equals 2, determining that 2 address banks share no most significant bits, (iv) if M equals 1, determining that 1 address bank shares no most significant bits, (h) if K is less than or equal to $2^{L+1}$, decrementing L by 1, and (i) repeating (b) through (h) until L equals zero.

In one embodiment, a number of fuses saved due to shared most significant bits is given by the equation $\Sigma(K-1)*L+\Sigma(P-1)*T$.

Figure 29A:
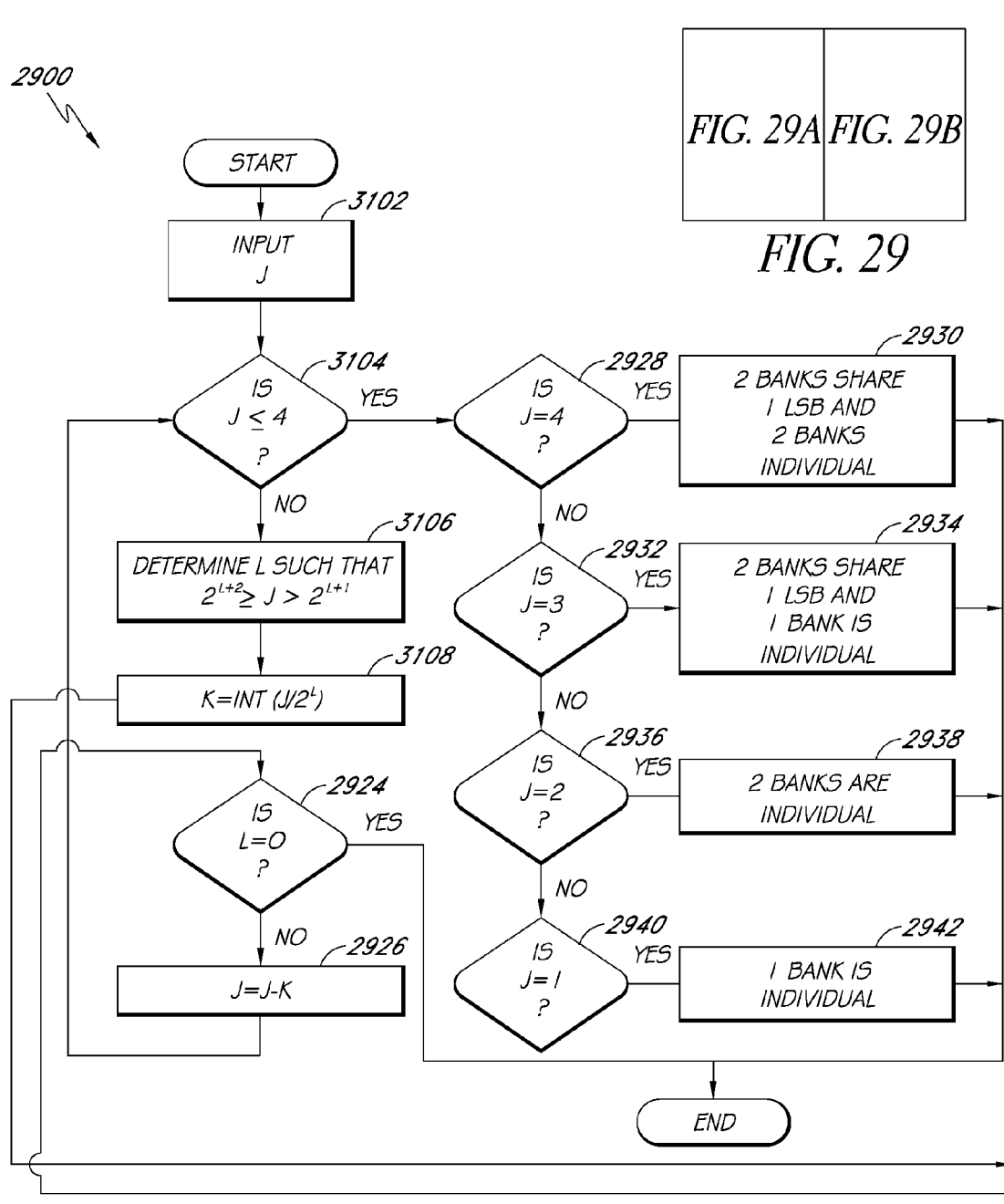
FIG. 29A is an exemplary flowchart showing an embodiment of a process for determining shared MSBs and LSBs.
Figure 29B:
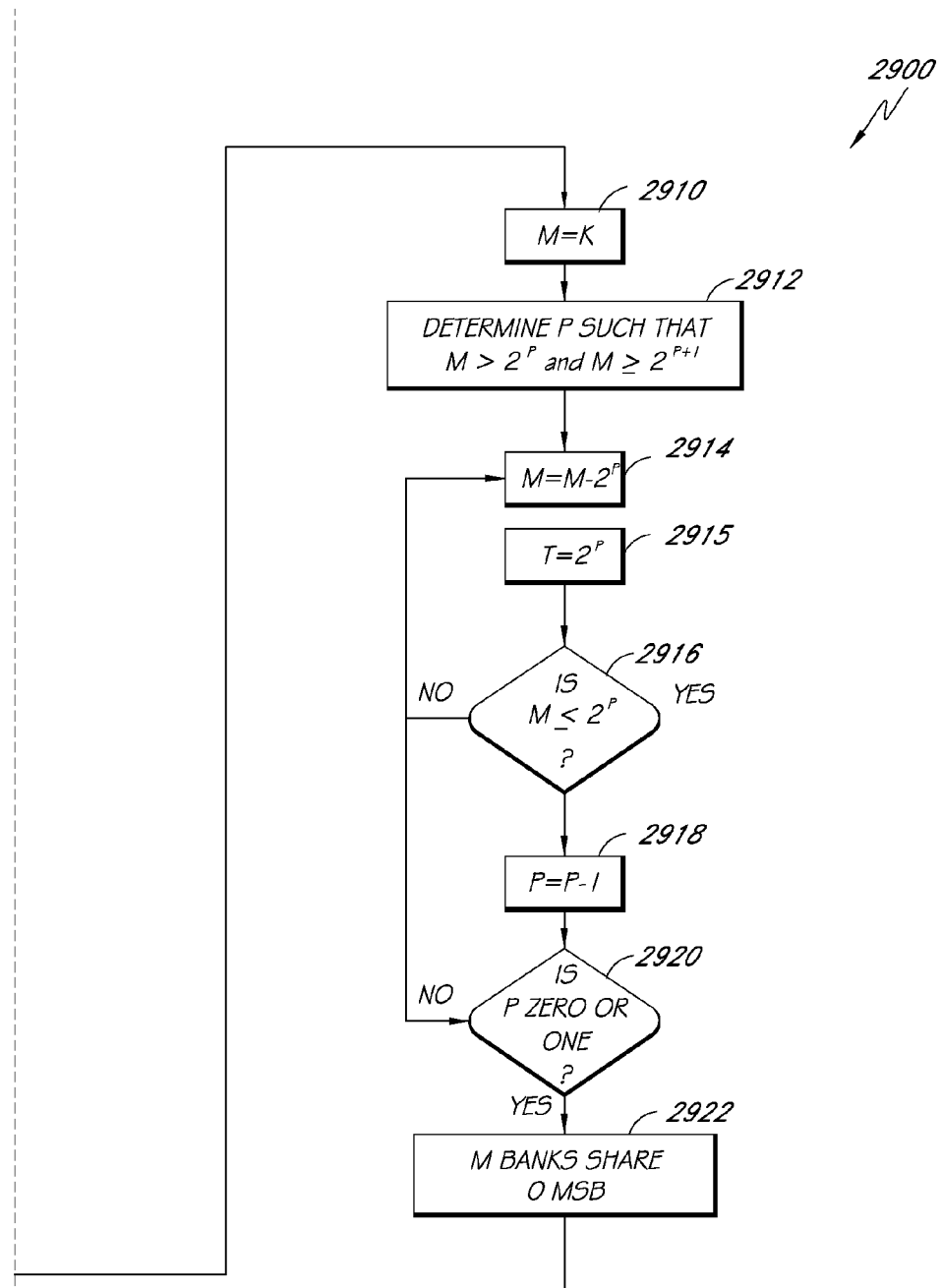
FIG. 29B is an exemplary flowchart showing an embodiment of a process for determining shared MSBs and LSBs.

FIGS. 29A and 29B show another embodiment of a process 2900 for determining shared MSBs and LSBs. Process 2900 determines the number of MSBs that can be shared among address banks and the corresponding number of address banks that can share MSBs. Process 2900 also determines the corresponding number of LSBs that can be shared among address banks and the number of address banks that can share LSBs.

At 2902 (see FIG. 29A), an input number J of address banks to be stored is selected. The value J changes in certain embodiments for each cycle of the process 2900. At 2904, the value of J is checked. If J is less than or equal to 4, the process 2900 continues at 2928. If J is not less than or equal to 4, the process 2900 continues at 2906. At 2906, a value L is determined by satisfying the conditions that $2^{L+1}$ is less than J and J is less than or equal to $2^{L+2}$. At 2908, the number of times J can be divided by $2^L$ is determined. This value is K. Mathematically, K can be expressed as $K/(2^L)$.

As stated previously, if J is less than or equal to 4 at 2904, process 2900 continues at 2928. If J is 4 at 2928, process 2900 continues at 2930 where process 2900 determines that two address banks share one LSB and that two address banks are individual with respect to LSBs and MSBs. After this determination, the process 2900 ends. If J is not 4 at 2928, process 2900 continues at 2932.

At 2932, process 2900 determines whether J is 3. If J is 3, process 2900 continues at 2934 where process 2900 determines that two address banks share one LSB and that one address bank is individual with respect to LSBs and MSBs. After this determination, the process 2900 ends. If J is not 3 at 2932, process 2900 continues at 2936.

At 2936, process 2900 determines whether J is 2. If J is 2, process 2900 continues at 2938 where process 2900 determines that two address banks are individual with respect to LSBs and MSBs. After this determination, the process 2900 ends. If J is not 2 at 2936, process 2900 continues at 2940. At 2940, process 2900 determines whether J is 1. If J is 1, process 2900 continues at 2942 where process 2900 determines that one bank is individual with respect to LSBs and MSBs. After this determination, the process 2900 ends.

At 2910 (see FIG. 29B), a first value M is set equal to K. The value M changes in certain embodiments for each cycle of the process. At 2912, a value P is determined to satisfy the conditions that $2^P$ is less than M and M is greater than or equal to $2^{P+1}$. At 2914, 2 is subtracted from M. At 2915, a value T is set equal to 2. Because T is 2 in this example of the process 2900, in certain embodiments 2 address banks per each cycle of the process 2900 may share MSBs.

At 2916, the process determines whether M is less than or equal to $2^P$. If M is not less than or equal to $2^P$, the process 2900 returns to 2914. If M is less than or equal to $2^P$, process 2900 continues at 2918. At 2918, 1 is subtracted from P.

The process 2900 continues at 2920 where it is determined whether P is zero or one. If P is not zero or one, process 2900 returns to 2914. If P is zero or one, process 2900 continues at 2922. At 2922, process 2900 determines that N address banks are individual with respect to MSBs. Process 2900 then proceeds to 2924.

At 2924 (see FIG. 29A), the L value is checked. If L is equal to zero, process 2900 ends. If L is not equal to zero, process 2900 continues at 2926. At 2926, K is subtracted from J. The result will be J for the next cycle. After this determination, process 2900 returns to 2904.

Figure 30:
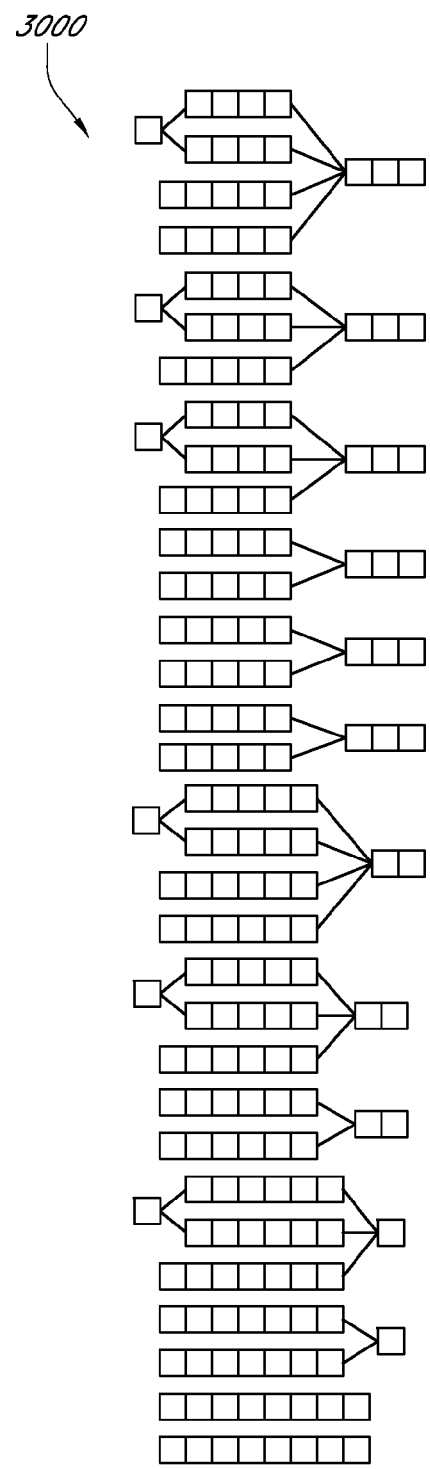
FIG. 30 is an exemplary diagram showing another embodiment of MSB and LSB sharing.

For each cycle of the process 2900, a set of L and K values are determined. For each K value, a set of P and T values are determined. The L or K values and the P or T values may be the same for consecutive cycles. Each set of L and K values indicates how many address banks (K) share what number of LSBs (L). Each set of P and T values indicates how many address banks (T) share what number of MSBs (P). For each iteration of the process 2900, the process 2900 determines a value for K and possibly multiple values of T and P corresponding to that single value of K. Physically, this illustrates that for one group of K address banks that share L LSBs, possibly multiple sets of T address banks share P MSBs. An embodiment of a redundancy structure constructed according to the process 2900 is depicted in FIG. 30.

In one embodiment, a method comprises (a) identifying a number M address banks to store in a memory structure, (b) if M is greater than 4, determining a number K address banks that share L least significant bits, (c) determining a number P most significant bits shared among 2 address banks, (d) decrementing P by 1, (e) repeating (c) and (d) until P equals zero or 1, (f) determining a number of address banks that share no most significant bits, (g) setting M equal to M minus K, (h) if M is less than or equal to 4, (i) if M equals 4, determining that 2 address banks share 1 least significant bit and that 2 address banks share no least significant bits or most significant bits, (ii) if M equals 3, determining that 2 address banks share 1 most significant bit and that 1 address bank shares no least significant bits or most significant bits, (iii) if M equals 2, determining that 2 address banks share no least significant bits or most significant bits, (iv) if M equals 1, determining that 1 address bank shares no least significant bits or most significant bits, and (i) repeating (b) through (h) until L equals zero or until M is less than or equal to 4.

In one embodiment, a number of fuses saved due to shared most significant bits is given by the equation $\Sigma(K-1)*L+\Sigma(P-1)*T$.

Figure 31A:
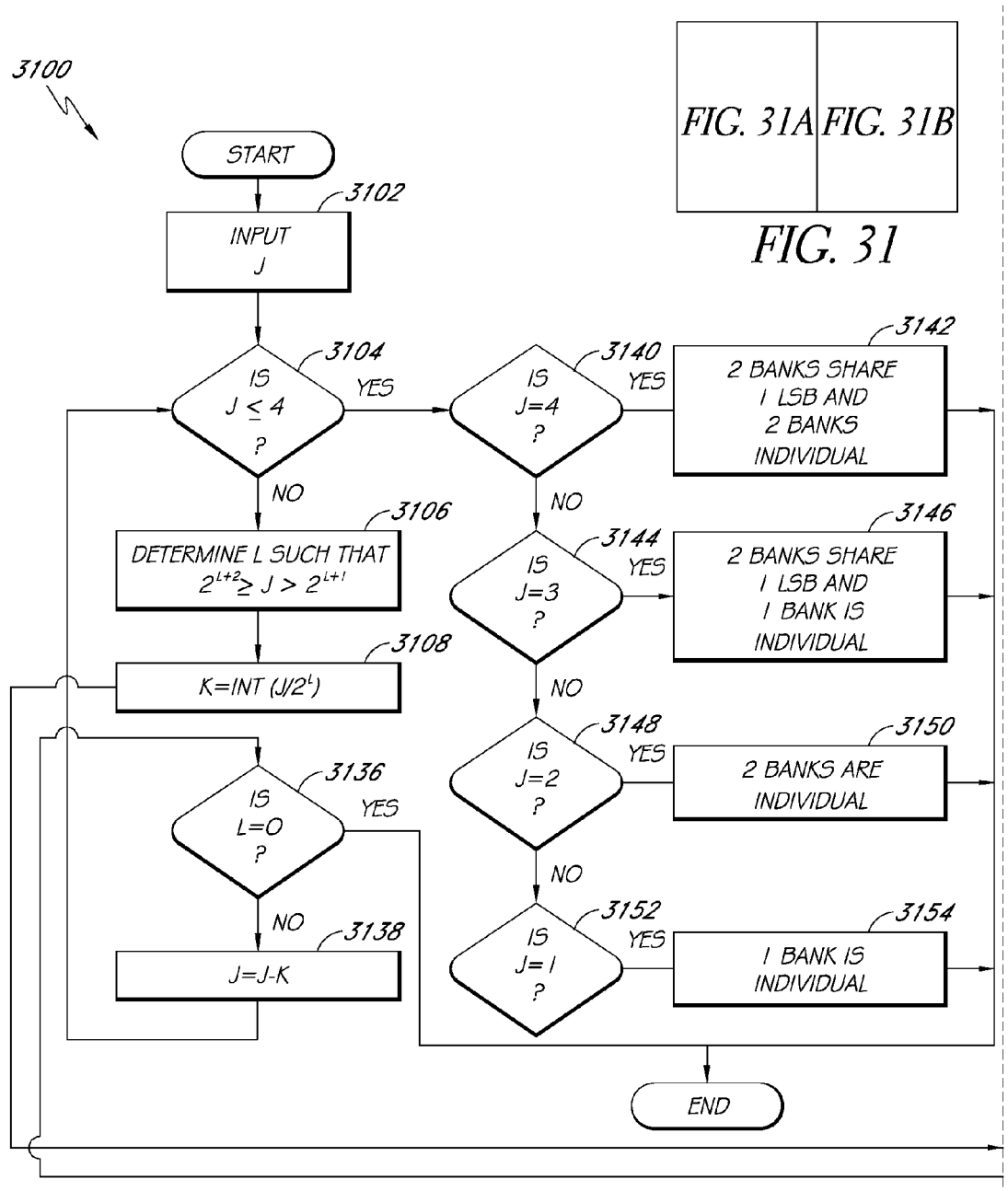
FIG. 31A is an exemplary flowchart showing an embodiment of a process for determining shared MSBs and LSBs.
Figure 31B:
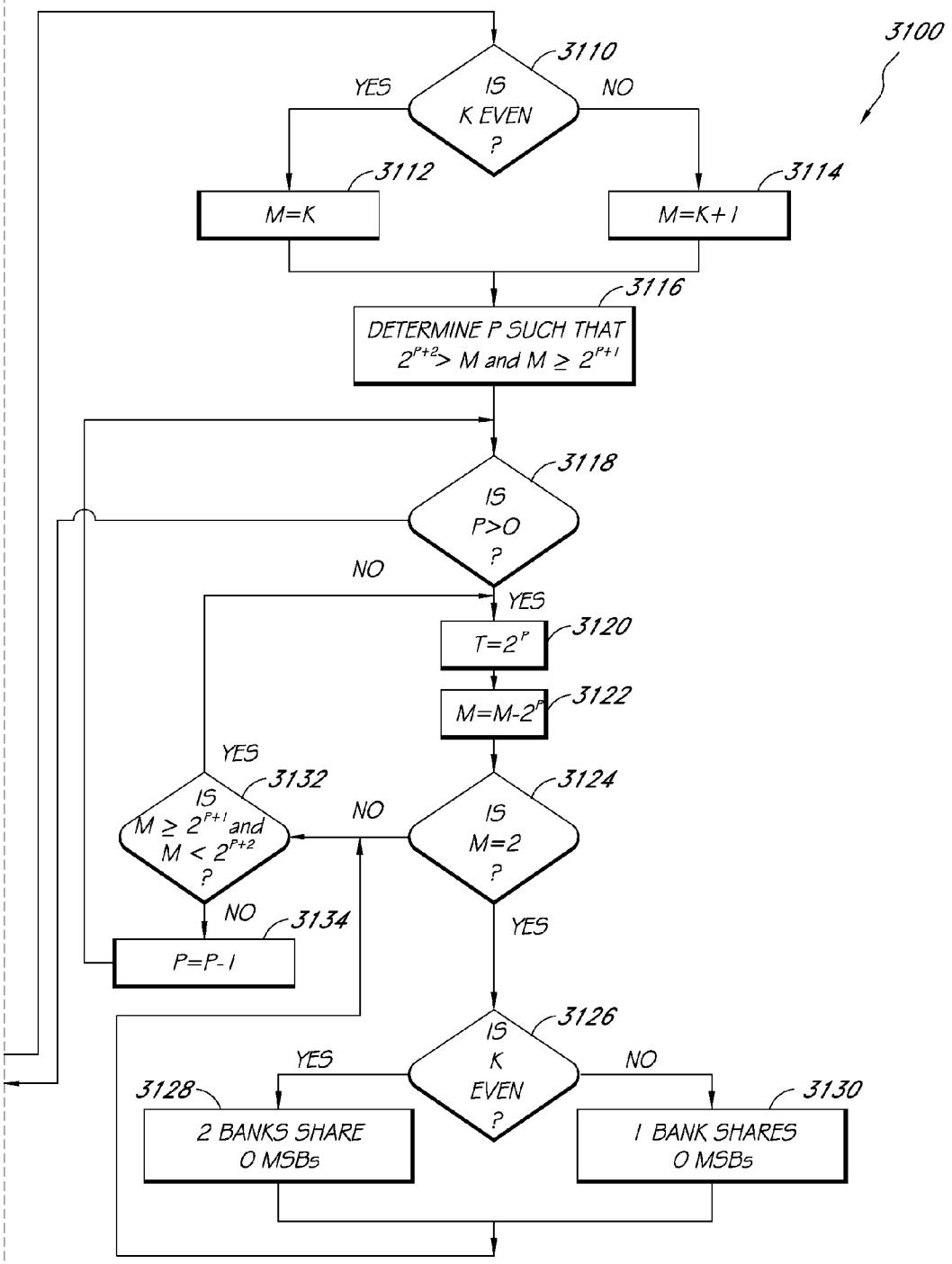
FIG. 31B is an exemplary flowchart showing an embodiment of a process for determining shared MSBs and LSBs.

FIGS. 31A and 31B show another embodiment of a process 3100 for determining shared MSBs and LSBs. Process 3100 determines the number of MSBs that can be shared among address banks and the corresponding number of address banks that can share MSBs. Process 3100 also determines the corresponding number of LSBs that can be shared among address banks and the number of address banks that can share LSBs.

At 3102 (see FIG. 31A), an input number J of address banks to be stored is selected. The value J changes in certain embodiments for each cycle of the process 3100. At 3104, the value of J is checked. If J is less than or equal to 4, the process 3100 continues at 3140. If J is not less than or equal to 4, the process 3100 continues at 3106. At 3106, a value L is determined by satisfying the conditions that $2^{L+1}$ is less than J and J is less than or equal to $2^{L+2}$. At 3108, the number of times J can be divided by $2^L$ is determined. This value is K. Mathematically, K can be expressed as $K/(2^L)$.

As stated previously, if J is less than or equal to 4 at 3104, process 3100 continues at 3140. If J is 4 at 3140, process 3100 continues at 3142 where process 3100 determines that two address banks share one LSB and that two address banks are individual with respect to LSBs and MSBs. After this determination, the process 3100 ends. If J is not 4 at 3140, process 3100 continues at 3144.

At 3144, process 3100 determines whether J is 3. If J is 3, process 3100 continues at 3146 where process 3100 determines that two address banks share one LSB and that one address bank is individual with respect to LSBs and MSBs. After this determination, process 3100 ends. If J is not 3 at 3144, process 3100 continues at 3148.

At 3148, process 3100 determines whether J is 2. If J is 2, process 3100 continues at 3150 where process 3100 determines that two address banks are individual with respect to LSBs and MSBs. After this determination, process 3100 ends. If J is not 2 at 3148, process 3100 continues at 3152. At 3152, process 3100 determines whether J is 1. If J is 1, process 3100 continues at 3154 where process 3100 determines that one bank is individual with respect to LSBs and MSBs. After this determination, process 3100 ends.

At 3110 (see FIG. 31B), it is determined whether K is even. If K is even, then at 3112 a value M is set equal to K. However, if K is odd, M is set to equal to M plus 1 at 3114. The process 3100 proceeds to 3116, where a number L is determined to satisfy the conditions that M is greater than or equal to $2^{P+1}$ and that M is less than $2^{P+2}$. Next, if P is greater than 0 at 3118, the process 3100 sets a number T equal to $2^P$ at 3120. However, if at 3118 P is not greater than zero, the process 3100 proceeds to 3136.

At 3122, the number M is set equal to M minus $2^P$. At 3124, the process 3100 determines if M equals 2. If M equals 2, the process 3100 determines at 3126 whether K is an even number. If K is not even, the process 3100 at 3130 determines that one address bank does not share MSBs with another address bank; that is, one address bank is "individual" with respect to MSBs. If K is even, the process 3100 determines that two address banks are individual at 3128. The process then proceeds to 3132.

If M is not equal to 2 at 3124, the process 3100 determines whether M is greater than or equal to $2^{P+1}$ and whether M is less than $2^{P+2}$ at 3132. If the conditions at 3132 are satisfied, the process 3100 loops back to 3120. However, if the conditions at 3132 are not satisfied, the process 3100 proceeds to 3134, sets P equal to P minus 1, and then returns to 3118.

At 3136 (see FIG. 31A), the L value is checked. If L is equal to zero, process 3100 ends. If L is not equal to zero, process 3100 continues at 3138. At 3138, K is subtracted from J. The result will be J for the next cycle. After this determination, process 3100 returns to 3104.

Figure 32:
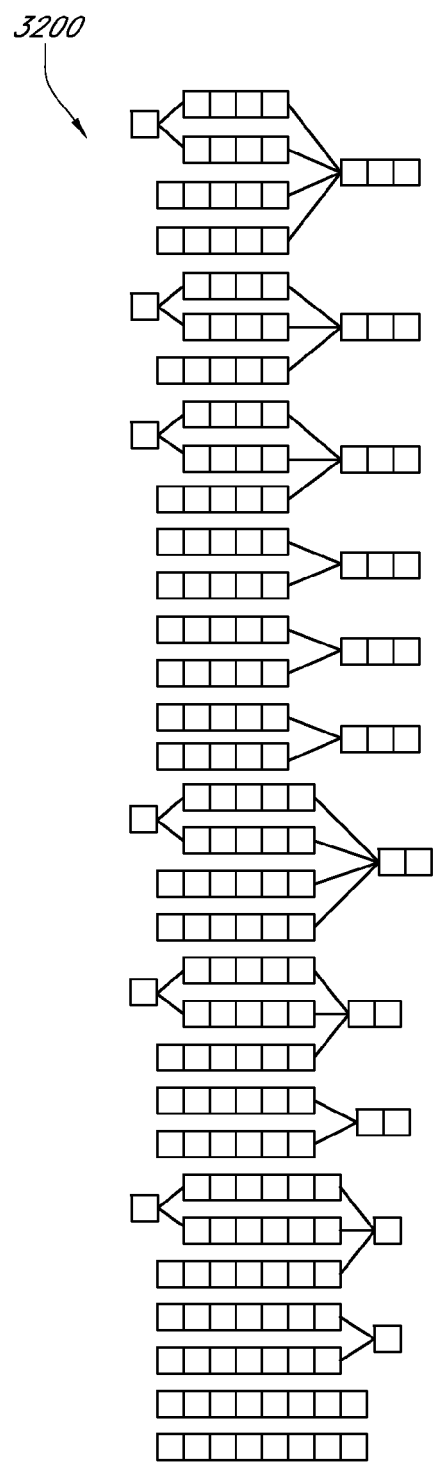
FIG. 32 is an exemplary diagram showing another embodiment of MSB and LSB sharing.

For each cycle of the process 3100, a set of L and K values are determined. For each K value, a set of P and T values are determined. The L or K values and the P or T values may be the same for consecutive cycles. Each set of L and K values indicates how many address banks (K) share what number of LSBs (L). Each set of P and T values indicates how many address banks (T) share what number of MSBs (P). For each iteration of the process 3100, the process 3100 determines a value for K and possibly multiple values of T and P corresponding to that single value of K. Physically, this illustrates that for one group of K address banks that share L LSBs, possibly multiple sets of T address banks share P MSBs. An embodiment of a redundancy structure constructed according to the process 3100 is depicted in FIG. 32.

In one embodiment, a method comprises (a) identifying a number M address banks to store in a memory structure, (b) if M is greater than 4, determining a number K address banks that share L least significant bits, (c) determining a number T address banks that share P most significant bits, (d) if a fixed number has been reached, (i) determining a number of address banks that do not share any most significant bits, and (e) repeating (c) and (d) until P is less than or equal to zero, (f) setting M equal to M minus K, (g) if M is less than or equal to 4, (i) if M equals 4, determining that 2 address banks share 1 least significant bit and that 2 address banks share no least significant bits or most significant bits, (ii) if M equals 3, determining that 2 address banks share 1 most significant bit and that 1 address bank shares no least significant bits or most significant bits, (iii) if M equals 2, determining that 2 address banks share no least significant bits or most significant bits, (iv) if M equals 1, determining that 1 address bank shares no least significant bits or most significant bits, and (h) repeating (b) through (g) until L equals zero or until M is less than or equal to 4.

In one embodiment, a number of fuses saved due to shared most significant bits is given by the equation $\Sigma(K-1)*L+\Sigma(P-1)*T$.

Figure 33A:
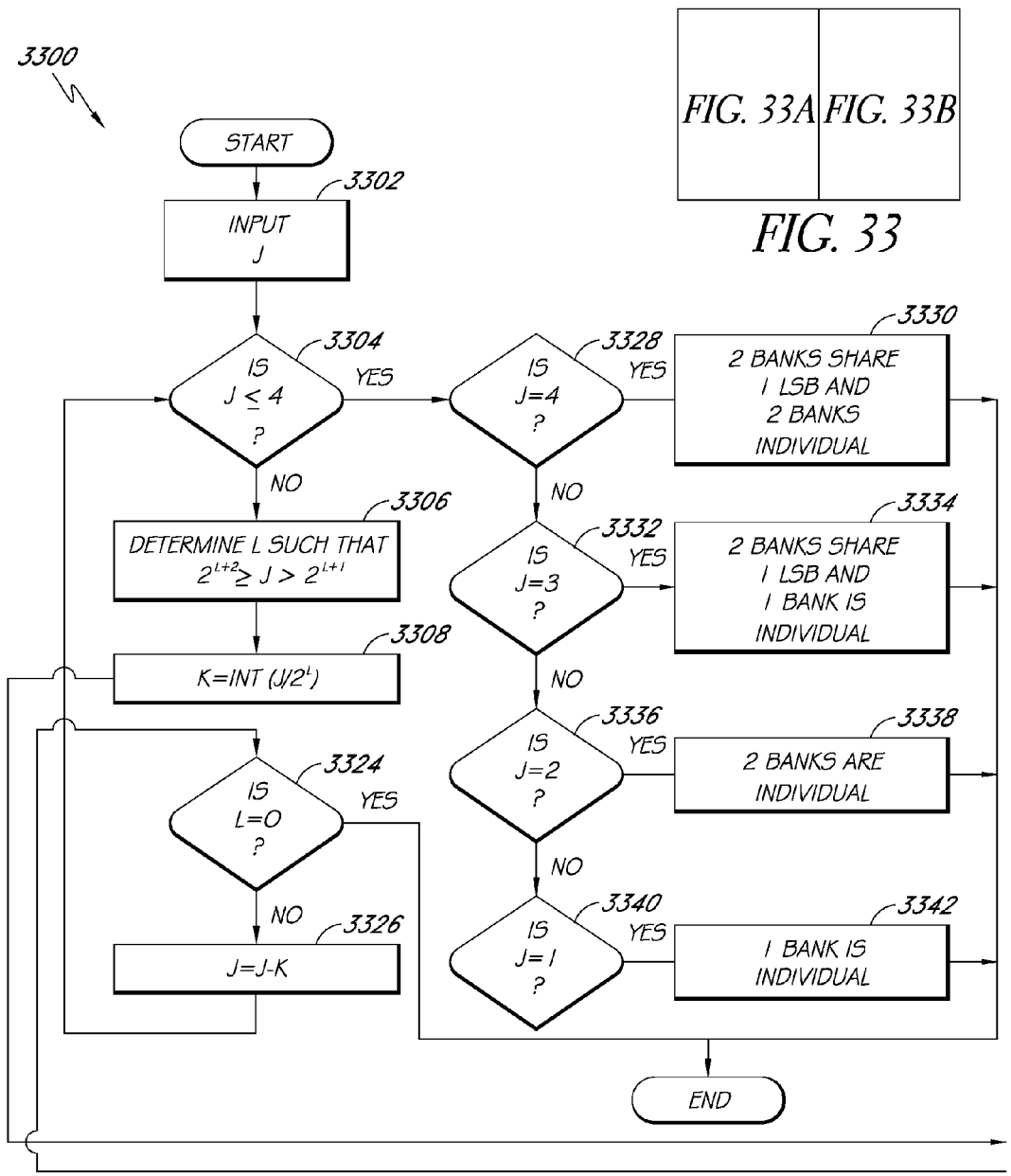
FIG. 33A is an exemplary flowchart showing an embodiment of a process for determining shared MSBs and LSBs.
Figure 33B:
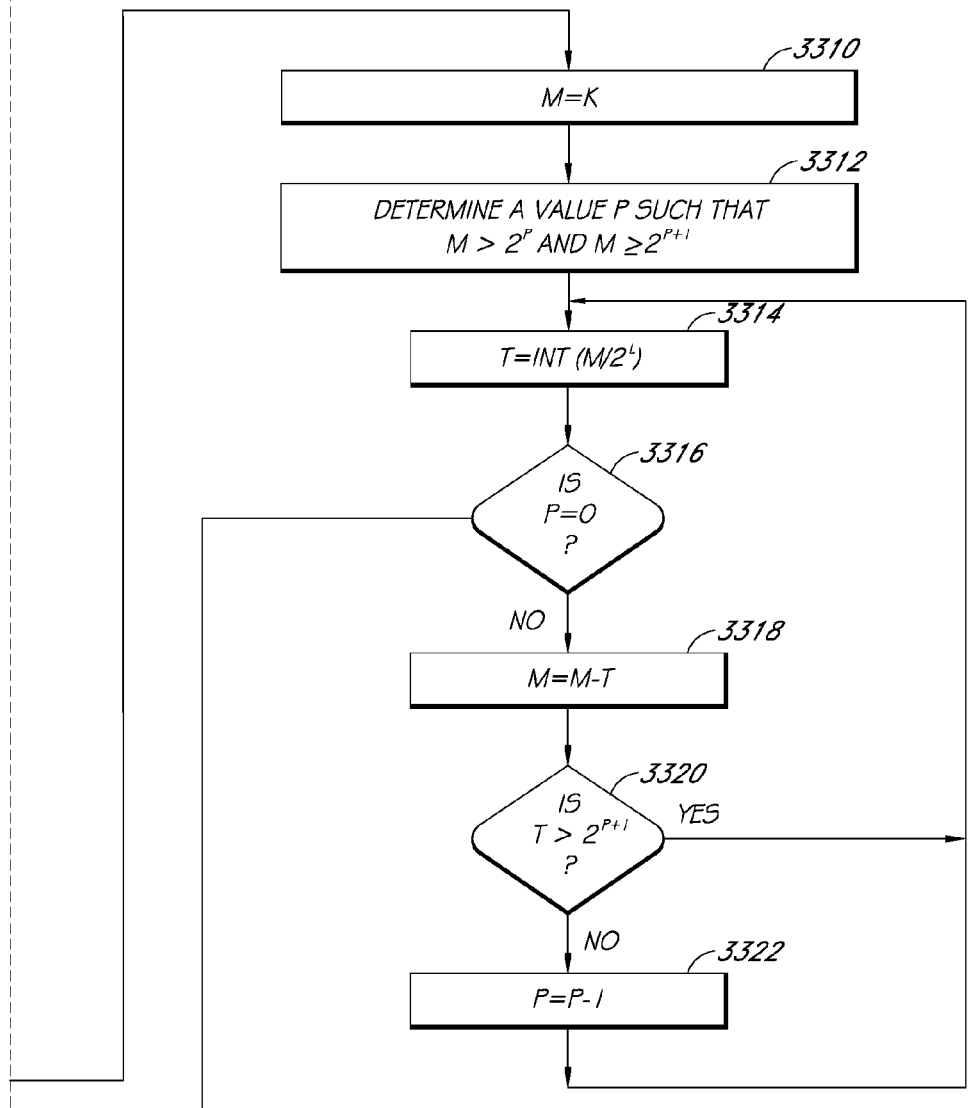
FIG. 33B is an exemplary flowchart showing an embodiment of a process for determining shared MSBs and LSBs.

FIGS. 33A and 33B show another embodiment of a process 3300 for determining shared MSBs and LSBs. Process 3300 determines the number of MSBs that can be shared among address banks and the corresponding number of address banks that can share MSBs. Process 3300 also determines the corresponding number of LSBs that can be shared among address banks and the number of address banks that can share LSBs.

At 3302 (see FIG. 33A), an input number J of address banks to be stored is selected. The value J changes in certain embodiments for each cycle of the process 3300. At 3304, the value of J is checked. If J is less than or equal to 4, the process 3300 continues at 3328. If J is not less than or equal to 4, the process 3300 continues at 3306. At 3306, a value L is determined by satisfying the conditions that $2^{L+1}$ is less than J and J is less than or equal to $2^{L+2}$. At 3308, the number of times J can be divided by $2^L$ is determined. This value is K. Mathematically, K can be expressed as $K/(2^L)$.

As stated previously, if J is less than or equal to 4 at 3304, process 3300 continues at 3328. If J is 4 at 3328, process 3300 continues at 3330 where process 3300 determines that two address banks share one LSB and that two address banks are individual with respect to LSBs and MSBs. After this determination, the process 3300 ends. If J is not 4 at 3328, process 3300 continues at 3332.

At 3332, process 3300 determines whether J is 3. If J is 3, process 3300 continues at 3334 where process 3300 determines that two address banks share one LSB and that one address bank is individual with respect to LSBs and MSBs. After this determination, the process 3300 ends. If J is not 3 at 3332, process 3300 continues at 3336.

At 3336, process 3300 determines whether J is 2. If J is 2, process 3300 continues at 3338 where process 3300 determines that two address banks are individual with respect to LSBs and MSBs. After this determination, the process 3300 ends. If J is not 2 at 3336, process 3300 continues at 3340. At 3340, process 3300 determines whether J is 1. If J is 1, process 3300 continues at 3342 where process 3300 determines that one bank is individual with respect to LSBs and MSBs. After this determination, the process 3300 ends.

At 3310 (see FIG. 33B), a value M is set equal to K. The value M changes in certain embodiments for each cycle of the process. At 3312, a value P is determined. P is either zero or a positive whole number (e.g., P is 0, 1, 2, 3 . . . ). P is determined at 3312 by satisfying two conditions: M is be greater than $2^P$, and M is be greater than or equal to $2^{P+1}$.

At 3314, the number of times that M can be divided by $2^P$ is determined. This value is T. Mathematically, T can be expressed as $M/(2^P)$. The integer value of $M/(2^P)$ is taken rather than the entire value of $M/(2^P)$ to ensure that $M/(2^P)$ results in a whole number. For example, if M is 11 and P is 1, $11/2^1$ equals 5.5, but T will be set equal to the integer value of 5.5, which is 5.

At 3316, if P is zero, the process proceeds to 3324. If P is a positive whole number, the process continues to 3318. At 3318, T is subtracted from M. This new value of M will be used in the next cycle of the process.

At 3320, if T is greater than $2^{P+1}$, the process returns to 3314 with P remaining at its current value. If T is not greater than $2^{P+1}$, the process continues to 3322, where P is decreased by 1. The process then returns to 3314.

At 3324 (see FIG. 33A), the L value is checked. If L is equal to zero, process 3300 ends. If L is not equal to zero, process 3300 continues at 3326. At 3326, K is subtracted from J. The result will be J for the next cycle. After this determination, process 3300 returns to 3304.

Figure 34:
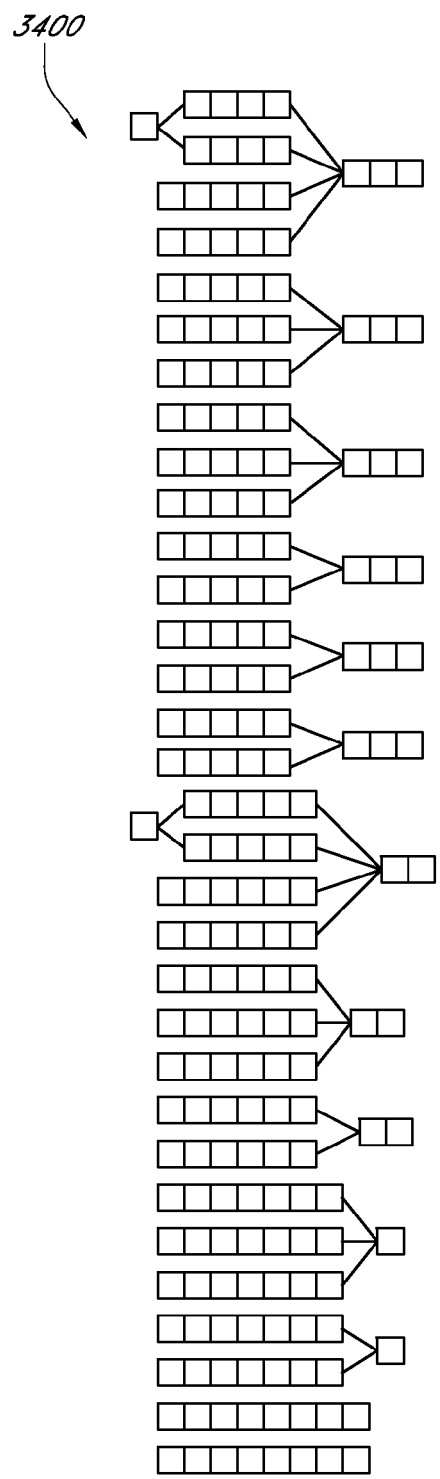
FIG. 34 is an exemplary diagram showing another embodiment of MSB and LSB sharing.

For each cycle of the process 3300, a set of L and K values are determined. For each K value, a set of P and T values are determined. The L or K values and the P or T values may be the same for consecutive cycles. Each set of L and K values indicates how many address banks (K) share what number of LSBs (L). Each set of P and T values indicates how many address banks (T) share what number of MSBs (P). For each iteration of the process 3300, the process 3300 determines a value for K and possibly multiple values of T and P corresponding to that single value of K. Physically, this illustrates that for one group of K address banks that share L LSBs, possibly multiple sets of T address banks share P MSBs. An embodiment of a redundancy structure constructed according to the process 3300 is depicted in FIG. 34.

In one embodiment, a method comprises (a) identifying a number M address banks to store in a memory structure, (b) if M is greater than 4, determining a number K address banks that share L least significant bits, (c) determining a number T address banks that share P most significant bits, (d) if T is less than or equal to $2^{P+1}$, decrementing P by 1, (e) repeating (c) and (d) until P equals zero, (f) setting M equal to M minus K, (g) if M is less than or equal to 4, (i) if M equals 4, determining that 2 address banks share 1 least significant bit and that 2 address banks share no least significant bits or most significant bits, (ii) if M equals 3, determining that 2 address banks share 1 most significant bit and that 1 address bank shares no least significant bits or most significant bits, (iii) if M equals 2, determining that 2 address banks share no least significant bits or most significant bits, (iv) if M equals 1, determining that 1 address bank shares no least significant bits or most significant bits, and (h) repeating (b) through (g) until L equals zero or until M is less than or equal to 4.

In one embodiment, a number of fuses saved due to shared most significant bits is given by the equation $\Sigma(K-1)*L+\Sigma(P-1)*T$.

Figure 35A:
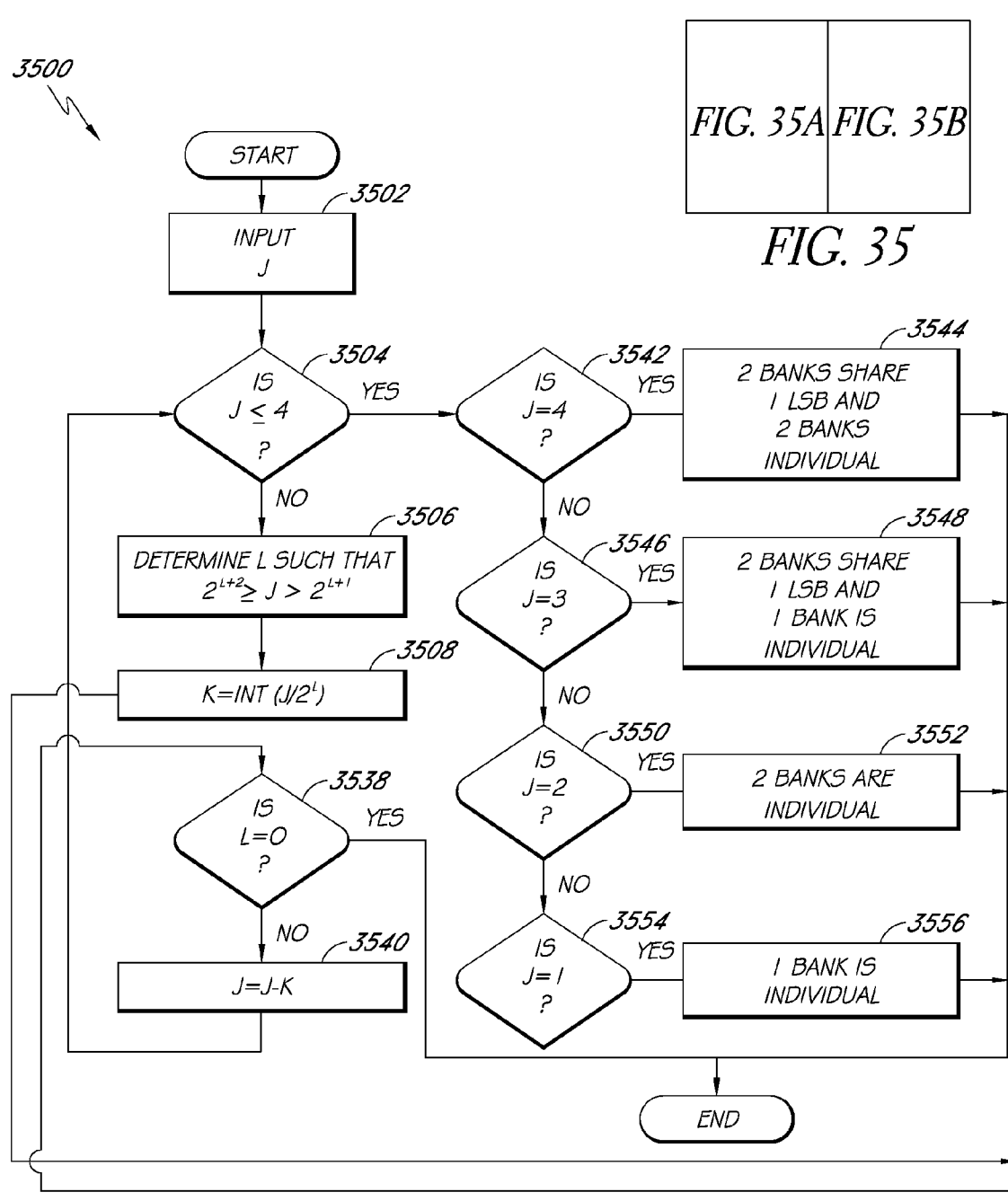
FIG. 35A is an exemplary flowchart showing an embodiment of a process for determining shared MSBs and LSBs.
Figure 35B:
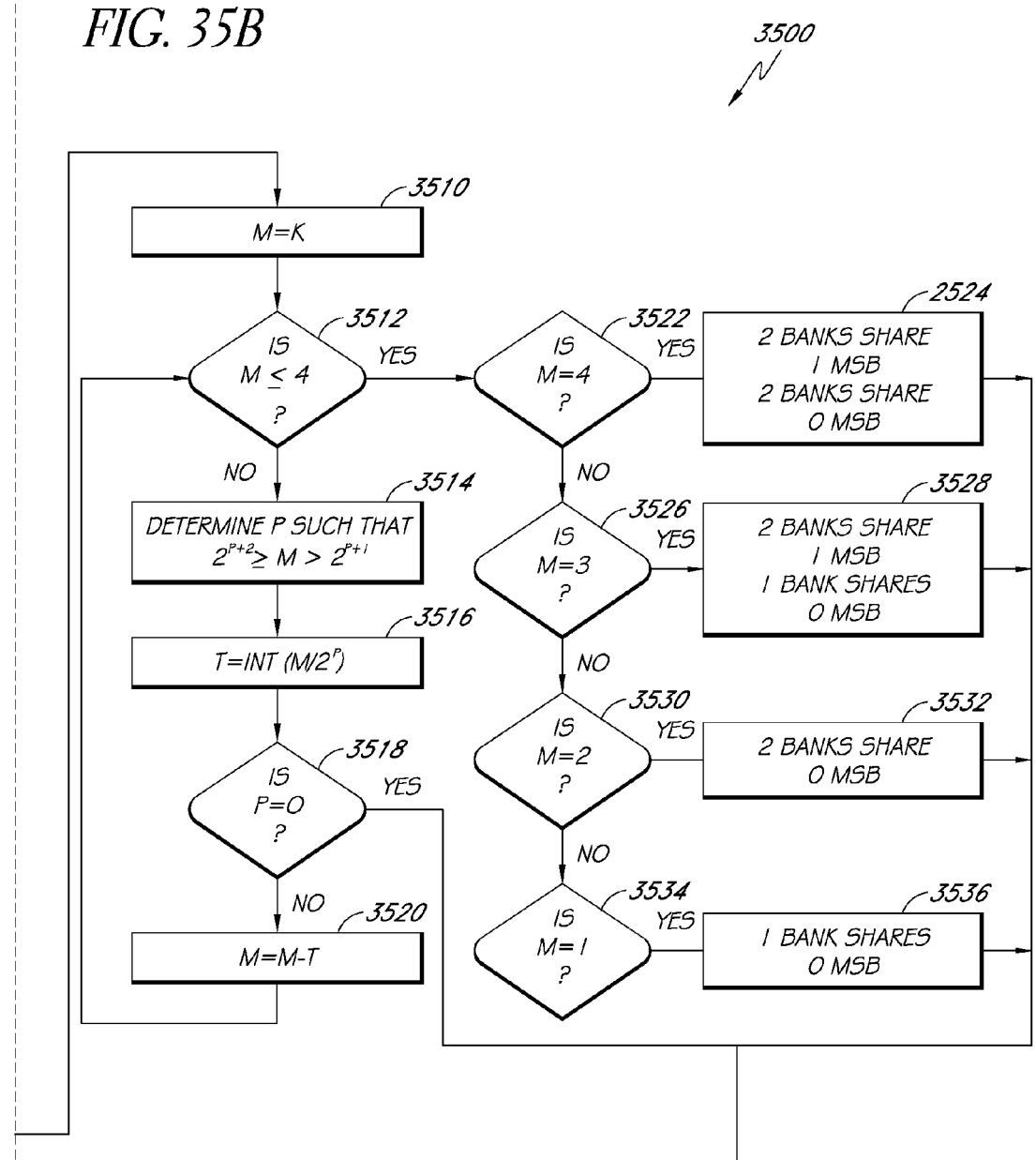
FIG. 35B is an exemplary flowchart showing an embodiment of a process for determining shared MSBs and LSBs.

FIGS. 35A and 35B show another embodiment of a process 3300 for determining shared MSBs and LSBs. Process 3300 determines the number of MSBs that can be shared among address banks and the corresponding number of address banks that can share MSBs. Process 3300 also determines the corresponding number of LSBs that can be shared among address banks and the number of address banks that can share LSBs.

At 3502 (see FIG. 35A), an input number J of address banks to be stored is selected. The value J changes in certain embodiments for each cycle of the process 3500. At 3504, the value of J is checked. If J is less than or equal to 4, the process 3500 continues at 3542. If J is not less than or equal to 4, the process 3500 continues at 3506. At 3506, a value L is determined by satisfying the conditions that $2^{L+1}$ is less than J and J is less than or equal to $2^{L+2}$. At 3508, the number of times J can be divided by $2^L$ is determined. This value is K. Mathematically, K can be expressed as $K/(2^L)$.

As stated previously, if J is less than or equal to 4 at 3504, process 3500 continues at 3542. If J is 4 at 3542, process 3500 continues at 3544 where process 3500 determines that two address banks share one LSB and that two address banks are individual with respect to LSBs and MSBs. After this determination, the process 3500 ends. If J is not 4 at 3542, process 3500 continues at 3546.

At 3546, process 3500 determines whether J is 3. If J is 3, process 3500 continues at 3548 where process 3500 determines that two address banks share one LSB and that one address bank is individual with respect to LSBs and MSBs. After this determination, the process 3500 ends. If J is not 3 at 3546, the process 3500 continues at 3550.

At 3550, process 3500 determines whether J is 2. If J is 2, process 3500 continues at 3552 where process 3500 determines that two address banks are individual with respect to LSBs and MSBs. After this determination, the process 3500 ends. If J is not 2 at 3550, process 3500 continues at 3554. At 3554, process 3500 determines whether J is 1. If J is 1, process 3500 continues at 3556 where process 3500 determines that one bank is individual with respect to LSBs and MSBs. After this determination, the process 3500 ends.

At 3510 (see FIG. 35B), a value M is set equal to K. The value M changes in certain embodiments for each cycle of the process 3500. At 3512, the value of M is checked. If M is less than or equal to 4, the process 3500 continues at 3522. If M is not less than or equal to 4, the process 3500 continues at 3514. At 3514, a value P is determined by satisfying the conditions that $2^{P+1}$ is less than M and M is less than or equal to $2^{P+2}$.

At 3516, the number of times M can be divided by $2^P$ is determined. This value is T. Mathematically, T can be expressed as $M/(2^P)$. T is the number of address banks that share P MSBs. At 3518, the P value is checked. If P is equal to zero, process 3500 proceeds to 3538. If P is not equal to zero, process 3500 continues at 3520. At 3520, T is subtracted from M. The result will be M for the next cycle. After this determination, process 3500 returns to 3512.

As stated previously, if M is less than or equal to 4 at 3512, process 3500 continues at 3522. If M is 4 at 3522, process 3500 continues at 3524 where process 3500 determines that two address banks share one MSB and that two address banks are individual with respect to MSBs. After this determination, the process 3500 proceeds to 3538. If M is not 4 at 3522, process 3500 continues at 3526.

At 3526, process 3500 determines whether M is 3. If M is 3, process 3500 continues at 3528 where process 3500 determines that two address banks share one MSB and that one address bank is individual with respect to MSBs. After this determination, process 3500 proceeds to 3538. If M is not 3 at 3526, process 3500 continues at 3530.

At 3530, process 3500 determines whether M is 2. If M is 2, process 3500 continues at 3532 where process 3500 determines that two address banks are individual with respect to MSBs. After this determination, process 3500 proceeds to 3538. If M is not 2 at 3530, process 3500 continues at 3534. At 3534, process 3500 determines whether M is 1. If M is 1, process 3500 continues at 3536 where process 3500 determines that one bank is individual with respect to MSBs. After this determination, process 3500 proceeds to 3538.

At 3538 (see FIG. 35A), the L value is checked. If L is equal to zero, process 3500 ends. If L is not equal to zero, process 3500 continues at 3540. At 3540, K is subtracted from J. The result will be J for the next cycle. After this determination, process 3500 returns to 3504.

Figure 36:
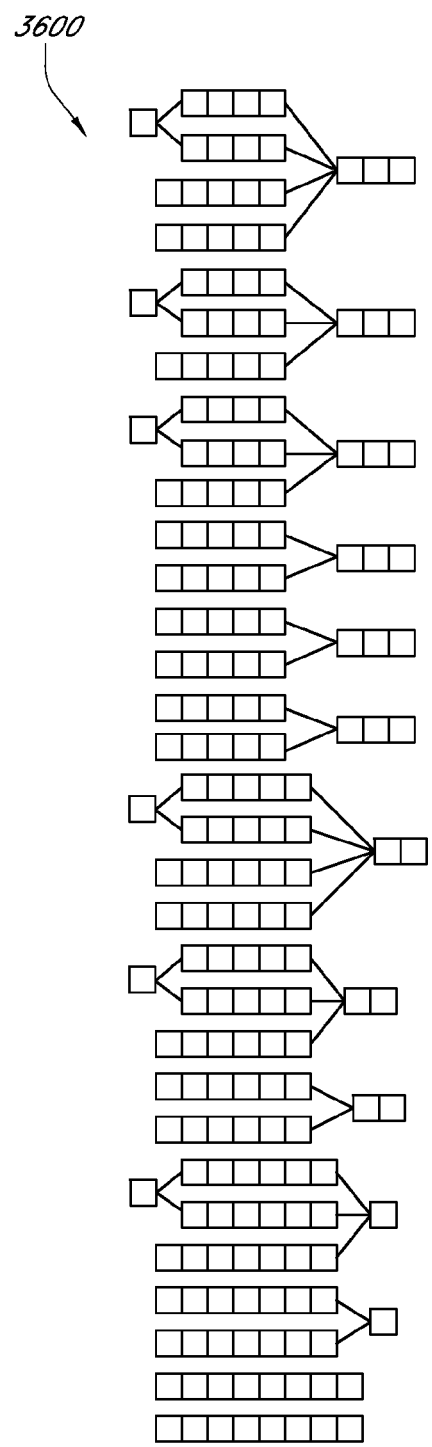
FIG. 36 is an exemplary diagram showing another embodiment of MSB and LSB sharing.

For each cycle of the process 3500, a set of L and K values are determined. For each K value, a set of P and T values are determined. The L or K values and the P or T values may be the same for consecutive cycles. Each set of L and K values indicates how many address banks (K) share what number of LSBs (L). Each set of P and T values indicates how many address banks (T) share what number of MSBs (P). For each iteration of the process 3500, the process 3500 determines a value for K and possibly multiple values of T and P corresponding to that single value of K. Physically, this illustrates that for one group of K address banks that share L LSBs, possibly multiple sets of T address banks share P MSBs. An embodiment of a redundancy structure constructed according to the process 3500 is depicted in FIG. 36.

In one embodiment, a method comprises (a) identifying a number M address banks to store in a memory structure, (b) if M is greater than 4, determining a number K address banks that share L least significant bits, (c) setting a value N equal to K, (d) if N is greater than 4, determining a number T address banks that share P most significant bits, (e) setting N equal to N minus T, (f) repeating (d) and (e) until P equals zero or until N is less than or equal to 4, (g) if N is less than or equal to 4, (i) if N equals 4, determining that 2 address banks share 1 most significant bit and that 2 address banks share no most significant bits, (ii) if N equals 3, determining that 2 address banks share 1 most significant bit and that 1 address bank shares no most significant bits, (iii) if N equals 2, determining that 2 address banks share no most significant bits, (iv) if N equals 1, determining that 1 address bank shares no most significant bits, (h) setting M equal to M minus K, (i) if M is less than or equal to 4, (i) if M equals 4, determining that 2 address banks share 1 least significant bit and that 2 address banks share no least significant bits or most significant bits, (ii) if M equals 3, determining that 2 address banks share 1 most significant bit and that 1 address bank shares no least significant bits or most significant bits, (iii) if M equals 2, determining that 2 address banks share no least significant bits or most significant bits, (iv) if M equals 1, determining that 1 address bank shares no least significant bits or most significant bits, and (j) repeating (b) through (i) until L equals zero or until M is less than or equal to 4.

In one embodiment, a number of fuses saved due to shared most significant bits is given by the equation $\Sigma(K-1)*L+\Sigma(P-1)*T$.

Figure 37:
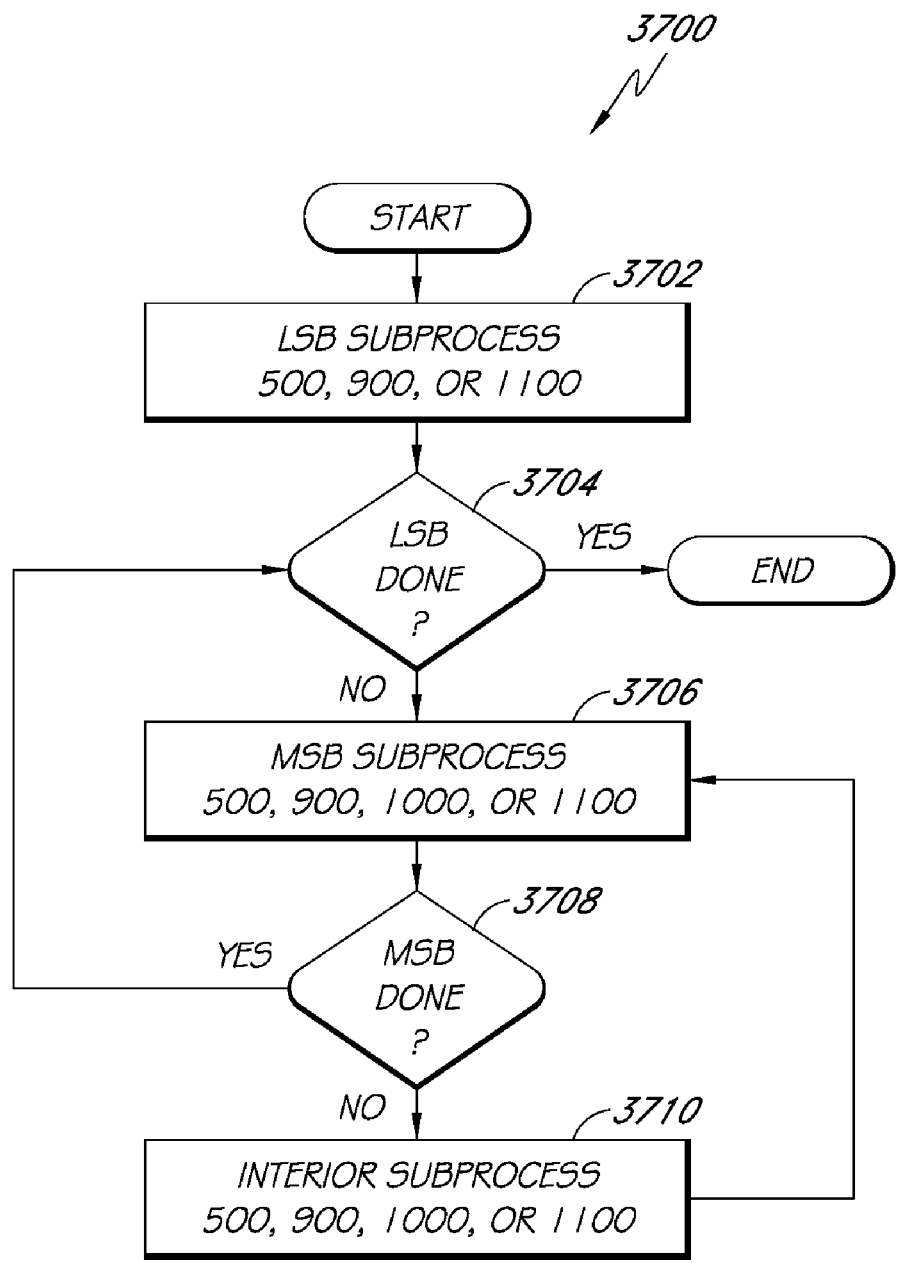
FIG. 37 is an exemplary flowchart showing an embodiment of a process for determining shared MSBs, LSBs, and interior bits.

FIG. 37 depicts embodiments of a process 3700 for determining shared LSBs, MSBs, and interior bits. At 3702, a subprocess executes to determine the number of shared LSBs in a number of address banks. Any of processes 500, 900, or 1100 could be incorporated by the subprocess in a fashion similar to that employed in process 1300 above. The process 3700 then proceeds to 3704 where it determines whether the LSB subprocess is completed. In certain embodiments, the LSB subprocess 3702 performs this step. If the LSB subprocess is completed, then the process 3700 ends.

If the LSB subprocess is not completed, at 3706 an MSB subprocess executes. The MSB subprocess determines the shared MSBs between certain address banks that also may share one or more LSBs. Any of processes 500, 900, 1000, or 1100 may be incorporated by the MSB subprocess. At 3708 it is determined whether the MSB subprocess is completed. In certain embodiments, the MSB subprocess performs this step. If the MSB subprocess is completed, then the process 3700 loops back to 3702 and executes the LSBs subprocess.

If the MSB subprocess is not completed, at 3710 an interior bit subprocess executes. The interior bit subprocess determines the number of bits that can be shared among address banks where the bits are neither LSBs nor MSBs. Any of processes 500, 900, 1000, or 1100 may be incorporated by the interior bit subprocess. After the interior bit subprocess completes, the process 3700 loops back to 3706 to continue executing the MSB subprocess. The process 3700 therefore increases the savings of fuses and logic gates by sharing interior bits in addition to LSBs and MSBs.

One example illustrates how the LSB, MSB, and interior bit subprocesses might incorporate one or more of the processes 500, 900, 1000, or 1100. In one embodiment, at 3702 the LSB subprocess incorporates any of processes 500, 900, or 1100 in the same manner as employed by the subprocess 1360. That is, instead of executing one of the processes 500, 900, 1000, or 1100 continuously from block to block, at some point the LSB subprocess pauses while the MSB subprocess executes, and the LSB process later resumes after the MSB subprocess has completed. At 3706, the MSB subprocess also incorporates any of processes 500, 900, 1000, or 1100 in the same manner employed by the subprocess 1360. The MSB subprocess likewise pauses while the interior bits subprocess executes and then resumes when the interior bits subprocess has completed. At 3710, the interior bits subprocess incorporates any of the processes 500, 900, 1000, or 1100 in the same manner employed by the subprocess 1380. That is, except for perhaps the first block of the process 500, 900, 1000, or 1100, the entire process executes (save any blocks that are not reached due to the failure of conditions) before looping back to the MSB subprocess.

Figure 38:
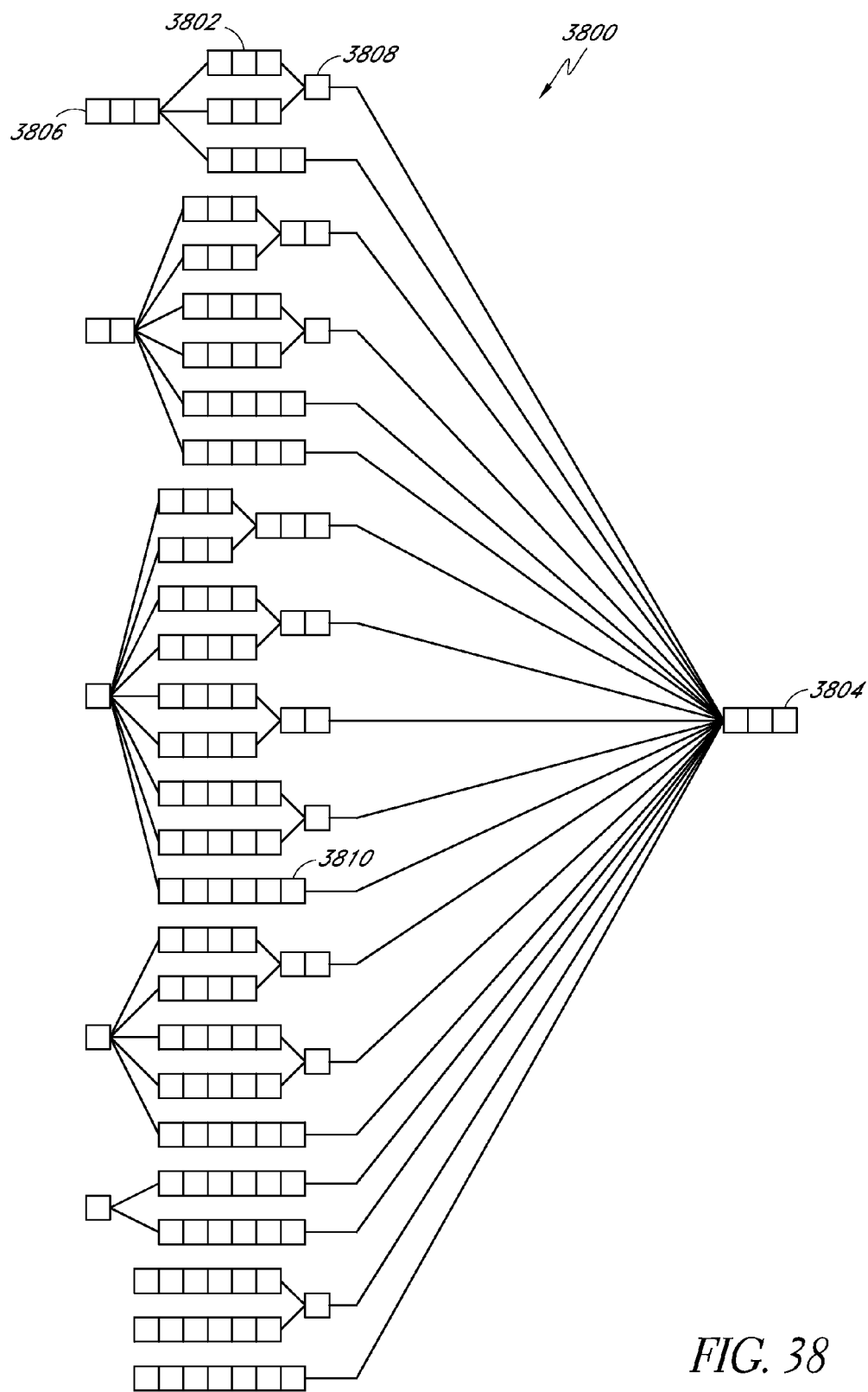
FIG. 38 is an exemplary diagram showing an embodiment of MSB, LSB, and interior bit sharing.

FIG. 38 illustrates one embodiment of address banks that share LSBs, MSBs, and interior bits. In the depicted address banks 3802, MSBs 3806 are shared among several of the address banks 3802. Likewise, LSBs 3804 are shared by several of the address banks 3802. Interior bits 3808 are also shared among several of the address banks 3802. In addition, certain interior bits 3810 are individual. By sharing LSBs, MSBs, and interior bits 3808, additional address bank bits are saved and in turn, fuses and bulky logic gates are reduced.

Figure 39:
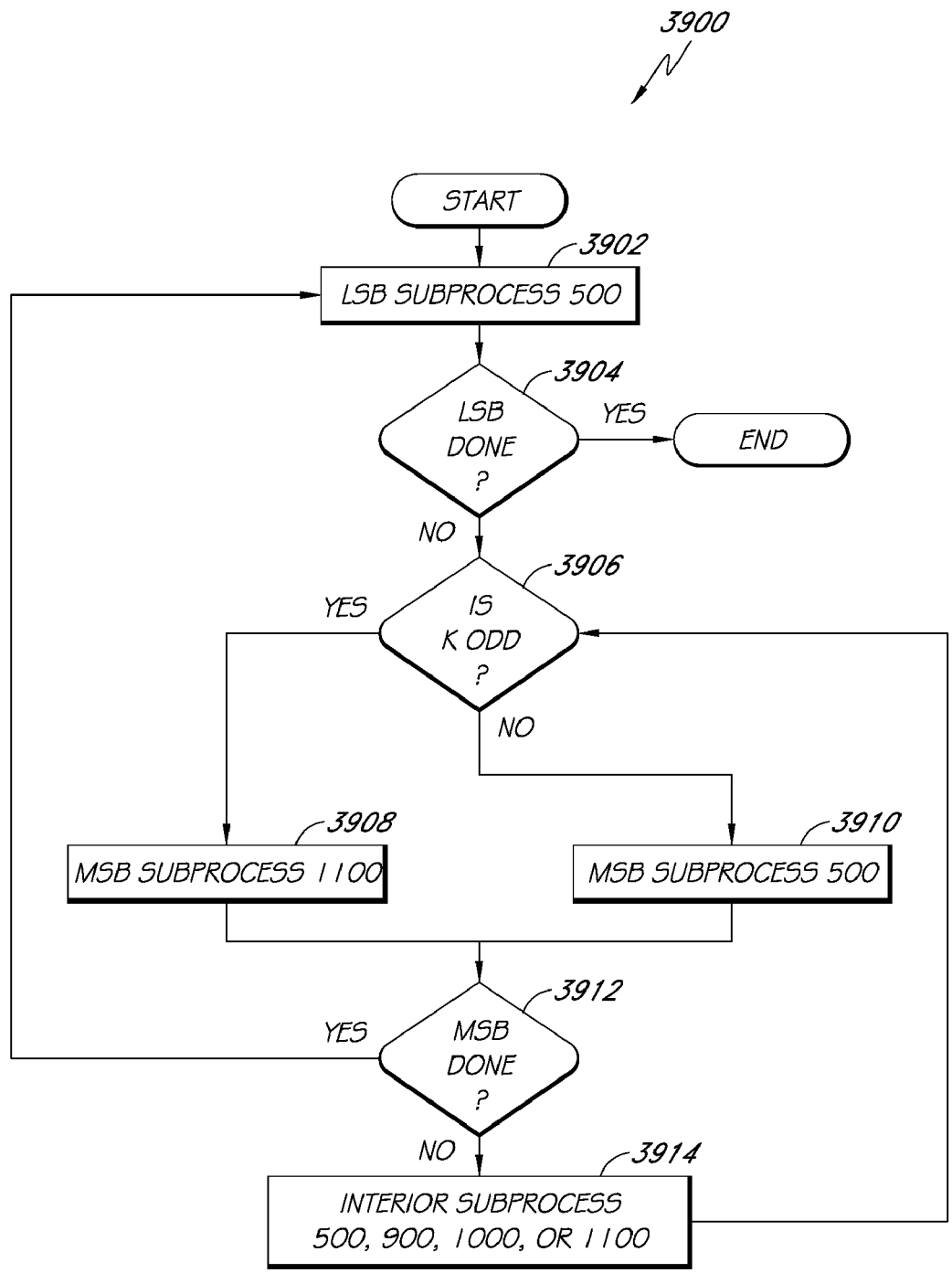
FIG. 39 is an exemplary flowchart showing another embodiment of a process for determining shared MSBs, LSBs, and interior bits.

FIG. 39 depicts another embodiment of a process 3900 which calculates shared LSBs, shared MSBs, and shared interior bits for a set of address banks. At 3902, an LSB subprocess executes. In the depicted embodiment, this subprocess incorporates the process 500 in a similar manner as described above under process 3700. At 3904, it is determined whether the LSB subprocess has completed. In certain embodiments, this step is performed by the LSB subprocess. If the LSB subprocess has completed, then the process 3900 ends.

If the LSB subprocess has not completed, then the process 3900 proceeds at 3906 to evaluate whether the value K from process 500 is an odd number. If K is odd, then at 3908 an MSB subprocess executes. This MSB subprocess in certain embodiments incorporates the process 1100 in a similar manner as described under the process 3700. If K is not odd at 3910, then an MSB subprocess incorporating the process 500 executes in a similar manner as described under the process 3700.

At 3912, it is determined whether the MSB subprocess has completed. If the MSB subprocess has completed, then the process 3900 loops back to the LSB subprocess at 3902. However, if the MSB subprocess has not completed, then the process 3900 proceeds to 3914 where an interior bits subprocess executes. Interior bits subprocess at 3914 could incorporate any of processes 500, 900, 1000, or 1100 in a similar manner as described under the process 3700. At the completion of the interior bits subprocess, the process 3900 loops back to 3906.

Process 3900 shares LSBs, MSBs, and interior bits in a manner similar to process 3700. However, process 3900 in certain embodiments selects between one of two different MSB subprocesses. More or fewer address bank bits may be saved in certain embodiments by selecting between one of the two MSB subprocesses.

Though not depicted, the process 3900 could also incorporate different MSB subprocesses. For example, rather than deciding at 3906 whether K is odd, it could be decided whether K is greater than 7. If K is greater than 7, then at 3908 a MSB subprocess incorporating the process 900 would execute. If K is less than or equal to 7, at 3910 an MSB subprocess incorporating the process 1100 would execute. Finally, at 3914 an interior bits subprocess incorporating the process 1100 would execute.

In still another embodiment, at 3906 it could be instead determined whether K is greater than 39. If K is greater than 39, then at 3908 an MSB subprocess incorporating the process 500 would execute. However, if K is less than or equal to 39, then at 3910 an MSB subprocess incorporating the process 900 would execute. Thereafter, at 3914 an interior bits process incorporating the process 1100 would execute.

There are consequently several ways to evaluate a shared number of LSBs, MBS, and interior bits. An embodiment of the process 3700 or 3800 using a combination of subprocesses 500, 900, 1000, and 1100 may produce a different pattern of shared bits than a different combination of such subprocesses. In addition, a different combination of subprocesses may achieve a greater savings of address banks bits than another combination of subprocesses.

Figure 40:
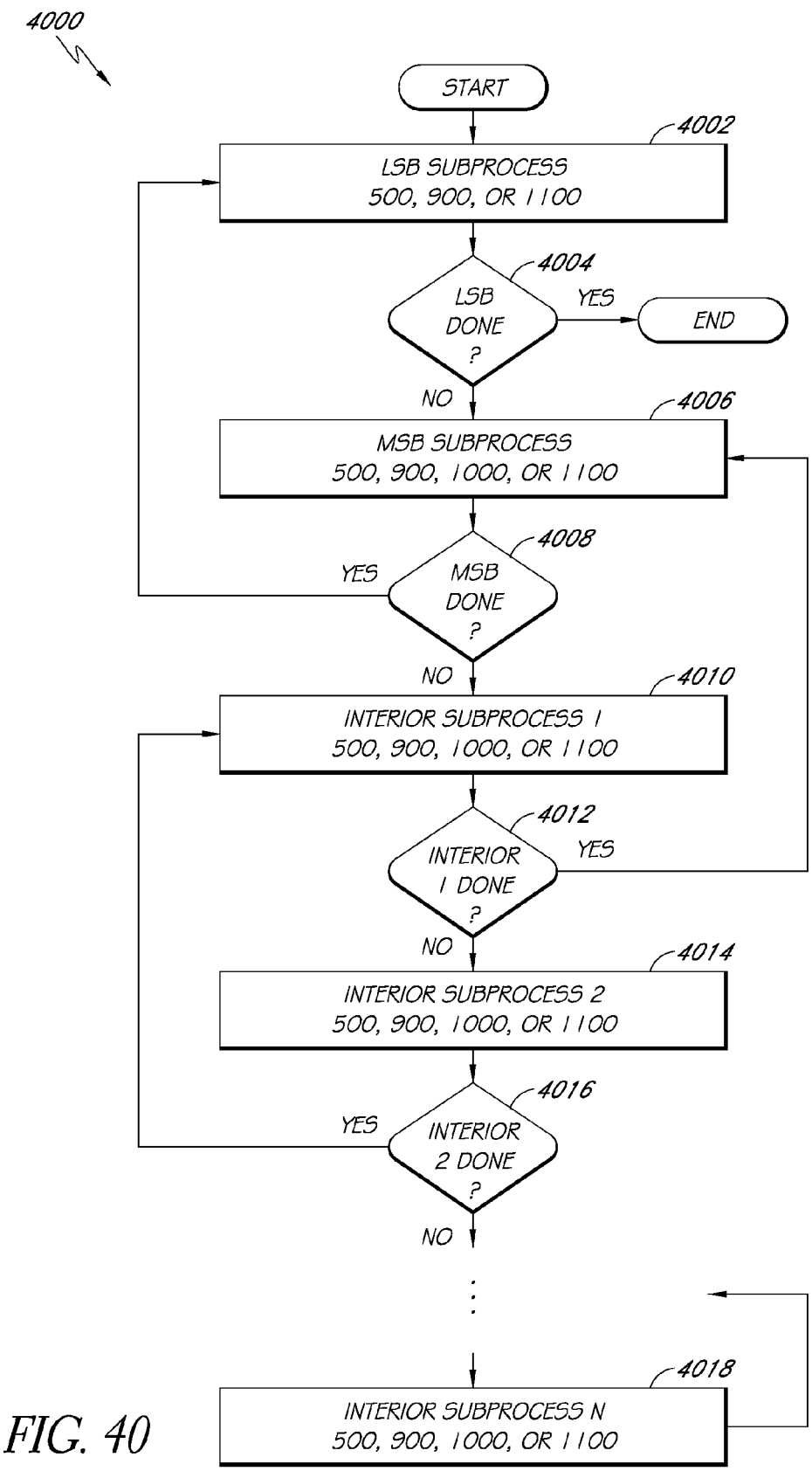
FIG. 40 is an exemplary flowchart showing still another embodiment of a process for determining shared MSBs, LSBs, and interior bits.

FIG. 40 depicts another embodiment of a process 4000 of the present invention. The process 4000 depicts a generalized case of bit sharing, where shared LSBs, MSBs, and possibly multiple fields of shared interior bits are determined. For a zero or positive integer value n (i.e., n=0, 1, 2, 3 . . . ), in certain embodiments n fields of interior bits may be shared. Increasing the number of shared fields of interior bits in some implementations will achieve a greater saving of address bank bits.

At 4002, an LSB subprocess incorporating any of processes 500, 900, or 1100 determines shared LSBs among a set of address banks. At 4004, it is determined whether the LSB subprocess has completed. In certain embodiments, this step is performed by the LSB subprocess. If the LSB subprocess has completed, the process 4000 ends. However, if the LSB subprocess has not completed, then at 4006 an MSB subprocess is executed. The MSB subprocess could incorporate any of processes 500, 900, 1000, or 1100.

At 4008 it is determined whether the MSB subprocess is done. In certain embodiments, this step is performed by the MSB subprocess. If the MSB subprocess is done, then the process 4000 loops back to 4002. However, if the MSB subprocess is not done, then interior bits subprocess 1 executes. Interior bits subprocess 1 could incorporate any of processes 500, 900, 1000, or 1100.

At 4012, it is determined whether interior bits subprocess 1 has completed. In certain embodiments, this step is performed by the interior bits subprocess. If it has completed, the process 4000 loops back to 4006. However, if interior bits subprocess 1 has not completed, then at 4014 interior bits subprocess 2 executes. Interior bits subprocess 2 could also incorporate any of the processes 500, 900, 1000, or 1100. Interior bits subprocess 2 calculates in certain embodiments another field of shared interior bits that may be shared to reduce further fuse count and address bank space.

In certain embodiments, the interior bits subprocesses 1 through n minus 1 (i.e., n−1) correspond to the subprocess 1360 of process 1300, rather than the subprocess 1380 of process 1300. That is, each interior bits subprocess in the range of 1 to n minus 1 at some point pauses to allow the next interior bits subprocess to execute, resuming when the next subprocess is completed. For example, an interior bits subprocess 30 would pause to allow the execution of interior bits subprocess 31, and interior bits subprocess 30 would resume execution upon completion of subprocess 31.

The process 4000 may proceed until interior bits subprocess n completes, which may also incorporate any of the processes 500, 900, 1000, or 1100. The $n^{th}$ interior bits subprocess determines an $n^{th}$ field of shared interior bits. Once interior bits subprocess n has completed, the process 4000 loops back to the previous interior bits subprocess, which would be interior bits subprocess n minus 1. The process 4000 then loops back to interior bits subprocess n minus 2, and so on until the process 4000 loops back to 4010.

In certain embodiments, the $n^{th}$ interior bits subprocess corresponds to the format of the subprocess 1380 of process 1300. That is, instead of pausing execution, the entire $n^{th}$ interior bits subprocess executes before looping back to the $(n-1)^{th}$ subprocess.

One advantage of certain embodiments of the present invention is that repairability is increased because more space is available on the die for additional fuses, and hence more defects can be "repaired." Another advantage in certain embodiments is that the reduction of fuses results in a hardware compression scheme, and the need for software compression schemes is therefore reduced. Software compression schemes slow down software processing times, so using a hardware compression scheme such as certain embodiments of the processes disclosed herein could speed up software processing times. In addition, in certain embodiments, applications of the present invention include imaging sensor memory (storage of dead pixels), flash memory, and ROMs, where the addresses are constants in memory.

Although the invention has been described primarily in connection with binary number addresses, the invention is not limited to shared storing of binary number addresses or to designing redundancy structures for shared storing of addresses. For example, register space in a CPU may be saved if a numerical sequence of data/control signals has any LSBs, MSBs, or interior bits in common. Likewise, octal, decimal, hexadecimal, and other number systems may be employed with certain embodiments of the present invention. In addition, one of ordinary skill in the art will appreciate that certain steps of the processes disclosed herein may be interchanged with other steps or otherwise rearranged to reach similar results.

The processes which are described and illustrated herein are not limited to the sequence of acts described, nor are they necessarily limited to the practice of all of the acts set forth. Other sequences of acts, or less than all of the acts, or simultaneous occurrence of the acts, may be utilized in practicing embodiments of the invention.

One of ordinary skill in the art will appreciate that the invention can be practiced by other than the described embodiments, which are presented for purposes of illustration and not of limitation, and the present invention is limited only by the claims which follow.

What is claimed is:

1. A memory structure comprising:
   a plurality of address banks, each address bank operative to store a memory address;
   a first set of the address banks comprising three or more of the address banks, the first set of address banks sharing physical memory locations for one or more redundant most significant bits of three or more memory addresses;
   a second set of the address banks comprising the first set of address banks as well as additional banks of the plurality of address banks, the second set of address banks sharing one or more redundant least significant bits; and
   a third set of the address banks comprising a portion of the first set of address banks, the third set of address banks sharing physical memory locations for one or more redundant interior bits, the one or more redundant interior bits being different bits than the one or more redundant most significant bits and the one or more redundant least significant bits.

2. The memory structure of claim 1, further comprising a plurality of fuse address banks corresponding to the plurality of address banks.

3. The memory structure of claim 2, further comprising logic gates operative to detect a match between bits stored in the plurality of address banks and bits stored in the plurality of fuse address banks.

4. The memory structure of claim 1, wherein a fuse or anti-fuse is programmable to redirect memory access from a primary address bank to a redundant address bank.

5. A memory structure comprising:
   a plurality of address banks;
   at least three of the address banks sharing physical memory locations for one or more redundant least significant bits and one or more redundant most significant bits of three or more memory addresses;
   at least two of the address banks that share the one or more redundant least significant bits and the one or more redundant most significant bits also sharing physical memory locations for at least one redundant interior bit, the at least one redundant interior bit being a different bit from the one or more least significant bits and the one or more redundant most significant bits, wherein a number of the address banks that share the at least one redundant interior bit is fewer than a number of the address banks that share the one or more redundant least significant bits and the one or more redundant most significant bits;
   wherein the at least one redundant interior bit is other than a shared least significant bit or a shared most significant bit.

6. The memory structure of claim 5, further comprising a plurality of fuse address banks corresponding to the plurality of address banks.

7. The memory structure of claim 6, further comprising logic gates operative to detect a match between bits stored in the plurality of address banks and bits stored in the plurality of fuse address banks.

8. The memory structure of claim 5, further comprising one or both of a fuse and an anti-fuse configured to be programmable to redirect memory access from a primary address bank to a redundant address bank.

* * * * *